United States Patent
Ito et al.

(10) Patent No.: US 12,433,096 B2
(45) Date of Patent: Sep. 30, 2025

(54) DISPLAY APPARATUS AND ELECTRONIC DEVICE

(71) Applicant: SEMICONDUCTOR ENERGY LABORATORY CO., LTD., Atsugi (JP)

(72) Inventors: Minato Ito, Kanagawa (JP); Takanori Matsuzaki, Kanagawa (JP); Munehiro Kozuma, Kanagawa (JP); Yuki Okamoto, Kanagawa (JP); Yusuke Koumura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 18/282,164

(22) PCT Filed: Mar. 17, 2022

(86) PCT No.: PCT/IB2022/052416
§ 371 (c)(1),
(2) Date: Sep. 14, 2023

(87) PCT Pub. No.: WO2022/200937
PCT Pub. Date: Sep. 29, 2022

(65) Prior Publication Data
US 2024/0161695 A1    May 16, 2024

(30) Foreign Application Priority Data
Mar. 25, 2021    (JP) .................................. 2021-051834

(51) Int. Cl.
*G09G 3/3233* (2016.01)
*H10K 50/00* (2023.01)
(Continued)

(52) U.S. Cl.
CPC .......... *H10K 59/00* (2023.02); *G09G 3/3233* (2013.01); *H10K 50/00* (2023.02); *H10K 59/131* (2023.02);
(Continued)

(58) Field of Classification Search
CPC ......... G09G 3/3233; G09G 2300/0809; G09G 2310/08; G09G 2330/021; G09G 2340/0442; H10K 59/131
See application file for complete search history.

(56) References Cited

U.S. PATENT DOCUMENTS 5,929,925 A * 7/1999 Nakamura ........... H04N 7/0122
348/556
7,064,738 B2   6/2006 Igarashi
(Continued)

FOREIGN PATENT DOCUMENTS

CN    101815184 A    8/2010
JP    2002-202760 A    7/2002
(Continued)

OTHER PUBLICATIONS

Machine translation of JP2020187186 (Year: 2020).*
(Continued)

*Primary Examiner* — Antonio Xavier
(74) *Attorney, Agent, or Firm* — NIXON PEABODY LLP; Jeffrey L. Costellia

(57) ABSTRACT

A display apparatus with a novel structure is provided. The display apparatus includes a first layer and a second layer positioned above the first layer. The first layer includes a driver circuit region, and the second layer includes a pixel array. The pixel array includes a plurality of pixel regions. The driver circuit region includes a control circuit unit and a plurality of local driver circuits. One of the plurality of local driver circuits corresponds to any one of the plurality
(Continued)

of pixel regions. The local driver circuit has a function of outputting a driving signal for driving a plurality of pixels included in the corresponding pixel region. The control circuit unit has a function of comparing definition data of an input image signal and aspect ratio data of the pixel array to determine a first region where display is performed and a second region where display is not performed, and outputting, to the local driver circuit corresponding to the second region, a control signal for stopping output of the driving signal.

8 Claims, 30 Drawing Sheets

(51) Int. Cl.
H10K 59/00 (2023.01)
H10K 59/131 (2023.01)
H10K 59/80 (2023.01)

(52) U.S. Cl.
CPC . G09G 2300/0809 (2013.01); G09G 2310/08 (2013.01); G09G 2330/021 (2013.01); G09G 2340/0442 (2013.01); H10K 59/871 (2023.02); H10K 59/8722 (2023.02)

(56) References Cited

U.S. PATENT DOCUMENTS

| | | | |
|---|---|---|---|
| 7,227,522 B2 | 6/2007 | Fujimoto et al. | |
| 7,830,401 B2 | 11/2010 | Sonobe | |
| 2001/0017611 A1* | 8/2001 | Moriyama | G09G 3/3666 345/99 |
| 2002/0080107 A1 | 6/2002 | Fujimoto et al. | |
| 2002/0140662 A1 | 10/2002 | Igarashi | |
| 2009/0160883 A1 | 6/2009 | Sonobe | |
| 2010/0208149 A1* | 8/2010 | Morikuni | H04N 9/3188 353/101 |
| 2014/0125639 A1* | 5/2014 | Cho | G09G 5/18 345/204 |
| 2016/0086958 A1* | 3/2016 | Kozuma | H10B 12/315 257/43 |
| 2017/0076665 A1 | 3/2017 | Kim | |
| 2017/0186364 A1* | 6/2017 | Okamoto | G09G 3/3648 |
| 2017/0269749 A1 | 9/2017 | Bok et al. | |
| 2018/0358339 A1 | 12/2018 | Iguchi | |
| 2019/0096864 A1* | 3/2019 | Huitema | H01L 24/24 |
| 2023/0022181 A1 | 1/2023 | Ikeda. et al. | |
| 2024/0090284 A1* | 3/2024 | Kozuma | H01L 27/088 |

FOREIGN PATENT DOCUMENTS

| | | |
|---|---|---|
| JP | 2002-297108 A | 10/2002 |
| JP | 2009-151172 A | 7/2009 |
| JP | 2010-130385 A | 6/2010 |
| JP | 2020-187186 A | 11/2020 |
| KR | 2002-0059240 A | 7/2002 |
| WO | WO-2019/220278 | 11/2019 |

OTHER PUBLICATIONS

International Search Report (Application No. PCT/IB2022/052416) Dated Jun. 21, 2022.
Written Opinion (Application No. PCT/IB2022/052416) Dated Jun. 21, 2022.

* cited by examiner

FIG. 25A
| Amorphous | Intermediate state<br>New crystalline phase<br>Crystalline | Crystal |
|---|---|---|
| • completely amorphous | • CAAC<br>• nc<br>• CAC<br>excluding single crystal and poly crystal | • single crystal<br>• poly crystal |
FIG. 25B
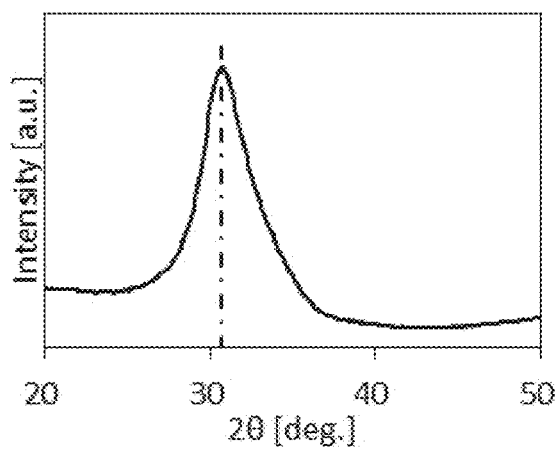
FIG. 25C
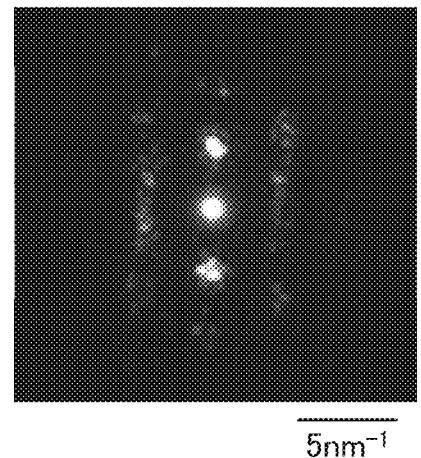

8300

8302  8303
8301  8304

8300

8302
8301  8304
8303

8300

8305
8302  8306
8307
8301
8303  8304

8300

8302
8301  8304
8303

8301
8308  8302  8310

8301
8308  8302  8311

DISPLAY APPARATUS AND ELECTRONIC DEVICE

TECHNICAL FIELD

One embodiment of the present invention relates to a display apparatus and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, and a testing method thereof.

BACKGROUND ART

Display apparatuses applicable for XR (extended reality) such as VR (virtual reality) and AR (augmented reality) have been required. Specifically, such display apparatuses have been desired to have high resolution, high color reproducibility, and the like so as to offer enhanced realistic feeling and an enhanced sense of immersion, for example.

Examples of apparatuses applicable to such display apparatuses include a liquid crystal display apparatus and a light-emitting apparatus including a light-emitting device such as organic EL (Electro Luminescence) or a light-emitting diode (LED). Patent Document 1 discloses a display apparatus with a large number of pixels and high resolution, which includes a light-emitting device containing organic EL.

REFERENCE

Patent Document

[Patent Document 1] PCT International Publication No. 2019/220278

SUMMARY OF THE INVENTION

Problems to be Solved by the Invention

As described above, a display apparatus having high display quality is required for XR equipment. In addition, the display apparatus provided in the XR equipment desirably has high drive frequency so as to offer an enhanced sense of reality and an enhanced sense of immersion. However, an input time per frame is shortened as the driving frequency becomes higher, which might reduce the amount of data that can be input to the display apparatus in one frame. In addition, displaying an image while maintaining a high driving frequency might increase power consumption.

An object of one embodiment of the present invention is to provide a display apparatus having high display quality. Another object of one embodiment of the present invention is to provide a display apparatus with reduced power consumption. Another object of one embodiment of the present invention is to provide a novel display apparatus.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems

One embodiment of the present invention is a display apparatus including a first layer and a second layer positioned above the first layer. The first layer includes a driver circuit region, and the second layer includes a pixel array. The pixel array includes a plurality of pixel regions, and the driver circuit region includes a control circuit unit and a plurality of local driver circuits. One of the plurality of local driver circuits corresponds to any one of the plurality of pixel regions. The local driver circuit has a function of outputting a driving signal for driving a plurality of pixels included in the corresponding pixel region. The control circuit unit has a function of comparing definition data of an input image signal and aspect ratio data of the pixel array to determine a first region where display is performed and a second region where display is not performed, and outputting, to the local driver circuit corresponding to the second region, a control signal for stopping output of the driving signal.

In the display apparatus of one embodiment of the present invention, it is preferable that in a top view, the driver circuit region be positioned inside the pixel array, and part of the plurality of pixel regions not overlap with the driver circuit region.

In the display apparatus of one embodiment of the present invention, it is preferable that each of the plurality of pixel regions include a plurality of wirings; in the plurality of pixel regions, the plurality of pixels be arranged in a matrix; the plurality of wirings be positioned in the respective rows of the plurality of pixels arranged in a matrix; one of the plurality of wirings be electrically connected to the pixels positioned in the same row; each of the plurality of wirings include a contact portion; and the contact portion be positioned inside the pixel or between adjacent pixels.

In the display apparatus of one embodiment of the present invention, it is preferable that the pixel included in each of the plurality of pixel regions include a light-emitting device with organic EL, and a first transistor; the control circuit unit and the plurality of local driver circuits each include a second transistor; the first transistor include a metal oxide in a channel formation region; and the second transistor include silicon in a channel formation region.

Another embodiment of the present invention is an electronic device including any one of the above display apparatuses and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display apparatus, a light-emitting apparatus, a lighting device, an electronic device, and the like themselves are semiconductor devices or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, or a NOR circuit); a signal converter circuit (a digital-to-analog converter circuit, an analog-to-digital converter circuit, a gamma correction circuit, or the like); a potential level converter circuit (a power source circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element, a wiring, or the like having a resistance value higher than 0Ω. Therefore, in this specification and the like, a "resistor" sometimes includes a wiring having a resistance value, a transistor in which current flows between its source and drain, a diode, a coil, and the like. Thus, the term "resistor" can be sometimes replaced with the terms "resistance", "load", "region having a resistance value", and the like; conversely, the terms "resistance", "load", and "region having a resistance value" can be sometimes replaced with the term "resistor" and the like. The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1 \times 10^9$ Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The terms "capacitor", "parasitic capacitance", "gate capacitance", and the like can be replaced with the term "capacitance" and the like in some cases. Conversely, the term "capacitance" can be replaced with the terms "capacitor", "parasitic capacitance", "gate capacitance", and the like in some cases. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be sometimes replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. As another example, the case where a single capacitor is illustrated in a circuit diagram may indicate a case where two or more capacitors are electrically connected to each other in parallel. As another example, the case where a single transistor is illustrated in a circuit diagram may indicate a case where two or more transistors are electrically connected to each other in series and their gates are electrically connected to each other. Similarly, as another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure and/or the device structure. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer phenomenon (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer phenomenon (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) the top surface of a conductor" can be replaced with the expression "an insulator positioned under (on) the bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. As another example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" can also mean, for example, the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power source line", and the like can be interchanged with each other depending on the case or the situation. For example, the term "wiring" can be changed into the term "signal line" in some cases. As another example, the term "wiring" can be changed into the term "power source line" or the like in some cases. Conversely, the term "signal line", "power source line", or the like can be changed into the term "wiring" in some cases. The term "power source line" or the like can be changed into the term "signal line" or the like in some cases. Conversely, the term "signal line" or the like can be changed into the term "power source line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. Thus, a switch may have two or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited or a state where current can be made to flow between the source electrode and the drain electrode. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification and the like, a device formed using a metal mask or an FMM (fine metal mask, high-resolution metal mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device with a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to that in the case of a single structure. In the device with a tandem structure, an intermediate layer such as a charge-generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. The light-emitting device having an SBS structure is suitable for the case where the power consumption is required to be low. Meanwhile, the white-light-emitting device is suitable in terms of lower manufacturing cost or higher manufacturing yield because the manufacturing process of the white-light-emitting device is simpler than that of the light-emitting device having an SBS structure.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 60° and less than or equal to 120°.

Effect of the Invention

According to one embodiment of the present invention, a display apparatus having high display quality can be provided. According to another embodiment of the present invention, a display apparatus with reduced power consumption can be provided. According to another embodiment of the present invention, a novel display apparatus can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 25A is a diagram showing classification of crystal structures of IGZO, FIG. 25B is a diagram showing an XRD spectrum of crystalline IGZO, and FIG. 25C is a diagram showing a nanobeam electron diffraction pattern of the crystalline IGZO.

MODE FOR CARRYING OUT THE INVENTION

Figure 1:
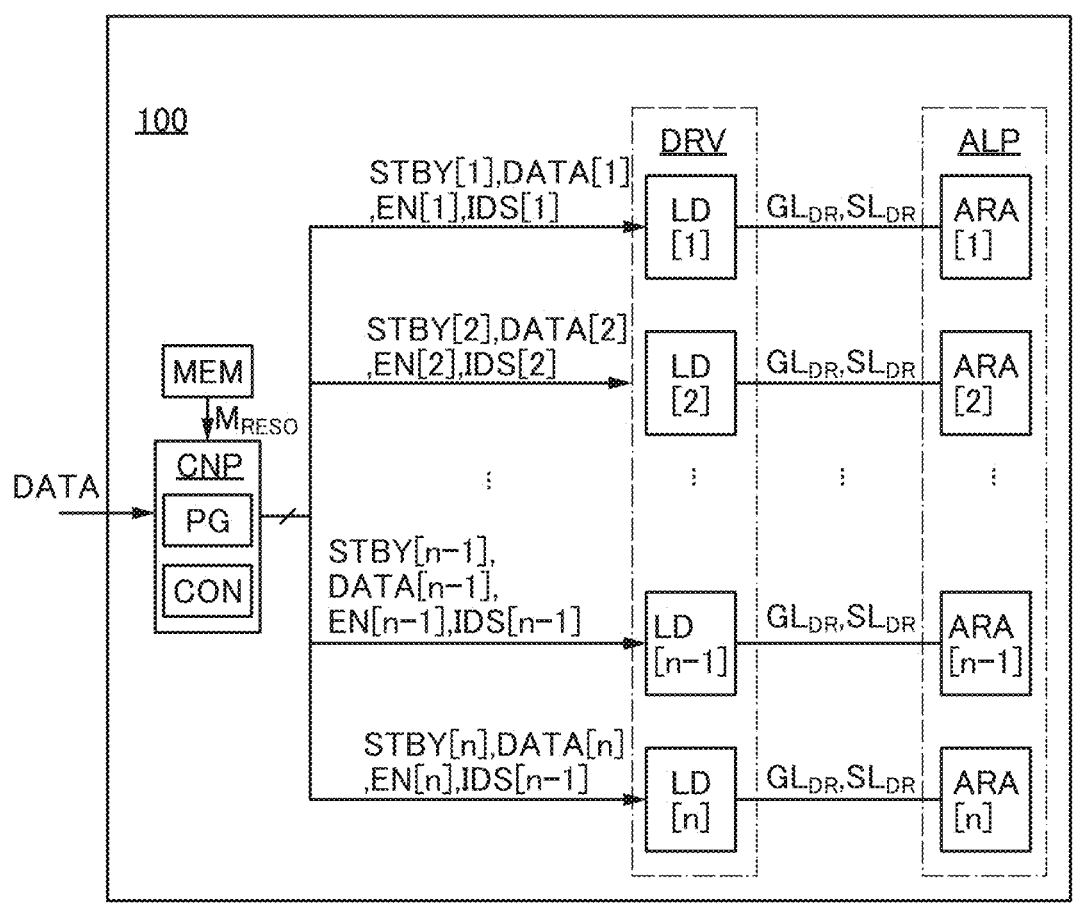
FIG. 1 is a diagram illustrating a structure example of a display apparatus.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) described in the embodiment and a content (or part of the content) described in one or a plurality of different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a display apparatus of one embodiment of the present invention is described.

FIG. 1 is a block diagram illustrating the display apparatus of one embodiment of the present invention. A display apparatus 100 illustrated in FIG. 1 includes a control circuit unit CNP, a driver circuit region DRV, a pixel array ALP, and a memory unit MEM. Although not illustrated in FIG. 1, a layer where the driver circuit region DRV is provided is different from a layer where the pixel array ALP is provided.

The driver circuit region DRV includes a plurality of local driver circuits LD. FIG. 1 illustrates local driver circuits LD[1] to LD[n] (n is a natural number of 2 or more) as an example. The pixel array ALP includes a plurality of pixel regions ARA. FIG. 1 illustrates pixel regions ARA[1] to ARA[n] (n is a natural number of 2 or more) as an example. One of the plurality of local driver circuits LD corresponds to any one of the plurality of pixel regions ARA. The local driver circuit LD has a function of outputting driving signals $GL_{DR}$ and $SL_{DR}$ for driving a plurality of pixels PIX (not illustrated) included in the corresponding pixel region ARA. The driving signal $GL_{DR}$ is, for example, a signal supplied to a gate line. The driving signal $SL_{DR}$ is, for example, a signal supplied to a signal line. The memory unit MEM is provided in the display apparatus 100 and is preferably a nonvolatile memory.

The control circuit unit CNP includes a controller CON and a voltage generation circuit PG. Note that the control circuit unit CNP may be provided in the driver circuit region DRV. An input signal such as an image signal DATA is input from the outside to the control circuit unit CNP.

The controller CON has a function of processing a signal input from the outside of the display apparatus 100, for example. Examples of the signal include the aforementioned image signal DATA, and a vertical synchronization signal, a horizontal synchronization signal, and an address signal including a destination for performing display based on the image signal DATA.

The voltage generation circuit PG functions as a circuit that generates a power source voltage for driving circuits (e.g., a source driver circuit and a gate driver circuit described later) included in the driver circuit region DRV, for example. Furthermore, the voltage generation circuit PG may have a function of generating a voltage to be supplied to pixels included in the pixel region ARA described later.

The control circuit unit CNP transmits image signals DATA[1] to DATA[n] and control signals EN[1] to EN[n]. The image signals DATA[1] to DATA[n] and the control signals EN[1] to EN[n] are transmitted to the corresponding local driver circuits LD included in the driver circuit region DRV, which are selected in accordance with address signals. Since the plurality of local driver circuits LD are provided in the driver circuit region DRV, the control circuit unit CNP may be configured to transmit image signals and the like to a plurality of local driver circuits LD concurrently in parallel.

Aspect ratio data $M_{RESO}$ of the pixel array ALP is input from the memory unit MEM to the control circuit unit CNP. The aspect ratio data $M_{RESO}$ is data on the aspect ratio of an image that can be displayed when all pixels in the pixel array ALP are driven for display, e.g., data on aspect ratio such as QVGA (320×240) or VGA (640×480). The control circuit unit CNP has a function of comparing the aspect ratio data $M_{RESO}$ and definition data of the image signal DATA and outputting, to the local driver circuits LD, control signals IDS (IDS[1] to IDS[n]) and control signals STBY (STBY[1] to STBY[n]); the control signals stop output of the driving signals $GL_{DR}$ and $SL_{DR}$ for driving a plurality of pixels included in the corresponding pixel region ARA. The definition data of the image signal DATA indicates the number of horizontal pixels and vertical pixels in an image.

The control signal STBY is a signal for stopping, when the aspect ratio data $M_{RESO}$ does not match the definition data of the image signal DATA, the function of the local driver circuit LD corresponding to the pixel region ARA where display based on the image signal DATA is not performed. The data mismatch means here that the aspect ratio of the pixel array ALP is different from the ratio between the numbers of horizontal pixels and vertical pixels. The control signal STBY is a signal for stopping supply of a power source voltage to an analog circuit (e.g., an amplifier circuit) in the local driver circuit LD to bring the local driver circuit LD into a stand-by state and stop the function of the local driver circuit LD.

The control signal IDS is a signal for stopping update, or reducing the frequency of update, of the image signal DATA in the local driver circuit LD corresponding to the pixel region ARA where update of display based on the image signal DATA is not performed. The control signal IDS is a signal for stopping update, or reducing the frequency of update, of the image signal DATA by performing clock gating or changing the frequency of a clock signal in the case where consecutive frame periods have the same image signal DATA.

Each of the plurality of local driver circuits LD has a function of driving pixels included in the plurality of pixel regions ARA. That is, for example, the plurality of local driver circuits LD each include a source driver circuit and a gate driver circuit. Since the plurality of local driver circuits LD are provided, each local driver circuit LD can selectively control the pixel region ARA to be driven. The local driver circuit LD outputs the driving signals $GL_{DR}$ and $SL_{DR}$ for driving a plurality of pixels included in the corresponding pixel region ARA in accordance with the image signals DATA[1] to DATA[n], the control signals IDS[1] to IDS[n], the control signals STBY[1] to STBY[n], and the control signals EN[1] to EN[n].

The pixel array ALP includes the plurality of pixel regions ARA. FIG. 1 illustrates the pixel regions ARA[1] to ARA[n] as an example. The pixel regions ARA each include a pixel PIX connected to a gate line and a signal line.

In the display apparatus 100 described in this embodiment, the pixel array ALP is divided into the plurality of pixel regions ARA, which can be driven in parallel by the corresponding local driver circuits LD. In the case where part of an image on a display portion of the display apparatus 100 is rewritten, only the necessary local driver circuits LD can be driven so as to drive the pixels included in the pixel regions ARA where the part of the image is displayed. In this case, only the pixels included in the necessary pixel regions ARA are driven and the local driver circuits LD corresponding to the pixel regions ARA that need not be driven are in a resting state, so that the power consumption can be reduced. Note that in the resting state, the frequency is controlled by a clock signal based on the control signal IDS or the supply of a power source voltage to an analog circuit is controlled by the control signal STBY.

The control signal STBY and the control signal IDS shown in FIG. 1 are described with reference to FIG. 2A and FIG. 2B. The control signal STBY stops the function of the local driver circuit LD by setting to L level a voltage supplied to an amplifier circuit included in the local driver circuit LD. The control signal IDS stops the update of the image signal DATA by stopping data update in a source register, which is included in the local driver circuit LD and retains the image signal DATA.

Figure 2A:
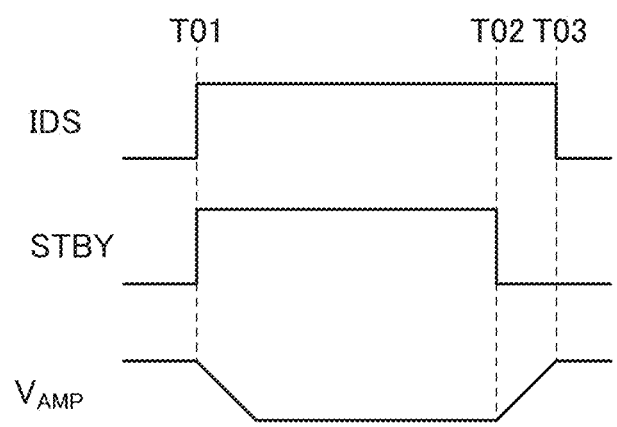
FIG. 2A and FIG. 2B are diagrams illustrating a structure example of a display apparatus.

FIG. 2A is a timing chart of the case where a voltage $V_{AMP}$ is supplied to the amplifier circuit and the function of the local driver circuit LD is stopped by setting the voltage $V_{AMP}$ to L level.

At Time T01 in FIG. 2A, the control signal STBY and the control signal IDS are set to H level in order to stop the function of the local driver circuit LD. That is, the supply of a power source voltage is stopped while clock gating is performed, so that the local driver circuit LD is brought into a stand-by state. The voltage $V_{AMP}$ decreases to L level in the amplifier circuit included in the local driver circuit LD. The amplifier circuit does not function in the local driver circuit LD. As shown in FIG. 2A, the voltage $V_{AMP}$ supplied to the amplifier circuit changes gradually, which effectively contributes a reduction in power consumption when the function of the local driver circuit LD is stopped for a long time. In contrast, when the function of the local driver circuit LD is stopped for a short time, it is necessary to consider the time during which the voltage $V_{AMP}$ changes.

At Time T02 in FIG. 2A, the control signal STBY is set to L level in order to restore the function of the local driver circuit LD. The voltage $V_{AMP}$ increases to H level. At Time T03 in FIG. 2A, the control signal IDS is set to L level in order to restart the update of the image signal DATA in the local driver circuit LD.

Figure 2B:
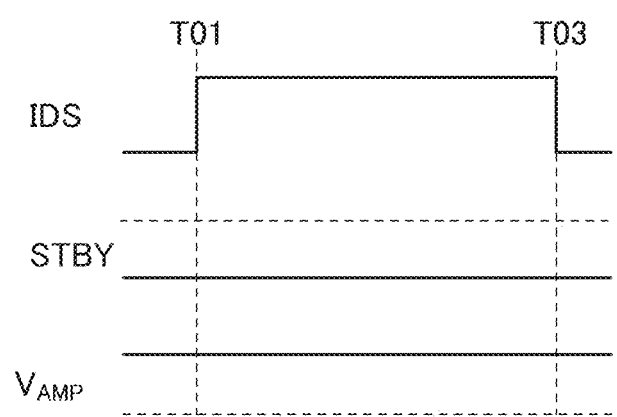

FIG. 2B is a timing chart of the case where the update of the image signal DATA in the local driver circuit LD is stopped by setting the voltage $V_{AMP}$ to H level.

At Time T01 in FIG. 2B, the control signal IDS is set to H level in order to stop the update of the image signal DATA in the local driver circuit LD. That is, clock gating is performed. At this time, the voltage $V_{AMP}$ does not decrease to remain at H level. Thus, the amplifier circuit keeps functioning in the local driver circuit LD. The clock signal is stopped and power consumption can be reduced accordingly.

At Time T02 in FIG. 2B, the control signal IDS is set to L level in order to restore the function of updating the image signal DATA in the local driver circuit LD.

Figure 3A:
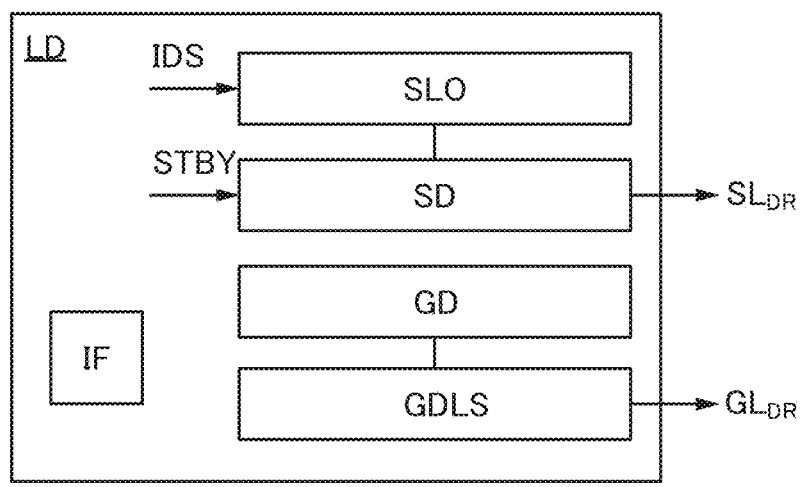
FIG. 3A and FIG. 3B are diagrams illustrating a structure example of a display apparatus.

The local driver circuit LD illustrated in FIG. 1 is described with reference to FIG. 3A. The local driver circuit LD includes an interface circuit IF, a source logic circuit SLO, a source driver circuit SD, a gate driver circuit GD, and a gate level shifter circuit GDLS, fpr an example.

The interface circuit IF is a communication circuit such as an I2C (Inter-Integrated Circuit). The source logic circuit SLO includes a register for retaining the image signal DATA. With the aforementioned control signal IDS, the source logic circuit SLO can stop the function of a logic circuit for updating the image signal DATA. The gate driver circuit GD is a circuit for generating a pulse signal output to a gate line, and the gate level shifter circuit GDLS is a circuit for amplifying the pulse signal generated in the gate driver circuit GD and outputting the driving signal $GL_{DR}$.

Figure 3B:
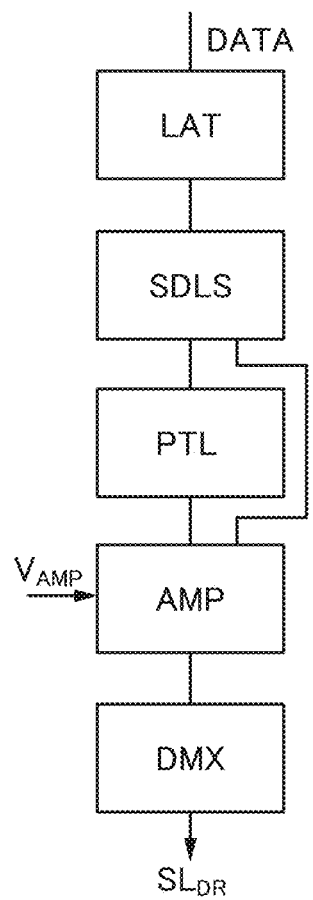

The source driver circuit SD can stop the function of the local driver circuit LD with the aforementioned control signal STBY. The source driver circuit SD includes, for example, a latch circuit LAT, a source level shifter circuit SDLS, a pass transistor logic circuit PTL, an amplifier circuit AMP, and a demultiplexer circuit DMX as illustrated in FIG. 3B.

The latch circuit LAT has a function of retaining the image signal DATA output from the source logic circuit SLO. The source level shifter circuit SDLS amplifies and outputs the image signal DATA. The pass transistor logic circuit PTL generates a voltage corresponding to the image signal DATA. Whether to stop the function of the amplifier circuit AMP is controlled with the voltage $V_{AMP}$ described in FIG. 2A and the like. The demultiplexer circuit DMX outputs a voltage corresponding to the image signal DATA as the driving signal $SL_{DR}$.

A display module including the aforementioned display apparatus 100 is described with reference to FIG. 4A and FIG. 4B.

Figure 4A:
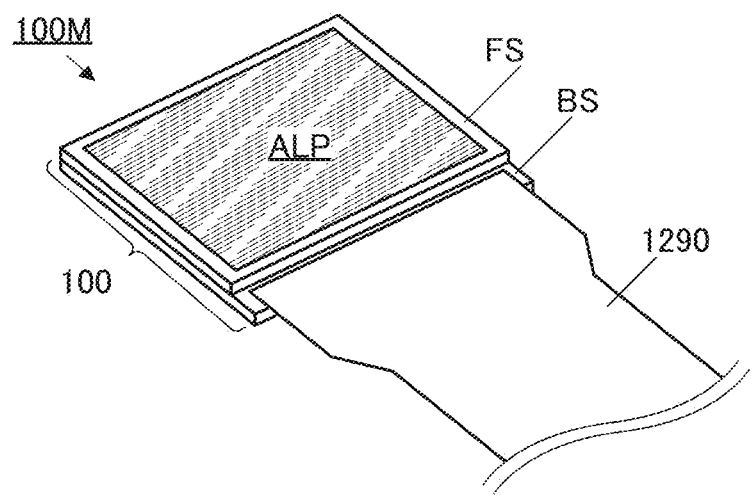
FIG. 4A and FIG. 4B are diagrams illustrating a structure example of a display apparatus.

FIG. 4A is a perspective view of a display module 100M. The display module 100M includes the display apparatus 100 and an FPC 1290.

The display module 100M includes a substrate FS and a substrate BS. The display module 100M includes the pixel array ALP functioning as a display portion. The pixel array ALP is a region where an image is displayed in the display module 100M.

Figure 4B:
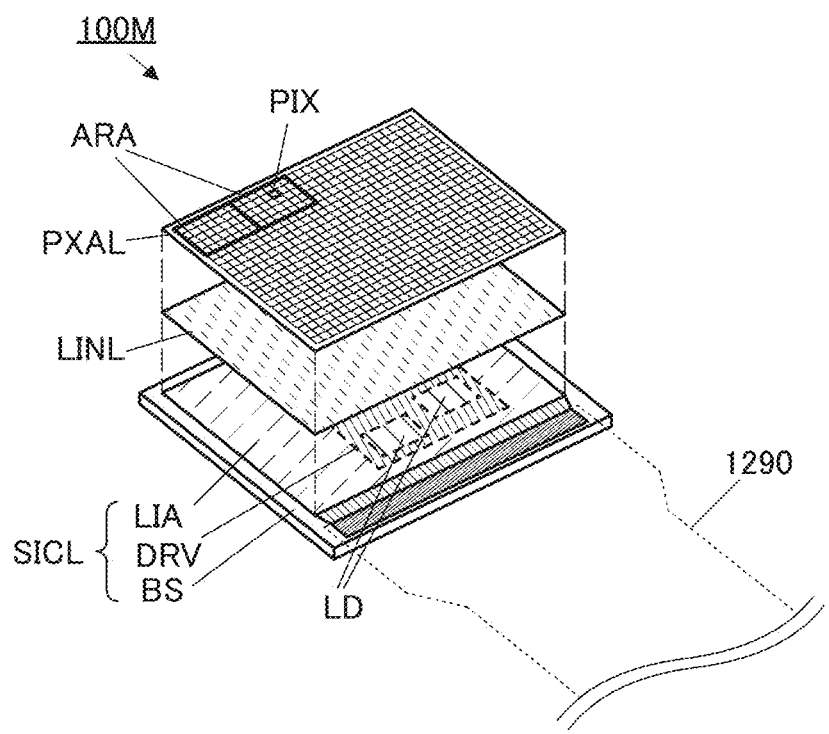

FIG. 4B is a perspective view schematically illustrating a structure on the substrate BS side. A pixel layer PXAL, a wiring layer LINL, and a circuit layer SICL are provided over the substrate BS. The wiring layer LINL is provided over the circuit layer SICL, and the pixel layer PXAL is provided over the wiring layer LINL. The pixel layer PXAL overlaps with a region including the driver circuit region DRV and a region LIA described later.

The circuit layer SICL includes the substrate BS, the driver circuit region DRV, and the region LIA.

As the substrate BS, a semiconductor substrate (e.g., a single crystal substrate) formed of silicon or germanium can be used, for example. Besides the semiconductor substrate, for example, an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, a bonding film, paper containing a fibrous material, a base material film, or the like can be used as the substrate BS. Examples of the glass substrate include barium borosilicate glass, aluminoborosilicate glass, and soda lime glass. As examples of the flexible substrate, the bonding film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as an acrylic resin. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the manufacturing process of the display apparatus 100 includes heat treatment, a highly heat-resistant material is preferably selected for the substrate BS. The substrate FS may be any substrate having a light-transmitting property; for example, a glass substrate, a quartz substrate, a light-transmitting film, or the like can be used.

In the description of this embodiment, the substrate BS is a semiconductor substrate containing silicon or the like as a material. Therefore, a transistor included in the driver circuit region can be a transistor including silicon in a channel formation region (hereinafter referred to as a Si transistor).

The driver circuit region DRV and the region LIA are provided over the substrate BS.

The driver circuit region DRV includes, for example, the local driver circuit LD for driving a pixel included in the pixel layer PXAL described later.

A wiring is provided in the region LIA, as an example. The wiring included in the region LIA may be electrically connected to a wiring included in the wiring layer LINL. At this time, the display apparatus 100 may have a structure in which a circuit included in the driver circuit region DRV and a circuit included in the pixel layer PXAL are electrically connected to each other through the wiring included in the region LIA and the wiring included in the wiring layer LINL. The display apparatus 100 may have a structure in which the circuit included in the driver circuit region DRV is electrically connected to the wiring or a circuit included in the region LIA through the wiring included in the wiring layer LINL.

The region LIA may include a functional circuit such as a GPU (Graphics Processing Unit), as an example. In the case where the display apparatus 100 includes a touch panel, the region LIA may include a sensor controller that controls a touch sensor included in the touch panel. In the case where a light-emitting device using an organic EL is used as a display element of the display apparatus 100, an EL correction circuit may be included. In the case where a liquid crystal element is used as the display element of the display apparatus 100, a gamma correction circuit may be included.

The wiring layer LINL is provided over the circuit layer SICL.

For example, a wiring is provided in the wiring layer LINL. The wiring included in the wiring layer LINL functions as, for example, a wiring that electrically connects a driver circuit included in the driver circuit region DRV provided below the wiring layer LINL and a circuit included in the pixel layer PXAL provided above the wiring layer LINL.

The pixel layer PXAL includes, for example, a plurality of pixel regions ARA constituting the pixel array ALP described in FIG. 1. The pixel regions ARA each include a plurality of pixels PIX. The plurality of pixels PIX may be arranged in a matrix in the pixel layer PXAL.

Each of the plurality of pixels PIX can express one color or a plurality of colors. In particular, the plurality of colors can be, for example, three colors of red (R), green (G), and blue (B). Alternatively, the plurality of colors may be at least one color selected from, for example, red (R), green (G), blue (B), cyan, magenta, yellow, and white. Note that in the case where each of pixels expressing different colors is called a subpixel and white is expressed by a plurality of subpixels expressing different colors, the plurality of subpixels are collectively called a pixel in some cases. In the description in this specification and the like, a subpixel is referred to as a pixel for convenience.

As the pixels PIX, pixels expressing different colors may be arranged in a stripe. Alternatively, a variety of arrangement methods, such as delta arrangement and pentile arrangement, can be employed.

The display module 100M can have a structure in which the driver circuit region DRV is stacked under the pixel layer PXAL. The pixels PIX can be arranged densely and thus the display portion can have extremely high resolution.

Such a display module 100M has extremely high resolution, and thus can be suitably used for a VR device such as a head-mounted display or a glasses-type AR device. For example, even with a structure in which the display portion of the display module 100M is seen through a lens, pixels of the extremely-high-resolution display apparatus 100 included in the display module 100M are prevented from being perceived when the display portion is enlarged by the lens, so that display providing a high sense of immersion can be performed. Without being limited thereto, the display module 100M can be suitably used for electronic devices including a relatively small display portion. For example, the display module 100M can be favorably used in a display portion of a wearable electronic device, such as a wrist watch.

Figure 5:
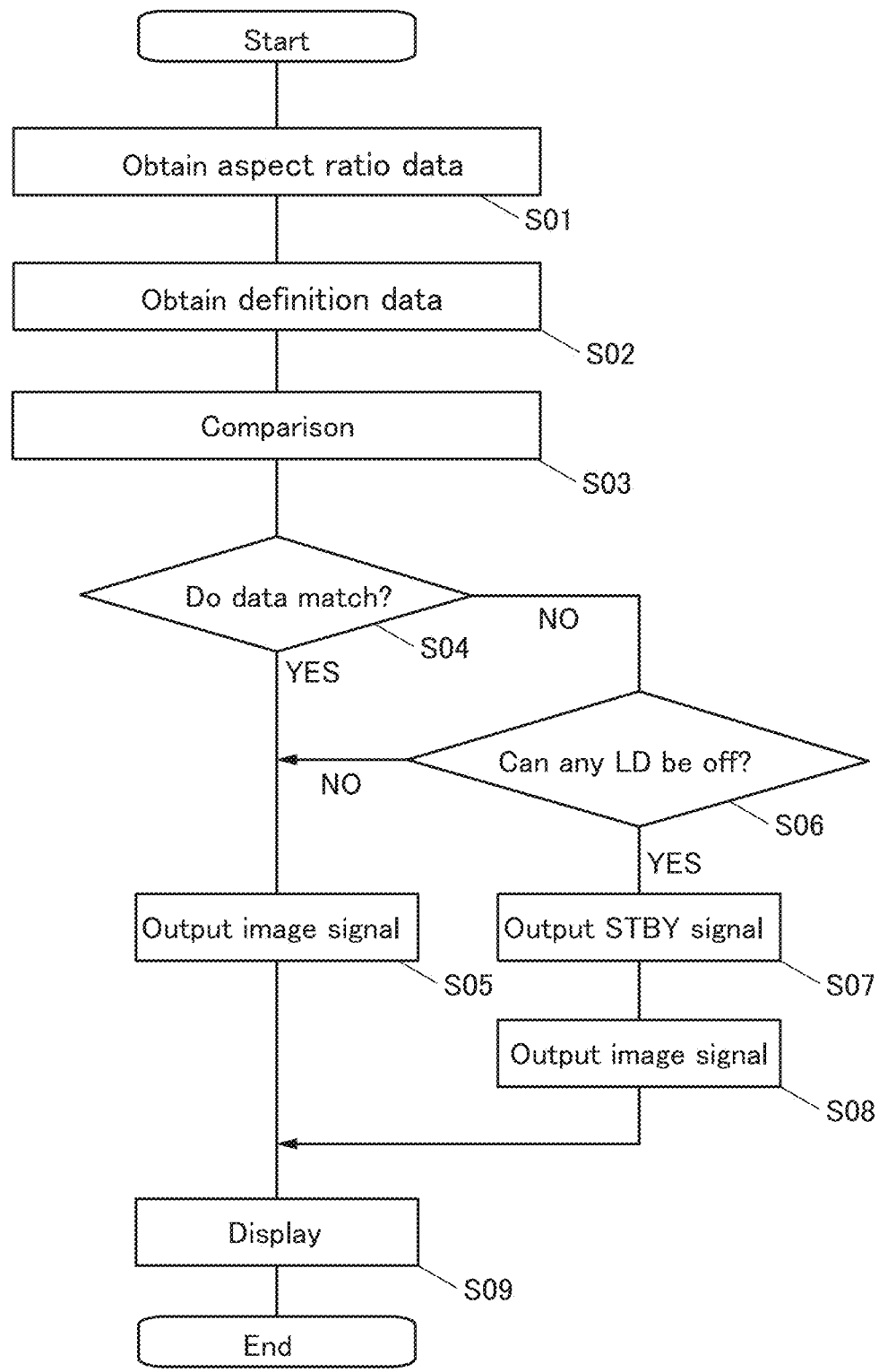
FIG. 5 is a diagram illustrating an operation example of a display apparatus.

Control of the local driver circuit LD with the control signal STBY in the aforementioned display apparatus 100 is described with reference to a flowchart of FIG. 5.

First, as Step S01, the aspect ratio data $M_{RESO}$ of the pixel array ALP is obtained in the display apparatus 100. In the display apparatus 100, the aspect ratio data $M_{RESO}$ stored in the memory unit MEM is read by the control circuit unit CNP.

Then, as Step S02, the definition data of the image signal DATA is obtained in the display apparatus 100. In the display apparatus 100, the definition data of the image signal DATA is read by the control circuit unit CNP.

Then, as Step S03, the aspect ratio data $M_{RESO}$ of the pixel array ALP is compared with the definition data of the image signal DATA in the display apparatus 100. This comparison determines whether the definition data of the image signal DATA is different from the aspect ratio when displayed in the display apparatus 100.

Then, as Step S04, whether the aspect ratio data $M_{RESO}$ of the pixel array ALP matches the definition data of the image signal DATA is determined by the comparison of the data in the display apparatus 100.

Figure 6A:
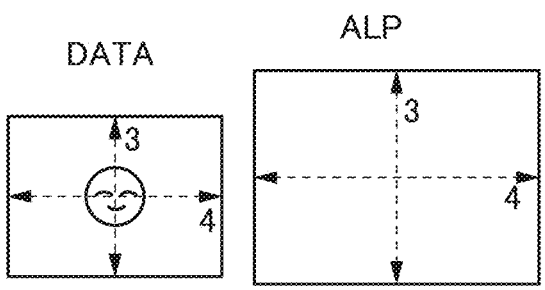
FIG. 6A to FIG. 6D are diagrams illustrating structure examples of a display apparatus.
Figure 6B:
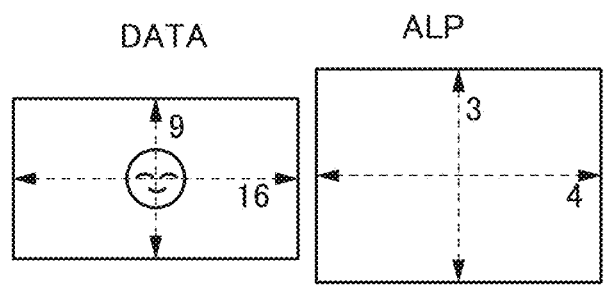

For example, when the definition data of the image signal DATA is VGA (640×480), the aspect ratio is 4:3; it is determined whether this aspect ratio matches the aspect ratio data $M_{RESO}$ (e.g., 4:3) of the pixel array ALP (see FIG. 6A, for example). When the definition data of the image signal DATA meets the Japanese Hi-Vision standard HDTV (1920× 1080), the aspect ratio is 16:9; it is determined whether this aspect ratio matches the aspect ratio data $M_{RESO}$ (e.g., 4:3) of the pixel array ALP (see FIG. 6B, for example). According to the comparison, the aspect ratio data $M_{RESO}$ of the pixel array ALP and the definition data of the image signal DATA match in the former case and do not match in the latter case.

Figure 6C:
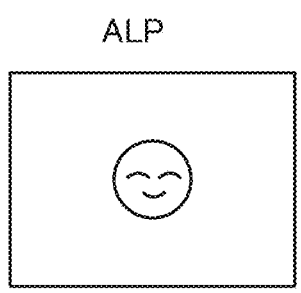

When the data match in Step S04, in Step S05, a control signal and the like for performing display based on the image signal DATA are output from the control circuit unit CNP to each of the local driver circuits LD. The aspect ratios match in the example illustrated in FIG. 6A; thus, an enlarged image is displayed as illustrated in FIG. 6C.

When the data do not match in Step S04, it is determined in Step S06 whether any of the local driver circuits LD can stop functioning. For example, in the example illustrated in FIG. 6B, the aspect ratios do not match and a region ERA in the pixel array ALP illustrated in FIG. 6D can stop functioning. In that case, it is determined whether any of the pixel regions ARA and the local driver circuits LD corresponds to the region ERA. In the case where the region ERA is small and the corresponding pixel region ARA and local driver circuit LD cannot stop functioning, a control signal and the like for performing display based on the image signal DATA are output from the control circuit unit CNP to each of the local driver circuits LD as in Step S05.

In the case where it is determined in Step S06 that the pixel region ARA and the local driver circuit LD corresponding to the region ERA can stop functioning, the control signal STBY is output to the corresponding local driver circuit LD in Step S07. Thus, display based on the image signal DATA is not performed in the pixel region ARA corresponding to the local driver circuit LD.

Figure 6D:
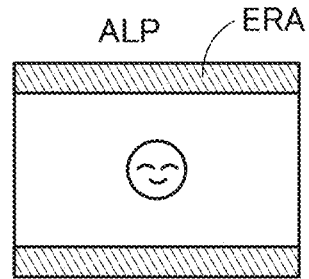

In Step S08, a control signal and the like for performing display based on the image signal DATA are output to the local driver circuits LD other than the local driver circuit LD that has received the control signal STBY in Step S07. In the example illustrated in FIG. 6B, the mismatched aspect ratios cause the region ERA on the top and bottom of the pixel array ALP as illustrated in FIG. 6D; however, the function of the corresponding local driver circuit LD is stopped, which reduces power consumption.

Each of the local driver circuits LD is supplied with the image signal DATA and a control signal, or the control signal STBY in Step S05 and Step S08, so that display can be performed in each of the pixel regions ARA (Step S09).

With the configuration of the display apparatus 100 described in this embodiment, the pixel array ALP of the display apparatus 100 is divided into the plurality of pixel regions ARA so that the pixel regions ARA can be driven in parallel by the corresponding local driver circuits LD. In the case where part of an image is rewritten on the display portion of the display apparatus 100, only necessary local driver circuits LD are driven so as to drive the pixels that are included in the pixel regions ARA displaying the part of the image. That is, the pixels included in the pixel regions ARA of the display portion of the display apparatus 100 can be driven independently of one another. In this case, only the pixels included in the necessary pixel regions ARA are driven and the local driver circuits LD corresponding to the pixel regions ARA which need not be driven are in a resting state, so that the power consumption can be reduced. The pixel array ALP of the display apparatus 100 is divided into the plurality of pixel regions ARA so that the pixel regions ARA can be driven in parallel and independently of one another by the respective local driver circuits LD, which reduces the time needed for rewriting the image displayed on the display portion of the display apparatus 100 (e.g., the time per frame). When the pixel array ALP is divided and driven by the corresponding local driver circuits LD, a driving load becomes small in a divided unit (one pixel region ARA), which facilitates an increase in operation speed and a reduction in power. In addition, with the pixel array ALP divided, the divided units (the pixel regions ARA) can be driven at the same timing, whereby the write time of an image in one frame can be increased as compared with the case where the pixel array ALP is not divided. For example, when the pixel array ALP is divided so that the plurality of gate wirings extended in the pixel array ALP are divided into four, the write time of an image can be ideally ¼ times or nearly ¼ times that of the case where the pixel array ALP is not divided, and the remaining time (the time ¾ times or nearly ¾ times that of the case where the pixel array ALP is not divided) can be assigned to a write time. As a result, the write time of an image can be increased.

Embodiment 2

In this embodiment, the display apparatus 100 described in Embodiment 1 above is described.

Figure 7:
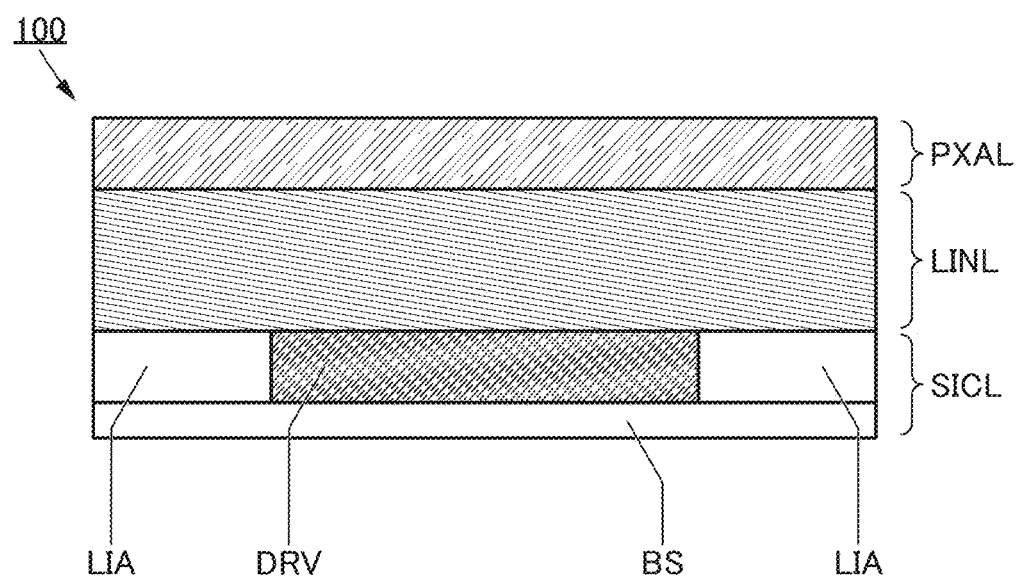
FIG. 7 is a schematic cross-sectional view illustrating a structure example of a display apparatus.

FIG. 7 is a schematic cross-sectional view of the display apparatus 100. The display apparatus 100 includes the pixel layer PXAL, the wiring layer LINL, and the circuit layer SICL. The components illustrated in FIG. 7 correspond to the respective components described in FIG. 3.

The wiring layer LINL is provided over the circuit layer SICL, and the pixel layer PXAL is provided over the wiring layer LINL. Note that the pixel layer PXAL overlaps with a region including the driver circuit region DRV and the region LIA described later.

The circuit layer SICL includes the substrate BS, the driver circuit region DRV, and the region LIA.

Figure 8A:
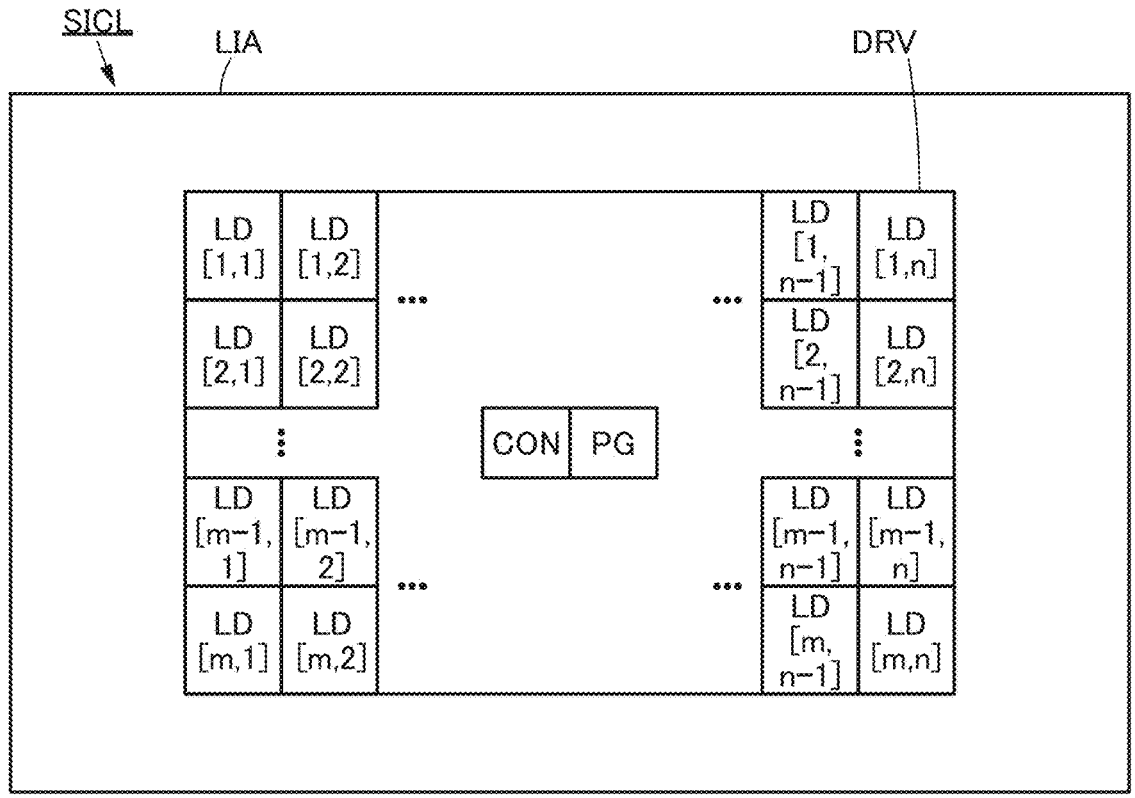
FIG. 8A is a schematic top view illustrating a structure example of a circuit layer included in a display apparatus.

FIG. 8A is an example of a top view of the display apparatus 100, illustrating only the circuit layer SICL. The display apparatus 100 illustrated in FIG. 8A has a structure in which the driver circuit region DRV is surrounded by the region LIA, as an example.

In FIG. 8A, the driver circuit region DRV includes, for example, a plurality of local driver circuits LD, the controller CON, and the voltage generation circuit PG.

Each of the plurality of local driver circuits LD has a function of driving pixels included in the pixel layer PXAL, for example. For example, consider a case where the pixel array ALP included in the pixel layer PXAL is divided into regions of m rows and n columns (m is an integer of 1 or more and n is an integer of 1 or more) in the display apparatus 100. In this case, the number of local driver circuits included in the driver circuit region DRV is m×n.

Note that as an example, FIG. 8A selectively illustrates a local driver circuit LD[1,1], a local driver circuit LD[1,2], a local driver circuit LD[2,1], a local driver circuit LD[2,2], a local driver circuit LD[m−1,1], a local driver circuit LD[m−1,2], a local driver circuit LD[m,1], a local driver circuit LD[m,2], a local driver circuit LD[1,n−1], a local driver circuit LD[1,n], a local driver circuit LD[2,n−1], a local driver circuit LD[2,n], a local driver circuit LD[m−1,n−1], a local driver circuit LD[m−1,n], a local driver circuit LD[m,n−1], and a local driver circuit LD[m,n].

Figure 8B:
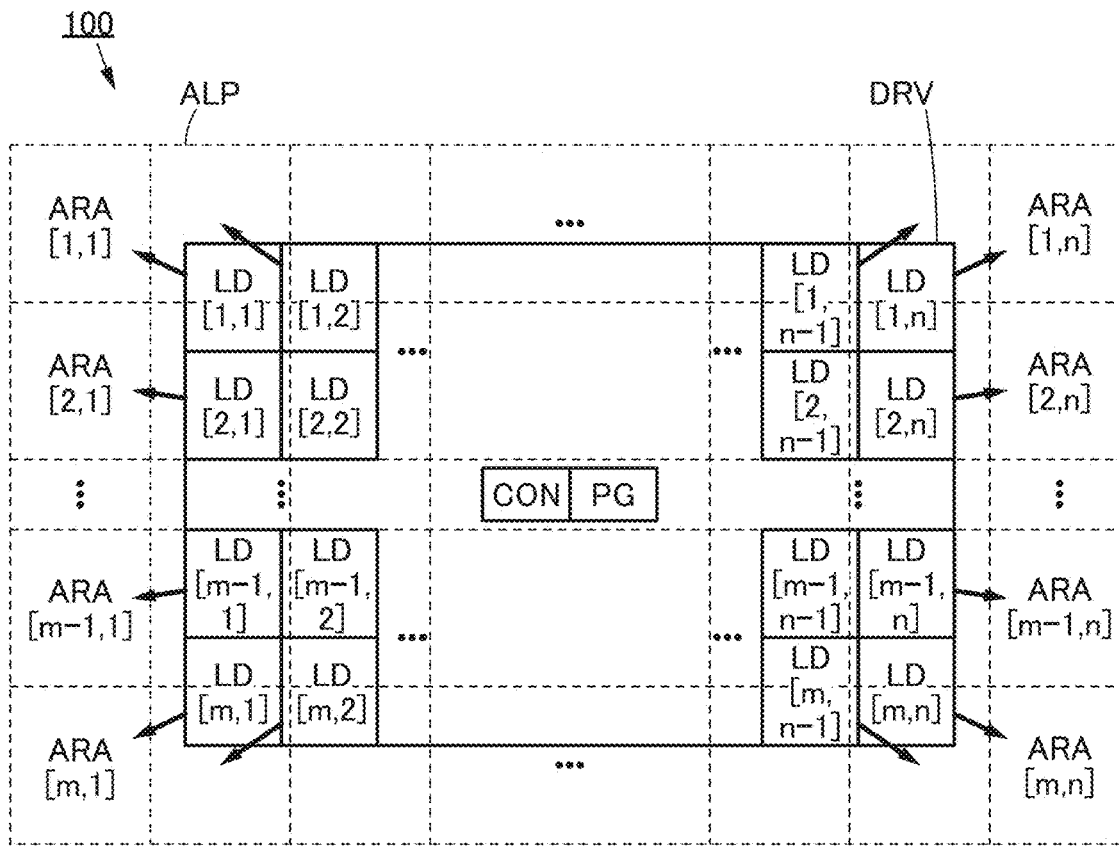
FIG. 8B is a schematic top view illustrating a structure example of the display apparatus.

FIG. 8B illustrates pixel regions obtained by dividing the pixel array ALP included in the pixel layer PXAL into regions of m rows and n columns. FIG. 8B is a top view of the display apparatus 100, only illustrating the driver circuit region DRV and the pixel array ALP. In particular, in FIG. 8B, the driver circuit region DRV is denoted by a solid line and the pixel array ALP is denoted by a dashed line. As illustrated in FIG. 8B, the driver circuit region DRV is positioned to overlap with the inside of the pixel array ALP in the top view. In addition, for example, the pixel array ALP is divided into a pixel region ARA[1,1] to a pixel region ARA[m,n] in FIG. 8B. Note that as an example, FIG. 8B selectively shows the reference numerals of the pixel region ARA[1,1], the pixel region ARA[2,1], the pixel region ARA[m−1,1], the pixel region ARA[m,1], the pixel region ARA[1,n], the pixel region ARA[2,n], the pixel region ARA[m−1,n], and the pixel region ARA[m,n].

For example, in the case where the pixel array ALP is divided into 32 regions, m and n are 4 and 8, respectively, in FIG. 8A and FIG. 8B. In the case where the display apparatus 100 has a definition of 8K4K, the number of pixels is 4320×7680. In the case where the colors of subpixels of the display apparatus 100 are three colors, red (R), green (G), and blue (B), the total number of subpixels is 4320× 7680×3. Here, in the case where a pixel array of the display apparatus 100 with a definition of 8K4K is divided into 32 regions, the number of pixels per region is 1080×960, and when the colors of the subpixels of the display apparatus 100 are three colors, red (R), green (G), and blue (B), the number of subpixels per region is 1080×960×3.

As illustrated in FIG. 8B, for example, the local driver circuit LD[1,1] drives pixels included in the pixel region ARA[1,1], and the local driver circuit LD[2,1] drives pixels included in the pixel region ARA[2,1]. The local driver circuit LD[m−1,1] drives pixels included in the pixel region ARA[m−1,1], and the local driver circuit LD[m,1] drives pixels included in the pixel region ARA[m,1]. The local driver circuit LD[1,n] drives pixels included in the pixel region ARA[1,n], and the local driver circuit LD[2,n] drives pixels included in the pixel region ARA[2,n]. The local driver circuit LD[m−1,n] drives pixels included in the pixel region ARA[m−1,n], and the local driver circuit LD[m,n] drives pixels included in the pixel region ARA[m,n]. That is, although not illustrated in FIG. 8B, a local driver circuit LD[ij] positioned in the i-th row and j-th column (i is an integer greater than or equal to 1 and less than or equal to m and j is an integer greater than or equal to 1 and less than or equal to n) drives a pixel region ARA[ij]. Note that, as an example, the relationship between the pixel region ARA and the local driver circuit LD that drives the pixels included in the pixel region ARA is indicated by a thick arrow in FIG. 8B.

Figure 9A:
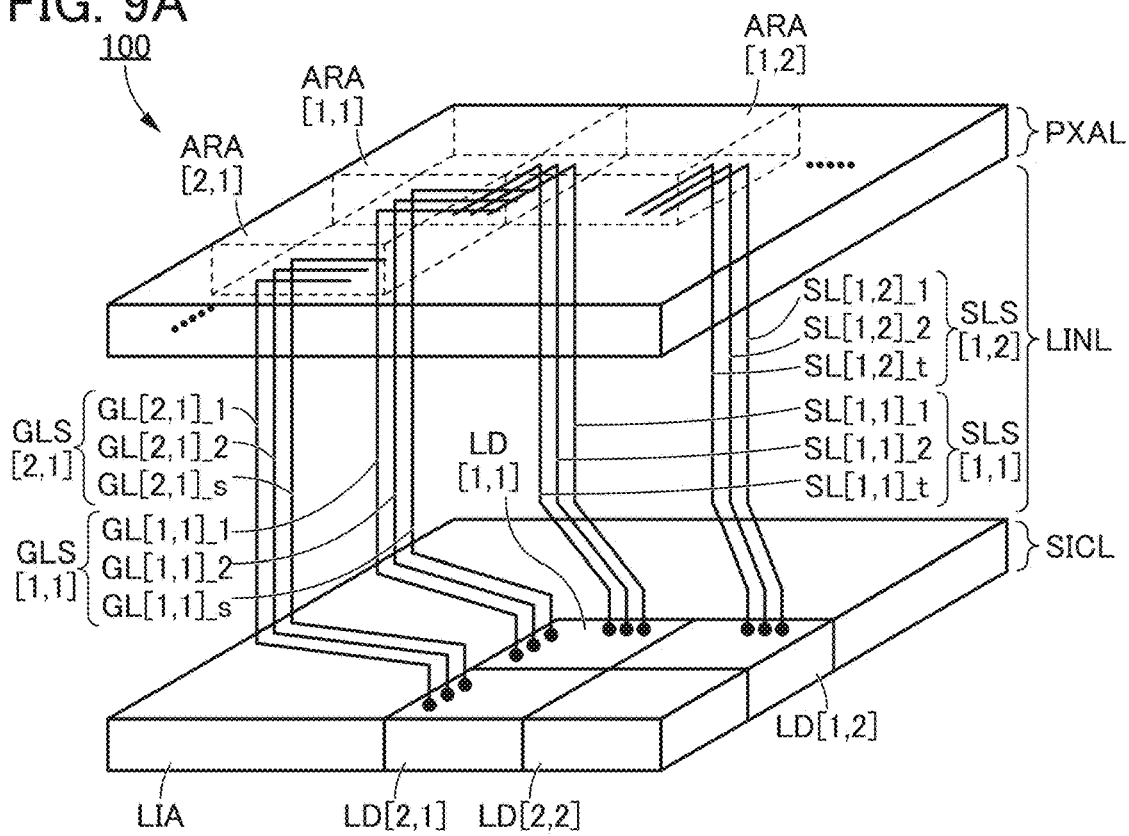
FIG. 9A is a perspective view schematically illustrating a structure example of a display apparatus.

As illustrated in FIG. 8B, in the case where the driver circuit region DRV is positioned to overlap with the inside of the pixel array ALP in the top view, wirings that electrically connect the pixels of the pixel region ARA and the local driver circuit LD (e.g., a source wiring, a gate wiring, and a constant voltage line) are provided as illustrated in FIG. 9A, for example. In other words, the display apparatus of the present invention has a structure in which the wirings that electrically connect the local driver circuit LD and the pixel region ARA corresponding to the local driver circuit LD are extended in the wiring layer LINL.

Note that, as an example, a wiring group GLS[1,1] functions as a plurality of gate wirings that electrically connect the plurality of pixels included in the pixel region ARA[1,1] and a gate driver circuit included in the local driver circuit LD[1,1] in FIG. 9A. As an example, a wiring group SLS[1,1] functions as a plurality of source wirings that electrically connect the plurality of pixels included in the pixel region ARA[1,1] and a source driver circuit included in the local driver circuit LD[1,1]. As an example, a wiring group GLS[2,1] functions as a plurality of gate wirings that electrically connect the plurality of pixels included in the pixel region ARA[2,1] and a gate driver circuit included in the local driver circuit LD[2,1]. As an example, a wiring group SLS[1,2] functions as a plurality of source wirings that electrically connect the plurality of pixels included in the pixel region ARA[1,2] and a source driver circuit included in the local driver circuit LD[1,2].

Consider a case where each of the pixel region ARA[1,1] to the pixel region ARA[m,n] includes a plurality of pixels arranged in a matrix of s rows and t columns (s is an integer of 1 or more and t is an integer of 1 or more) in FIG. 9A, as an example. In this case, for example, each of the wiring group GLS[1,1] and the wiring group GLS[2,1] has s gate wirings, and each of the wiring group SLS[1,1] and the wiring group SL S[1,2] has t source wirings. Note that in FIG. 9A, a wiring GL[1,1]_1, a wiring GL[1,1]_2, and a wiring GL[1,1]_s are selectively illustrated as wirings included in the wiring group GLS[1,1]; a wiring GL[2,1]_1, a wiring GL[2,1]_2, and a wiring GL[2,1]_s are selectively illustrated as wirings included in the wiring group GLS[2,1]; a wiring SL[1,1]_1, a wiring SL[1,1]_2, and a wiring SL[1,1]_t are selectively illustrated as wirings included in the wiring group SLS[1,1]; and a wiring SL[1,2]_1, a wiring SL[1,2]_2, and a wiring SL[1,2]_t are selectively illustrated as wirings included in the wiring group SLS[1,2].

Although not illustrated, wirings other than the gate wirings and the source wirings may be provided in the wiring layer LINL. For example, a wiring for supplying a constant voltage from the voltage generation circuit PG included in the circuit layer SICL to a pixel included in the pixel array ALP may be provided in the wiring layer LINL.

Note that the wiring layer LINL may include a plurality of layers. Specifically, for example, the wiring layer LINL may have a structure in which different wirings overlap with one another as illustrated in FIG. 9B.

Figure 9B:
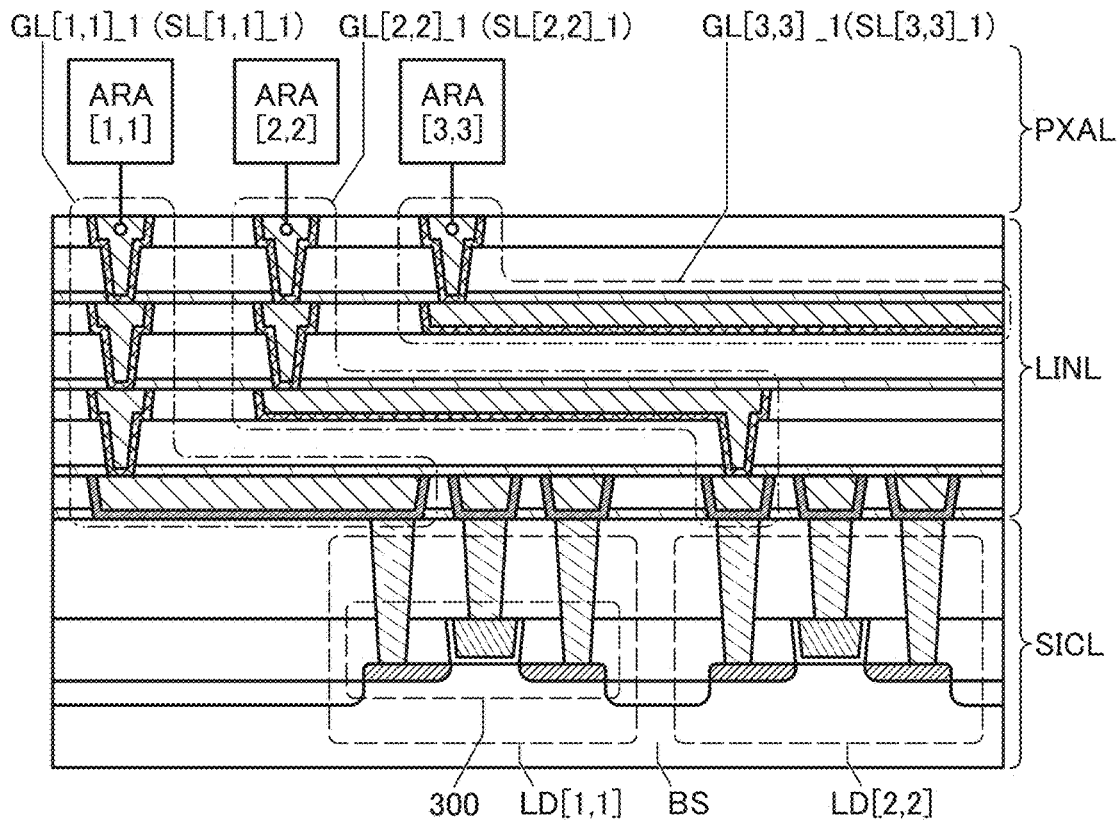
FIG. 9B is a schematic cross-sectional view illustrating a structure example of the display apparatus.

As an example, FIG. 9B illustrates a cross-sectional view in which the circuit layer SICL, the wiring layer LINL, and the pixel layer PXAL are stacked. Note that only the pixel region ARA[1,1], the pixel region ARA[2,2], and the pixel region ARA[3,3] are illustrated in the pixel layer PXAL of FIG. 9B, and they are illustrated by a block diagram. Furthermore, in FIG. 9B, the local driver circuit LD[1,1] and the local driver circuit LD[2,2] are illustrated in the circuit layer SICL, and each of the local driver circuit LD[1,1] and the local driver circuit LD[2,2] includes a transistor 300.

In FIG. 9B, one of a source and a drain of the transistor 300 of the local driver circuit LD[1,1] is electrically connected to the pixel region ARA[1,1] through the wiring GL[1,1]_1 (the wiring SL[1,1]_1). One of a source and a drain of the transistor 300 of the local driver circuit LD[2,2] is electrically connected to the pixel region ARA[2,2] through the wiring GL[2,2]_1 (the wiring SL[2,2]_1). Furthermore, in the structure illustrated in FIG. 9B, the pixel region ARA[3,3] and the wiring GL[3,3]_1 (the wiring SL[3,3]_1) are electrically connected to each other.

For example, at the time of designing, the wirings electrically connecting the local driver circuit LD and the pixel region ARA corresponding to the local driver circuit LD sometimes overlap with each other depending on their positional relationship. In this case, the wirings overlapping with each other are provided in different layers as illustrated in FIG. 9B, whereby the local driver circuit LD and the pixel region ARA corresponding to the local driver circuit LD can be electrically connected to each other without a physical contact between the different wirings. For example, a wiring electrically connecting the pixel region ARA[1,1] and the local driver circuit LD[1,1] and a wiring electrically connecting the pixel region ARA[2,2] and the local driver circuit LD[2,2] are routed so as not to be in a physical contact with each other in FIG. 9B. Furthermore, for example, a wiring electrically connecting the pixel region ARA[2,2] and the local driver circuit LD[2,2] and a wiring electrically connected to the pixel region ARA[3,3] are routed so as not to be in a physical contact with each other in FIG. 9B.

In order to reduce signal delay and/or inhibit an increase in power consumption due to parasitic resistance and the like, it is preferable that the wirings for transmitting signals from the local driver circuit LD to the pixels of the pixel region ARA (e.g., the gate wiring and the source wiring) be short. For this reason, it is preferable that the wirings electrically connecting the local driver circuit LD and the pixel region ARA in the display apparatus 100 be designed to be short. For such a design, as an example, a contact portion of the wirings between each of the pixel regions ARA and the wiring layer LINL is designed to be in an optimal position.

Although the driver circuit region DRV of the circuit layer SICL and the pixel region ARA of the pixel layer PXAL are electrically connected to each other with the wirings of the wiring layer LINL in the structure illustrated in FIG. 9A and FIG. 9B, the display apparatus of one embodiment of the present invention may have a structure in which the driver circuit region DRV of the circuit layer SICL and the pixel region ARA of the pixel layer PXAL are electrically connected to each other with wirings of the region LIA as well as the wirings of the wiring layer LINL.

Figure 10A:
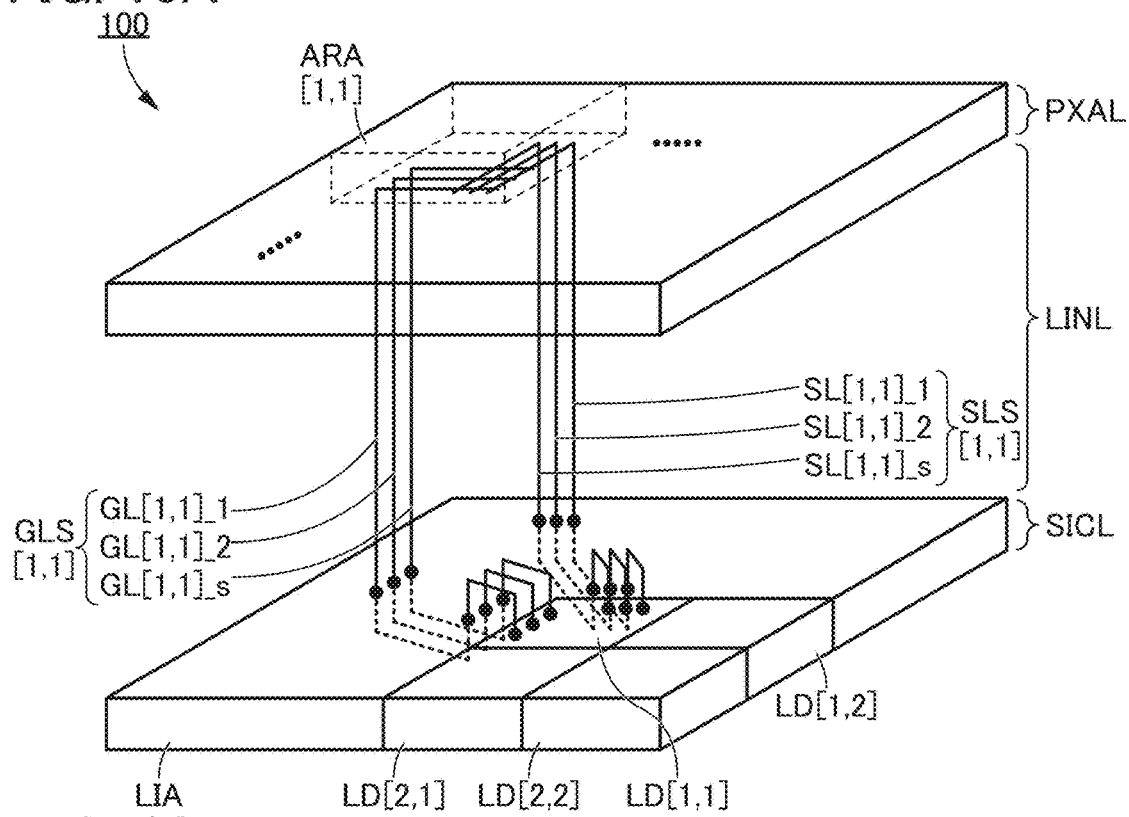
FIG. 10A is a perspective view schematically illustrating a structure example of a display apparatus.
Figure 10B:
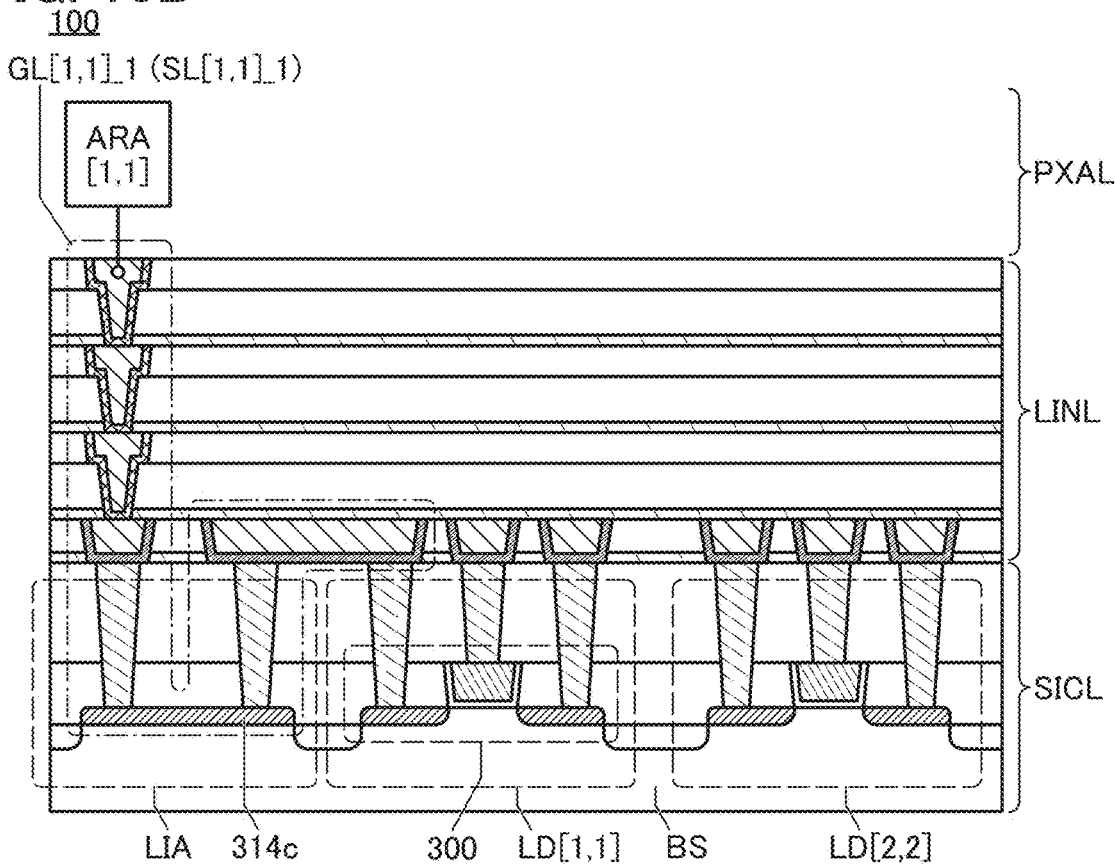
FIG. 10B is a schematic cross-sectional view illustrating a structure example of the display apparatus.

For example, as illustrated in FIG. 10A, the wiring GL[1,1]_1 (the wiring SL[1,1]_1) that is included in the display apparatus 100 and electrically connected between the local driver circuit LD[1,1] and the pixel region ARA[1,1] may be electrically connected to the pixel region ARA[1,1] from one of the source and the drain of the transistor 300 through the wirings of the wiring layer LINL, the wirings included in the region LIA (wirings indicated by thick dotted lines), and the wirings of wiring layer LINL in the order. FIG. 10B is a cross-sectional view of the display apparatus 100 in this case. In the structure of the display apparatus 100 in FIG. 10B, as an example, the path of the wiring GL[1,1]_1 (the wiring SL[1,1]_1) electrically connected between the local driver circuit LD[1,1] of the driver circuit region DRV and the pixel region ARA[1,1] goes through a low-resistance region 314c provided over the substrate BS in the region LIA of the circuit layer SICL. Note that in the case where the substrate BS is a semiconductor substance formed of silicon, the low-resistance region 314c can be formed by being doped with an element imparting conductivity.

Figure 11A:
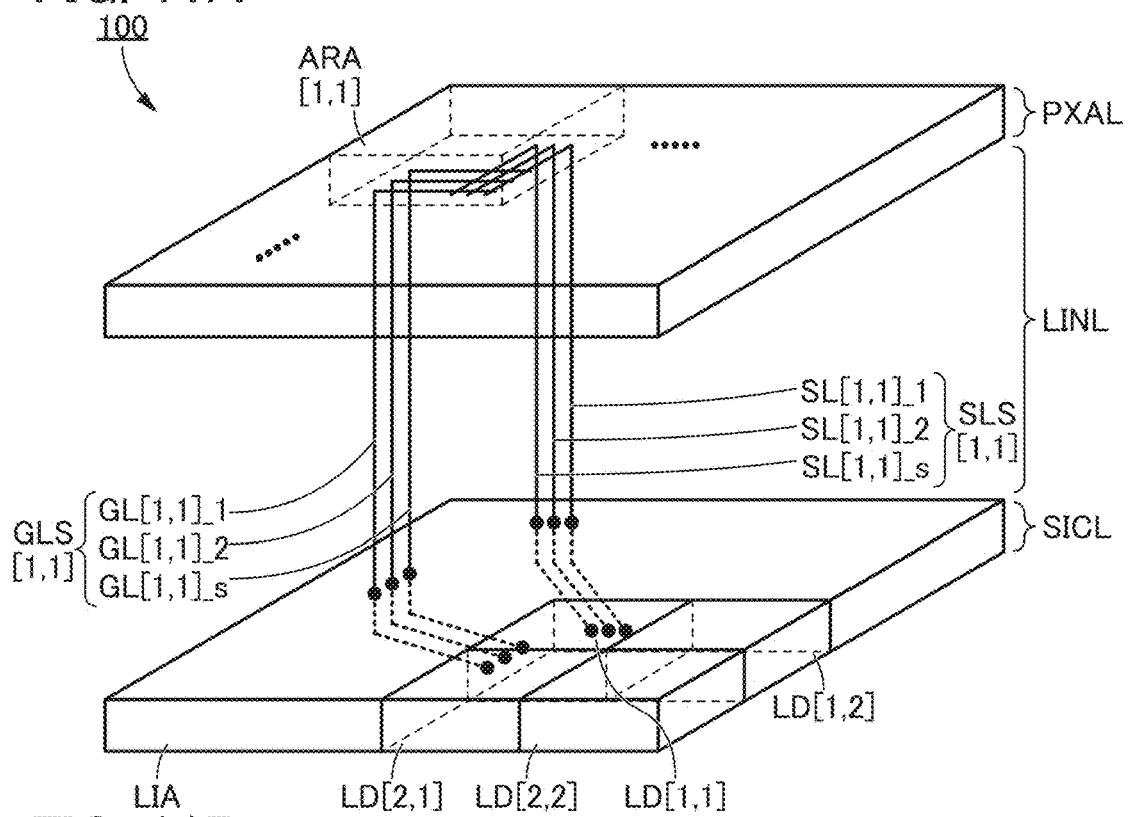
FIG. 11A is a perspective view schematically illustrating a structure example of a display apparatus.
Figure 11B:
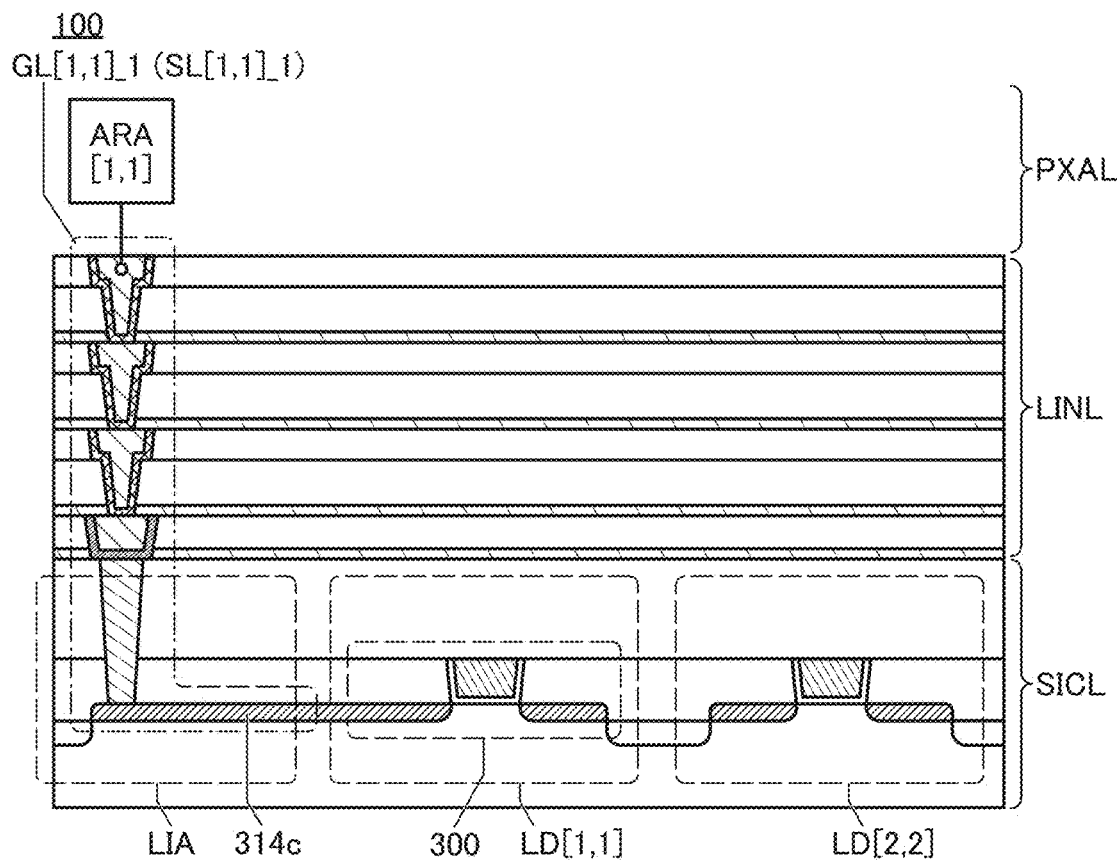
FIG. 11B is a schematic cross-sectional view illustrating a structure example of the display apparatus.

For example, as illustrated in FIG. 11A, the wiring GL[1,1]_1 (the wiring SL[1,1]_1) that is included in the display apparatus 100 and electrically connected between the local driver circuit LD[1,1] and the pixel region ARA[1,1] may be electrically connected to the pixel region ARA[1,1] from one of the source and the drain of the transistor 300 through the wirings included in the region LIA (wirings indicated by thick dotted lines) and the wirings of the wiring layer LINL in the order. FIG. 11B is a cross-sectional view of the display apparatus 100 in this case. The display apparatus 100 of FIG. 11B includes, for example, the low-resistance region 314c in which one of the source and the drain of the transistor 300 extends to the inside of the region LIA. In the display apparatus 100, the local driver circuit LD[1,1] of the driver circuit region DRV and the pixel region ARA[1,1] are electrically connected to each other with the low-resistance region 314c, the wirings included in the wiring layer LINL, and the like.

Figure 12A:
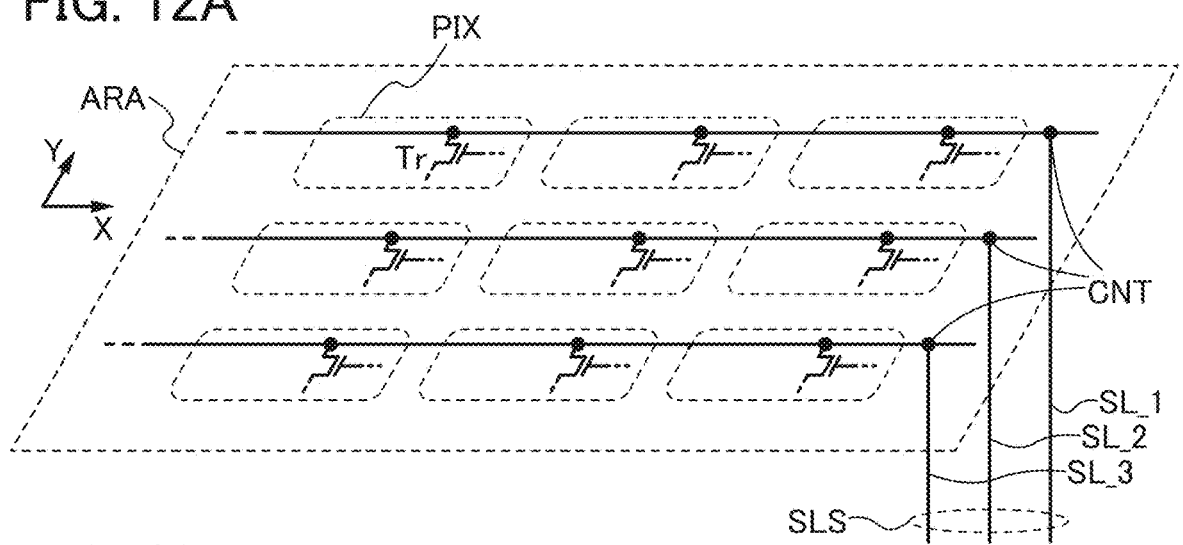
FIG. 12A to FIG. 12C are diagrams illustrating electrical connection between pixels and wirings included in a display apparatus.

Here, the position of the contact portion of the wirings between the pixel region ARA and the wiring layer LINL is described. FIG. 12A is a schematic view illustrating the pixel region ARA and a plurality of pixels PIX included in the pixel region ARA, as an example. Note that the plurality of pixels PIX are arranged in a matrix in the pixel region ARA, as an example. Furthermore, in the structure in FIG. 12A, as an example, each of the pixels PIX includes a transistor Tr, and the other circuit elements are not illustrated. In addition, as an example, the wiring group SLS (the wiring SL_1, the wiring SL_2, and the wiring SL_3) is provided to be extended in the X direction in the pixel region ARA in FIG. 12A. Note that although the three wirings included in the wiring group SLS are illustrated in FIG. 12A, the number of wirings may be one, two, or four or more.

Furthermore, the wiring group GLS and the like are not illustrated. In this specification and the like, the X direction is sometimes rephrased as a row direction, and the Y direction is sometimes rephrased as a column direction.

In FIG. 12A, contact portions of the wirings between the pixel region ARA and the wiring layer LINL are positioned in an edge portion of the pixel array ALP, for example. Note that in FIG. 12A, the contact portions of the wirings between the pixel region ARA and the wiring layer LINL are referred to as contact portions CNT. In this case, the local driver circuit LD is preferably positioned in the positive X direction with respect to the pixel region ARA. In contrast, when the local driver circuit LD is positioned in the negative X direction with respect to the pixel region ARA, the length of the wiring between the pixel region ARA and the local driver circuit LD corresponding to the pixel region ARA is long, which can increase a tendency of occurrence of signal delay and/or power consumption due to parasitic resistance or the like in some cases, for example.

Figure 12B:
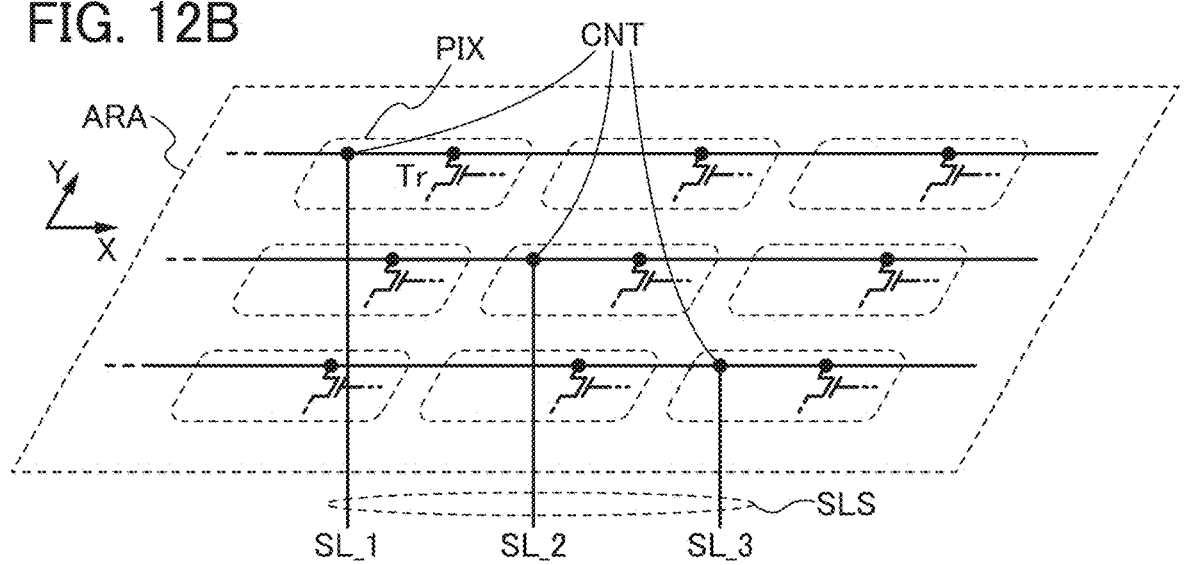

The contact positions of the wirings between the pixel region ARA and the wiring layer LINL may be inside the pixels PIX as illustrated in FIG. 12B, for example. In this case, the local driver circuit LD is preferably positioned in the positive or negative Y direction with respect to the pixel region ARA. Note that although the contact portions CNT in the wiring group SLS are provided in the inside of the pixels PIX of different columns in FIG. 12B, the contact portions CNT in the wiring group SLS may be provided in the inside of the pixels PIX of the same column.

Figure 12C:
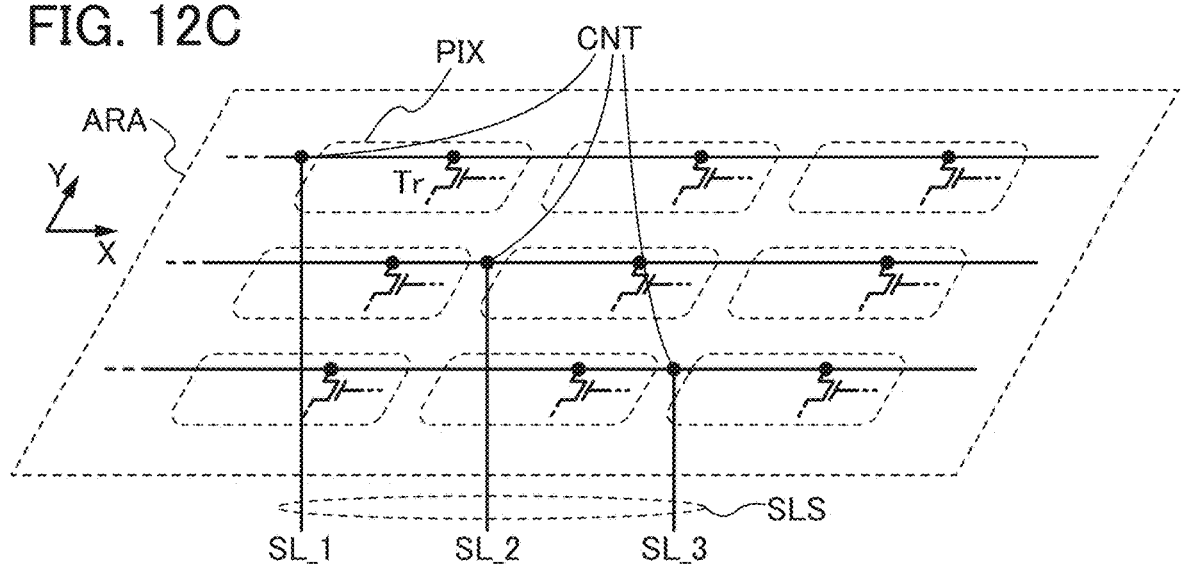

Although the contact portions CNT provided in the inside of the pixels PIX are illustrated in FIG. 12B as an example, the contact portions CNT may be provided in the outside of the pixels PIX (between adjacent pixels PIX) as illustrated in FIG. 12C.

Note that in this specification and the like, as an example, the inside of the pixels PIX can be a region that overlaps with light-emitting regions of light-emitting devices (a light-emitting device 150a to a light-emitting device 150c described later) included in the pixels PIX, and the outside of the pixels PIX can be the outside of the region. Furthermore, for example, the inside of the pixels PIX can be a region that overlaps with EL layers (an EL layer 141a to an EL layer 141c described later) included in the pixels PIX, and the outside of the pixels PIX can be the outside of the region. Moreover, for example, the inside of the pixels PIX can be a region that overlaps with opening portions of an insulator reaching lower electrodes (opening portions of an insulator 112 that reach a conductor 121a to a conductor 121c described later) included in the pixels PIX, and the outside of the pixels PIX can be the outside of the region. In addition, for example, the inside of the pixels PIX can be a region that overlaps with lower electrodes (the conductor 121a to the conductor 121c described later) included in the pixels PIX, and the outside of the pixels PIX can be the outside of the region.

In this specification and the like, the boundary between the inside and outside of the pixel PIX is sometimes included in the inside of the pixel PIX. Depending on circumstances, the boundary between the inside and outside of the pixel PIX is sometimes included in the outside of the pixel PIX.

Depending on the positional relationship between the pixel region ARA and the local driver circuit LD, the positions of the plurality of contact portions CNT may be a combination of the cases illustrated in FIG. 12A to FIG. 12C. That is, one of the plurality of contact portions CNT may be positioned in the edge portion of the pixel region ARA, another thereof may be positioned in the inside of the pixel PIX, and the other thereof may be positioned in the outside of the pixel PIX.

With the display apparatus 100 configured as illustrated in FIG. 7, FIG. 8A, and FIG. 8B, the pixel array ALP of the display apparatus 100 is divided into the pixel region ARA[1,1] to the pixel region ARA[m,n] so that the pixel regions ARA can be driven in parallel by the local driver circuit LD[1,1] to the local driver circuit LD[m,n].

With the local driver circuits LD positioned in almost the center of the circuit layer SICL as illustrated in FIG. 7, FIG. 8A, and FIG. 8B, when an image is displayed on the display portion of the display apparatus 100, a difference in time needed for inputting the data signal of the image to the pixels among different pixel regions ARA can be small. As for not only the data signal but also a pixel selection signal or the like transmitted to the pixel region ARA, a difference in time needed for inputting the signal among different pixel regions ARA can be small in the same manner. In other words, delay of a signal transmitted from the driver circuit region DRV to each pixel region ARA can be reduced.

Note that the structure of the display apparatus of one embodiment of the present invention is not limited to that of the display apparatus 100 described above. The display apparatus of one embodiment of the present invention may have a structure changed from that of the above-described display apparatus 100 according to circumstances.

For example, the display apparatus 100 described above has one driver circuit region DRV included in the circuit layer SICL; however, two or more driver circuit regions DRV may be included in the circuit layer SICL. The display apparatus 100 of FIG. 13A shows a schematic top view illustrating a structure example in which two or more driver circuit regions DRV are included in the circuit layer SICL of the display apparatus 100.

Figure 13A:
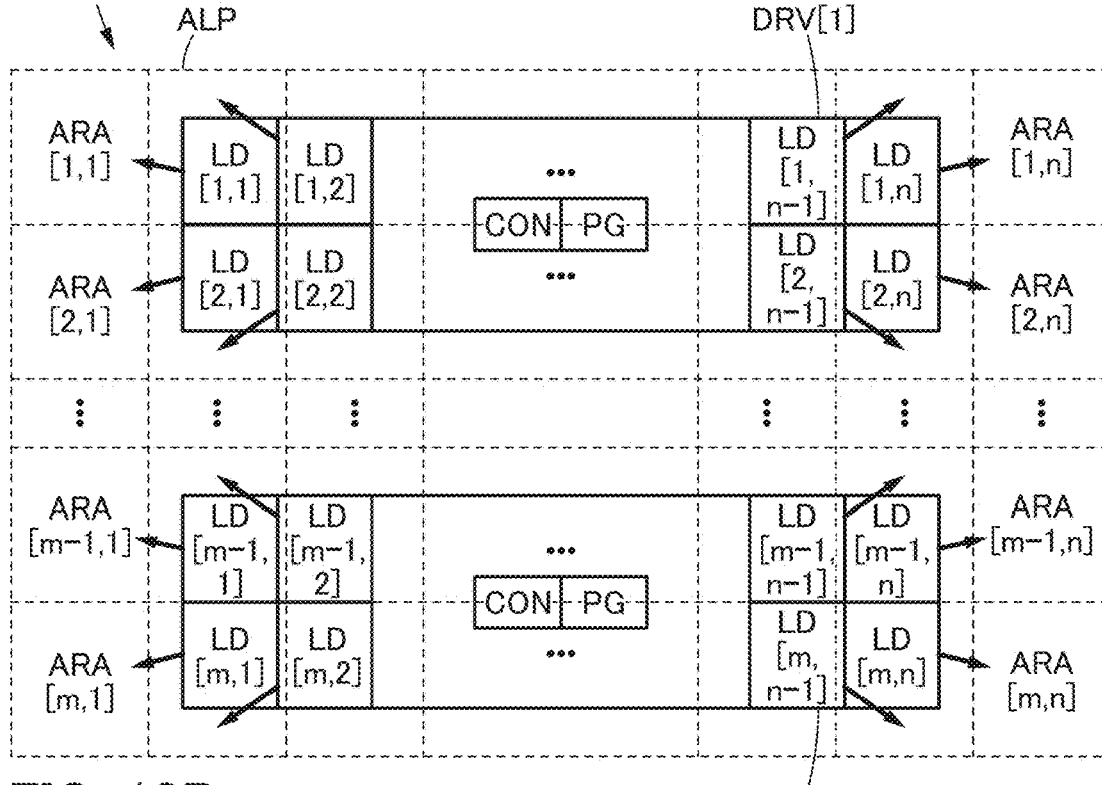
FIG. 13A and FIG. 13B are schematic top views illustrating structure examples of a display apparatus.

The display apparatus 100 of FIG. 13A has a structure in which the driver circuit region DRV is provided in part of a region overlapping with the pixel regions ARA stored in the area of two rows and n columns of the pixel array ALP. Specifically, in the display apparatus 100 of FIG. 13A, a driver circuit region DRV[1] is provided in part of a region overlapping with the area from the pixel region ARA[1,1] to the pixel region ARA[2,n], and a driver circuit region DRV[m/2] is provided in part of a region overlapping with the area from the pixel region ARA[m−1,1] to the pixel region ARA[m,n]. That is, m/2 driver circuit regions DRV (the driver circuit region DRV[1] to the driver circuit region [m/2]) are provided in the circuit layer SICL. Note that m, the number of columns shown in FIG. 13A, is an even number.

Note that the pixel region ARA[1,1], the pixel region ARA[2,1], the pixel region ARA[m−1,1], the pixel region ARA[m,1], the pixel region ARA[1,n], the pixel region ARA[2,n], the pixel region ARA[m−1,n], and the pixel region ARA[m,n] are selectively illustrated in FIG. 13A as the pixel regions ARA. Furthermore, the driver circuit region DRV[1] and the driver circuit region DRV[m/2] are selectively illustrated in FIG. 13A as the driver circuit regions DRV. Moreover, the local driver circuit LD[1,1], the local driver circuit LD[2,1], the local driver circuit LD[1,2], the local driver circuit LD[2,2], the local driver circuit LD[m−1,1], the local driver circuit LD[m,1], the local driver circuit LD[m−1,2], the local driver circuit LD[m,2], the local driver circuit LD[1,n−1], the local driver circuit LD[2,n−1], the local driver circuit LD[1,n], the local driver circuit LD[2,n], the local driver circuit LD[m−1,n−1], the local driver circuit LD[m,n−1], the local driver circuit LD[m−1, n], and the local driver circuit LD[m,n] are selectively illustrated in FIG. 13A as the local driver circuits LD.

Although the controller CON and the voltage generation circuit PG are illustrated in the center part of each of the driver circuit region DRV[1] to the driver circuit region DRV[m/2] in the display apparatus 100 of FIG. 13A, the positions and shapes of the controllers CON and the voltage generation circuits PG provided in the driver circuit region DRV[1] to the driver circuit region DRV[m/2] are not particularly limited.

Note that although the pixels included in each of the plurality of pixel regions ARA stored in the area of two rows and n columns in the pixel array ALP are driven by the local driver circuits LD included in one driver circuit region DRV in the display apparatus 100 of FIG. 13A, the area of the pixel regions in the pixel array ALP which corresponds to one driver circuit region DRV may be an area of one to m rows and n columns or an area of m rows and one to n columns. Specifically, the area of the pixel regions in the pixel array ALP which corresponds to one driver circuit region DRV may be an area of three rows and n columns or the area of m rows and two columns, for example.

Although m representing the number of rows shown in the display apparatus 100 of FIG. 13A is an even number, m may be an odd number. In this case, for example, the display apparatus 100 of FIG. 13A may have a structure in which the whole pixel array ALP is divided into a plurality of areas of two rows and n columns and an area of one row and n columns, and a plurality of driver circuit regions DRV are provided so that one driver circuit region DRV corresponds to one of the areas.

Figure 13B:
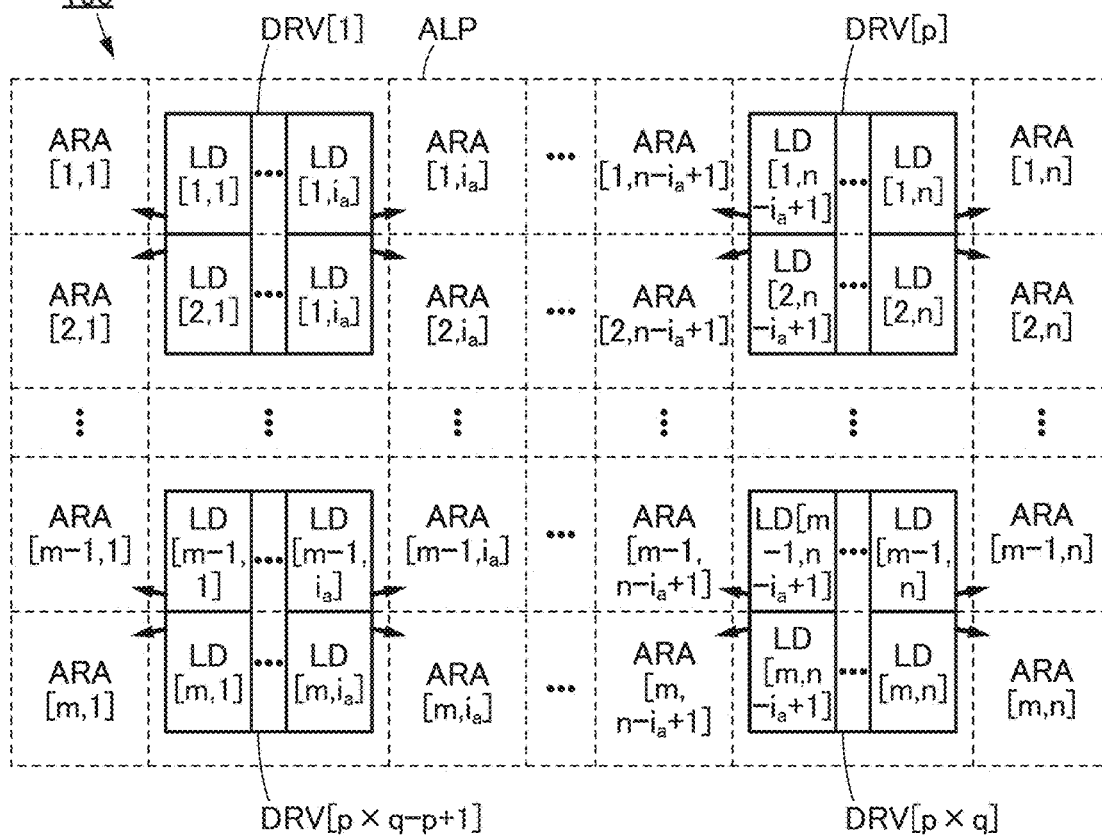

Although the pixels included in each of the plurality of pixel regions ARA stored in the area of two rows and n columns in the pixel array ALP are driven by the local driver circuits LD included in one driver circuit region DRV in the display apparatus 100 of FIG. 13A, the area of the pixel regions in the pixel array ALP which corresponds to one driver circuit region DRV may be an area of one to m rows and one to n columns. Specifically, for example, one area may be set to an area of two rows and $i_a$ columns so that the pixel array ALP is divided into p×q areas, and the pixels of the plurality of pixel regions ARA included in one of the areas may be driven by one driver circuit region DRV, as illustrated in FIG. 13B. Note that here, p, q, and $i_a$ are each an integer of 1 or more and satisfy n=$i_a$×p and m=2×q. In addition, in this case, p×q driver circuit regions DRV (the driver circuit region DRV[1] to the driver circuit region [p×q]) are provided in the circuit layer SICL.

Note that the pixel region ARA[1,1], the pixel region ARA[2,1], the pixel region ARA[m−1,1], the pixel region ARA[m,1], the pixel region ARA[1,$i_a$], the pixel region ARA[2,$i_a$], the pixel region ARA[m−1,$i_a$], the pixel region ARA[m,$i_a$], the pixel region ARA[1,n−$i_a$+1], the pixel region ARA[2,n−$i_a$+1], the pixel region ARA[m−1,n−$i_a$+1], the pixel region ARA[m,n−$i_a$+1], the pixel region ARA[1,n], the pixel region ARA[2,n], the pixel region ARA[m−1,n], and the pixel region ARA[m,n] are selectively illustrated in FIG. 13B as the pixel regions ARA. Furthermore, the driver circuit region DRV[1], the driver circuit region DRV[p], the driver circuit region DRV[p×q−p+1], and the driver circuit region DRV[p×q] are selectively illustrated in FIG. 13B as the driver circuit regions DRV. Moreover, the local driver circuit LD[1,1], the local driver circuit LD[2,1], the local driver circuit LD[m−1,1], the local driver circuit LD[m,1], the local driver circuit LD[1,$i_a$], the local driver circuit LD[2,$i_a$], the local driver circuit LD[m−1,$i_a$], the local driver circuit LD[m,$i_a$], the local driver circuit LD[1,n−$i_a$+1], the local driver circuit LD[2,n−$i_a$+1], the local driver circuit LD[m−1,n−$i_a$+1], the local driver circuit LD[m,n−$i_a$+1], the local driver circuit LD[1,n], the local driver circuit LD[2,n], the local driver circuit LD[m−1,n], and the local driver circuit LD[m,n] are selectively illustrated in FIG. 13B as the local driver circuits LD.

Although the controller CON and the voltage generation circuit PG are not illustrated in each of the driver circuit region DRV[1] to the driver circuit region DRV[p×q] in the display apparatus 100 of FIG. 13B, each of the driver circuit region DRV[1] to the driver circuit region DRV[p×q] may include the controller CON and the voltage generation circuit PG. The positions and shapes of the controllers CON and the voltage generation circuits PG provided in the driver circuit region DRV[1] to the driver circuit region DRV[p×q] are not particularly limited.

Figure 14A:
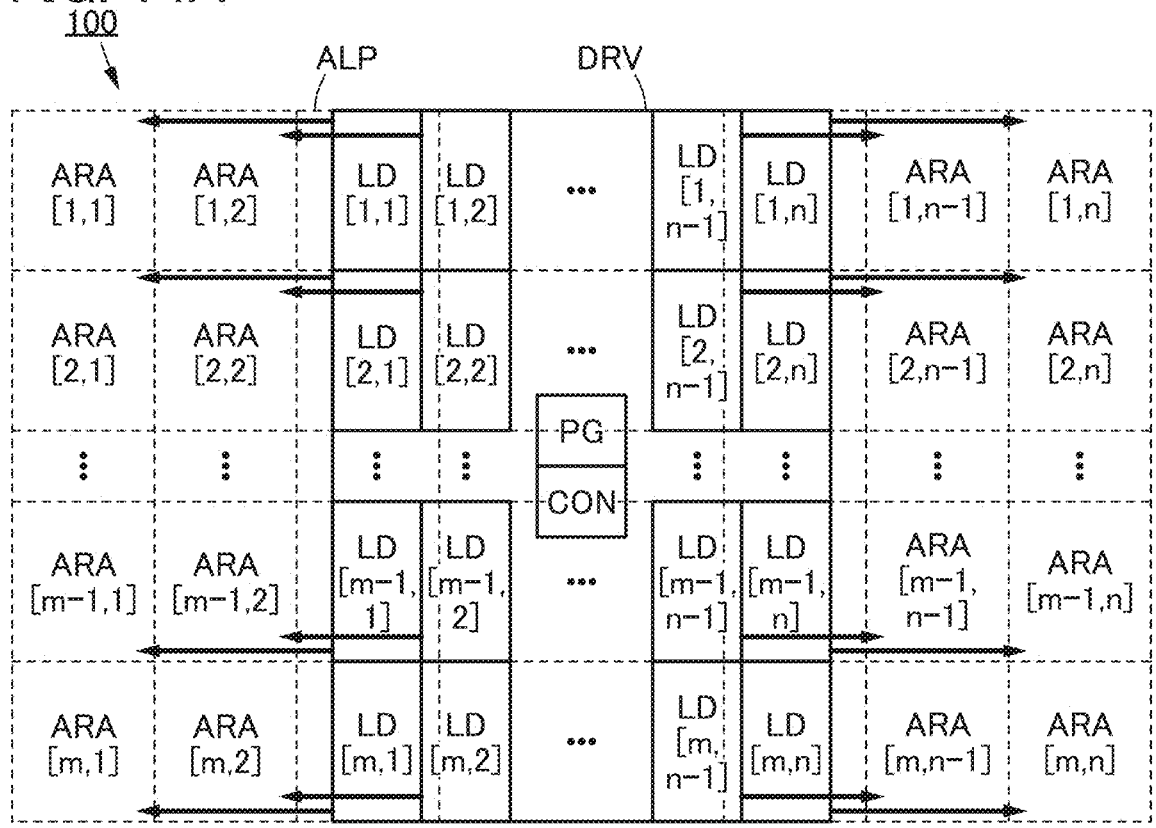
FIG. 14A and FIG. 14B are schematic top views illustrating structure examples of a display apparatus.

Although the driver circuit regions DRV do not overlap with the edge portion of a region including all of the pixel region ARA[1,1] to the pixel region ARA[m,n] of the pixel array ALP in the display apparatus 100 of FIG. 8B, FIG. 13A, FIG. 13B, and the like, part of the driver circuit regions DRV may overlap with part of the edge portion of the pixel array ALP. Specifically, for example, the display apparatus 100 may be configured so that one driver circuit region DRV crosses the pixel array ALP in the column direction of the pixel array ALP in the top view as illustrated in FIG. 14A. Thus, part of the edge portion of the region including all of the pixel region ARA[1,1] to the pixel region ARA[m,n] of the pixel array ALP overlaps with the driver circuit region DRV (including the case where part of the edge portion of the pixel array ALP overlaps with part of the edge portion of the driver circuit region DRV as illustrated in FIG. 14A).

In this case, the local driver circuit LD[1,1] to the local driver circuit LD[m,n] are provided in a matrix of m rows and n columns in the driver circuit region DRV like in the driver circuit region DRV illustrated in FIG. 8B.

Note that the pixel region ARA[1,1], the pixel region ARA[2,1], the pixel region ARA[m−1,1], the pixel region ARA[m,1], the pixel region ARA[1,2], the pixel region ARA[2,2], the pixel region ARA[m−1,2], the pixel region ARA[m,2], the pixel region ARA[1,n−1], the pixel region ARA[2,n−1], the pixel region ARA[m−1,n−1], the pixel region ARA[m,n−1], the pixel region ARA[1,n], the pixel region ARA[2,n], the pixel region ARA[m−1,n], and the pixel region ARA[m,n] are selectively illustrated in FIG. 14A as the pixel regions ARA. Furthermore, the local driver circuit LD[1,1], the local driver circuit LD[2,1], the local driver circuit LD[m−1,1], the local driver circuit LD[m,1], the local driver circuit LD[1,2], the local driver circuit LD[2,2], the local driver circuit LD[m−1,2], the local driver circuit LD[m,2], the local driver circuit LD[1,n−1], the local driver circuit LD[2,n−1], the local driver circuit LD[m−1,n−1], the local driver circuit LD[m,n−1], the local driver circuit LD[1,n], the local driver circuit LD[2,n], the local driver circuit LD[m−1,n], and the local driver circuit LD[m,n] are selectively illustrated in FIG. 14A as the local driver circuits LD.

Although the controller CON and the voltage generation circuit PG are illustrated in the center part of the driver circuit region DRV in the display apparatus 100 of FIG. 14A, the positions and shapes of the controller CON and the voltage generation circuit PG provided in the driver circuit region DRV are not particularly limited.

Although one driver circuit region DRV crosses the pixel array ALP in the display apparatus 100 of FIG. 14A, the display apparatus 100 may be configured so that a plurality of driver circuit regions DRV cross the pixel array ALP.

Figure 14B:
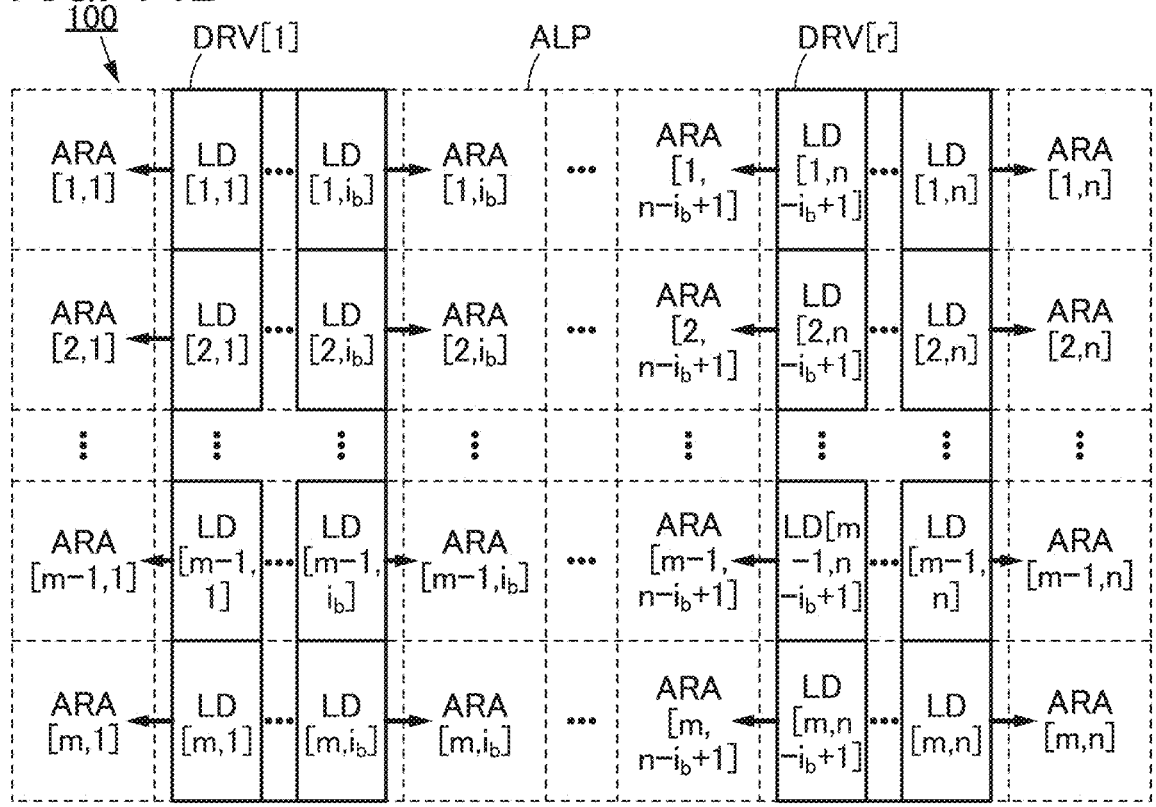

Specifically, as illustrated in FIG. 14B, one area is set to an area of m rows and $i_b$ columns so that the pixel array ALP is divided into r areas, and the pixels of the plurality of pixel regions ARA included in one of the areas may be driven by one driver circuit region DRV, for example. Note that here, r and $i_b$ are each an integer of 1 or more and satisfy n=$i_b$×r. In addition, in this case, r driver circuit regions DRV (the driver circuit region DRV[1] to the driver circuit region DRV[r]) are provided in the circuit layer SICL.

Note that the pixel region ARA[1,1], the pixel region ARA[2,1], the pixel region ARA[m−1,1], the pixel region ARA[m,1], the pixel region ARA[1,$i_b$], the pixel region ARA[2,$i_b$], the pixel region ARA[m−1,$i_b$], the pixel region ARA[m,$i_b$], the pixel region ARA[1,n−$i_b$+1], the pixel region ARA[2,n−$i_b$+1], the pixel region ARA[m−1,n−$i_b$+1], the pixel region ARA[m,n−$i_b$+1], the pixel region ARA[1,n], the pixel region ARA[2,n], the pixel region ARA[m−1,n], and the pixel region ARA[m,n] are selectively illustrated in FIG. 14B as the pixel regions ARA. Furthermore, the driver circuit region DRV[1] and the driver circuit region DRV[r] are selectively illustrated in FIG. 14B as the driver circuit regions DRV. Moreover, the local driver circuit LD[1,1], the local driver circuit LD[2,1], the local driver circuit LD[m−1,1], the local driver circuit LD[m,1], the local driver circuit LD[1,$i_b$], the local driver circuit LD[2,$i_b$], the local driver circuit LD[m−1,$i_b$], the local driver circuit LD[m,$i_b$], the local driver circuit LD[1,n−$i_b$+1], the local driver circuit LD[2,n−$i_b$+1], the local driver circuit LD[m−1,n−$i_b$+1], the local driver circuit LD[m,n−$i_b$+1], the local driver circuit LD[1,n], the local driver circuit LD[2,n], the local driver circuit LD[m−1,n], and the local driver circuit LD[m,n] are selectively illustrated in FIG. 14B as the local driver circuits LD.

Although the controller CON and the voltage generation circuit PG are not illustrated in each of the driver circuit region DRV[1] to the driver circuit region DRV[r] in the display apparatus 100 of FIG. 14B, each of the driver circuit region DRV[1] to the driver circuit region DRV[r] may include the controller CON and the voltage generation circuit PG. The positions and shapes of the controllers CON and the voltage generation circuits PG provided in the driver circuit region DRV[1] to the driver circuit region DRV[r] are not particularly limited.

Although the pixels included in each of the plurality of pixel regions ARA stored in the area of m rows and $i_b$ columns in the pixel array ALP are driven by the local driver circuits LD included in one driver circuit region DRV in the display apparatus 100 of FIG. 14B, the areas of the pixel regions in the pixel array ALP which correspond to the plurality of driver circuit regions DRV may be different from one other. For example, in the case where n, the number of the columns of the pixel array ALP, is an odd number, the display apparatus 100 may have a structure in which the whole pixel array ALP is divided into a plurality of areas of m rows and two columns and an area of m rows and one column, and a plurality of driver circuit regions DRV are provided so that one the driver circuit region DRV corresponds to one of the areas.

Figure 15:
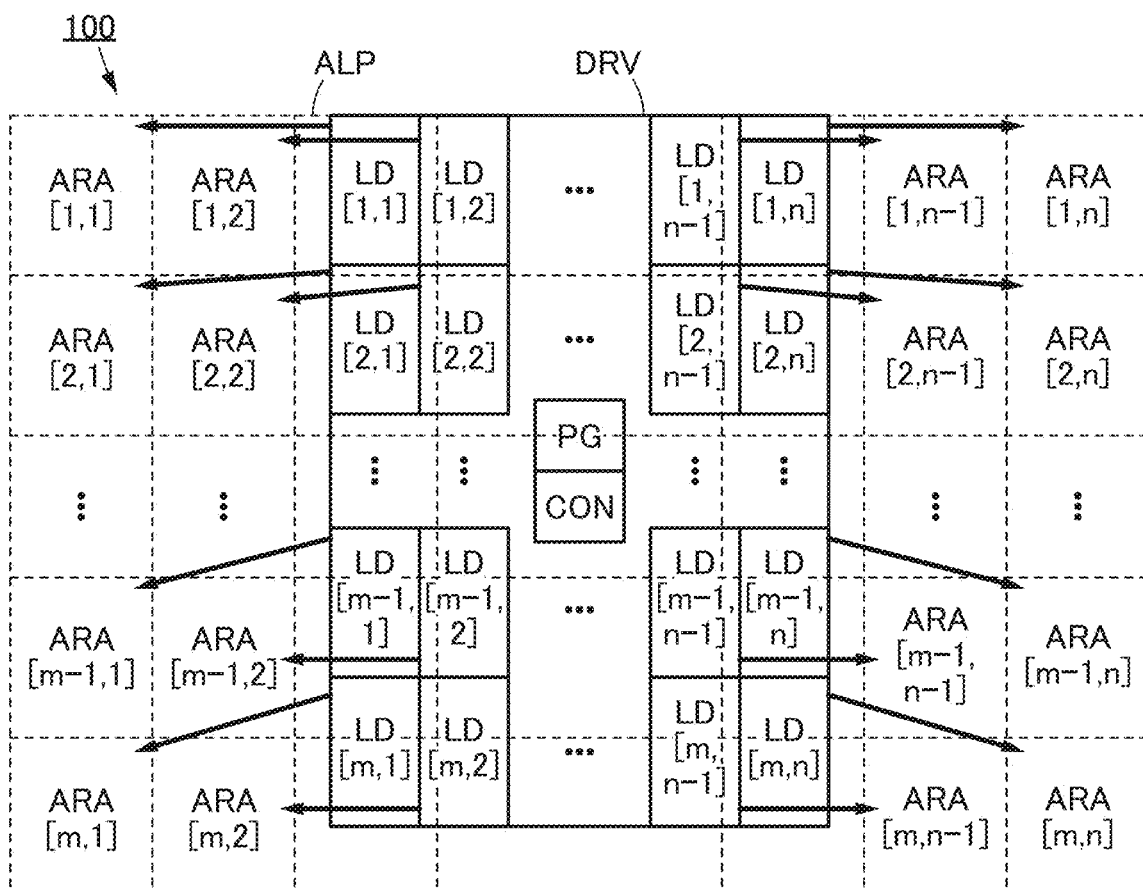
FIG. 15 is a schematic top view illustrating a structure example of a display apparatus.

Although both edge portions of the pixel array ALP that face each other overlap with part of the edge portions of the driver circuit region DRV in the display apparatus 100 of FIG. 14A, one of the edge portions of the pixel array ALP that face each other may overlap with part of the edge portion of the driver circuit region DRV. Specifically, for example, one of the edge portions of the pixel array ALP that face each other may overlap with part of the edge portion of the driver circuit region DRV as illustrated in FIG. 15.

For the display apparatus of one embodiment of the present invention, the above-described structure examples of the display apparatus 100 may be combined as appropriate. As an example, the structure example of the display apparatus 100 of FIG. 8B and the structure example of the display apparatus 100 of FIG. 15 may be combined as shown in the display apparatus 100 of FIG. 16. In the display apparatus 100 of FIG. 16, the circuit layer SICL includes a driver circuit region DRVa that overlaps with one of the edge portions of the pixel array ALP that face each other and a driver circuit region DRVb that overlaps with part of the inside region of the pixel array ALP in the top view. Specifically, in the display apparatus 100 of FIG. 16, the driver circuit region DRVa drives pixels of a region of the pixel array ALP that includes the pixel region ARA[1,1] to the pixel region ARA[$i_c$,n], and the driver circuit region DRVb drives pixels of a region of the pixel array ALP that includes the pixel region ARA[$i_c$+1,1] to the pixel region ARA[m,n]. Note that $i_c$ can be an integer more than or equal to 1 and less than or equal to m−1.

Figure 16:
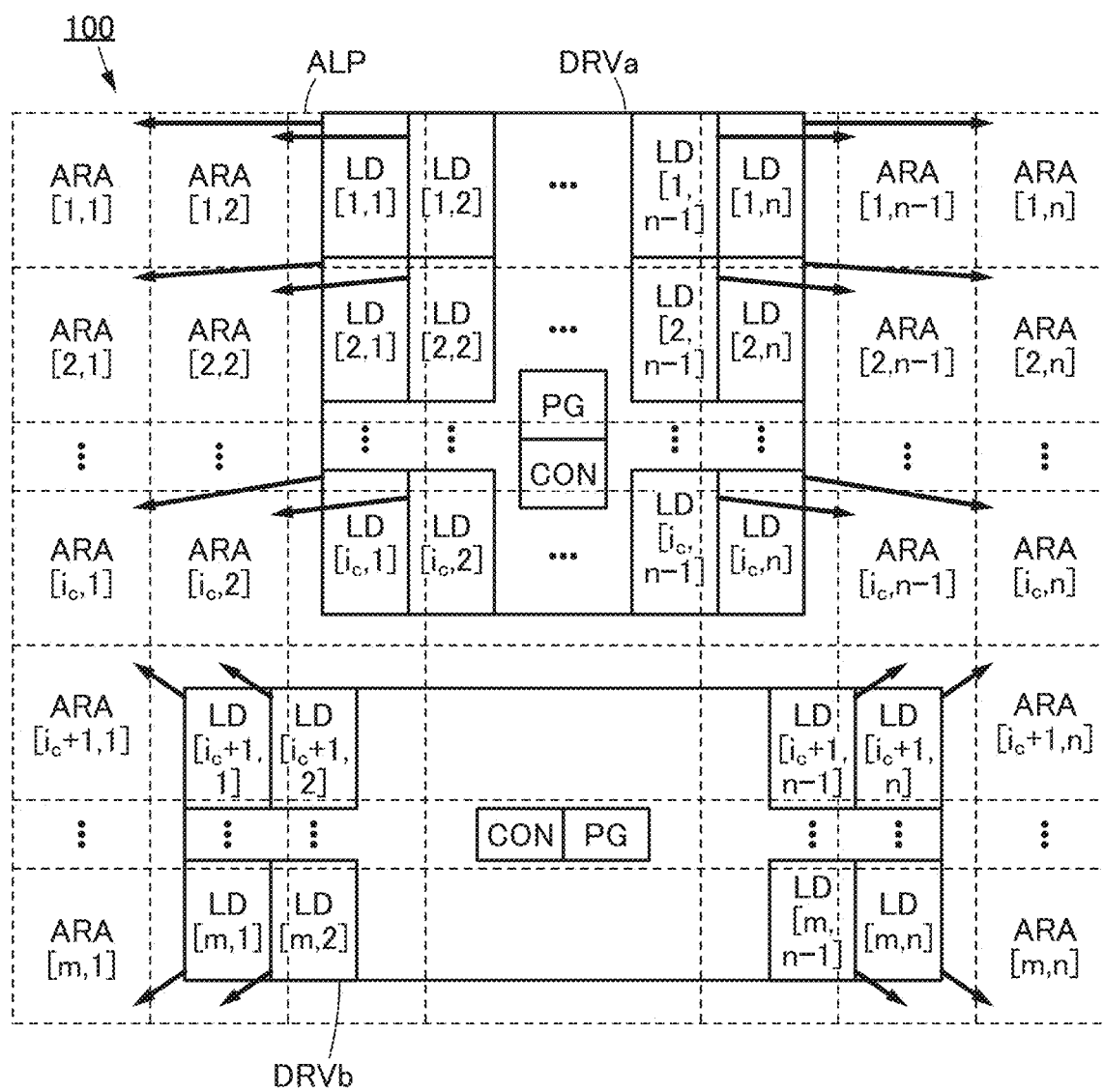
FIG. 16 is a schematic top view illustrating a structure example of a display apparatus.

Note that the pixel region ARA[1,1], the pixel region ARA[2,1], the pixel region ARA[$i_c$,1], the pixel region ARA[$i_c$+1,1], the pixel region ARA[m,1], the pixel region ARA[1,2], the pixel region ARA[2,2], the pixel region ARA[$i_c$,2], the pixel region ARA[1,n−1], the pixel region ARA[2,n−1], the pixel region ARA[$i_c$,n−1], the pixel region ARA[1,n], the pixel region ARA[2,n], the pixel region ARA[$i_c$,n], the pixel region ARA[$i_c$+1,n], and the pixel region ARA[m,n] are selectively illustrated in FIG. 16 as the pixel regions ARA. In addition, the local driver circuit LD[1,1], the local driver circuit LD[2,1], the local driver circuit LD[$i_c$,1], the local driver circuit LD[1,2], the local driver circuit LD[2,2], the local driver circuit LD[$i_c$,2], the local driver circuit LD[1,n−1], the local driver circuit LD[2,n−1], the local driver circuit LD[$i_c$,n−1], the local driver circuit LD[1,n], the local driver circuit LD[2,n], the local driver circuit LD[$i_c$,n], the local driver circuit LD[$i_c$+1,1], the local driver circuit LD[$i_c$+1,2], the local driver circuit LD[m,1], the local driver circuit LD[m,2], the local driver circuit LD[$i_c$+1,n−1], the local driver circuit LD[$i_c$+1,n], the local driver circuit LD[m,n−1], and the local driver circuit LD[m,n] are selectively illustrated in FIG. 16 as the local driver circuits LD.

Although the controller CON and the voltage generation circuit PG are not illustrated in each of the driver circuit region DRVa and the driver circuit region DRVb in the display apparatus 100 of FIG. 16, each of the driver circuit region DRVa and the driver circuit region DRVb may include the controller CON and the voltage generation circuit PG. The positions and shapes of the controllers CON and the voltage generation circuits PG provided in the driver circuit region DRVa and the driver circuit region DRVb are not particularly limited.

Note that this embodiment can be combined with any of the other embodiments described in this specification as appropriate.

Embodiment 3

Figure 17:
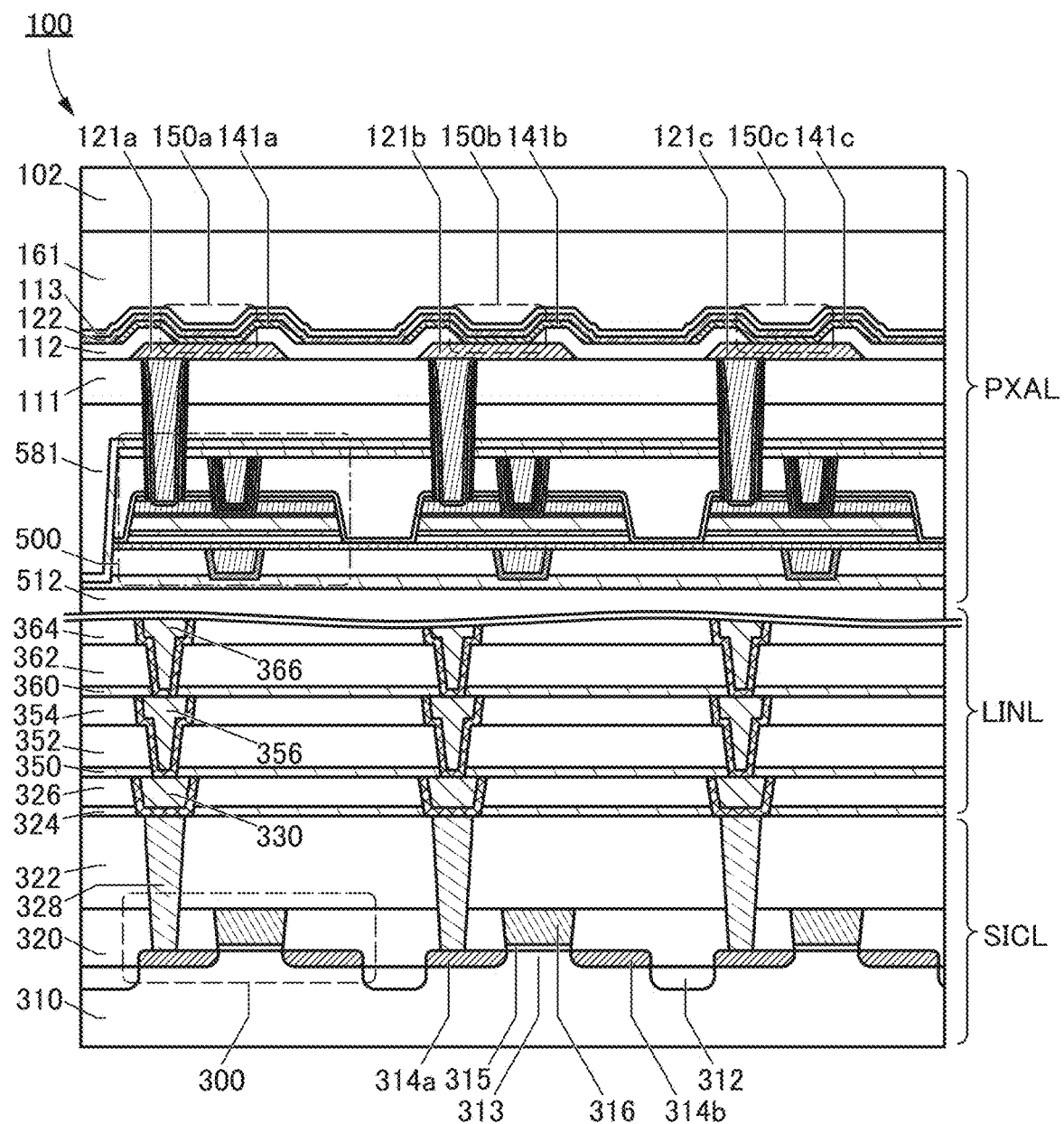
FIG. 17 is a schematic top view illustrating a structure example of a display apparatus.

In this embodiment, a display apparatus of one embodiment of the present invention is described.
<Structure Example of Display Apparatus>
FIG. 17 is a cross-sectional view illustrating an example of a display apparatus of one embodiment of the present invention. The display apparatus 100 illustrated in FIG. 17 includes a pixel circuit and a driver circuit over a substrate 310, for example.

The substrate 310 corresponds to the substrate BS described in the above embodiment, for example. Therefore, a material usable for the substrate BS can be used for the substrate 310.

In the description of this embodiment, the substrate 310 is a semiconductor substrate containing silicon or the like as a material.

The display apparatus 100 includes the transistor 300, a transistor 500, and the light-emitting device 150a to the light-emitting device 150c over the substrate 310.

The transistor 300 is provided on the substrate 310 and includes a conductor 316, an insulator 315, a semiconductor region 313 that is part of the substrate 310, and a low-resistance region 314a and a low-resistance region 314b that function as source and drain regions. Accordingly, the transistor 300 is a transistor (Si transistor) whose channel formation region contains silicon. Although FIG. 17 illustrates a structure in which one of the source region and the drain region of the transistor 300 is electrically connected to a conductor 330 to a conductor 366, which are described later, through a conductor 328 described later, the electrical connection in the semiconductor device of one embodiment of the present invention is not limited thereto. In the semiconductor device of one embodiment of the present invention, for example, the other of the source and the drain of the transistor 300 may be electrically connected to the conductor 330 to the conductor 366 through the conductor 328, or alternatively, a gate of the transistor 300 may be electrically connected to the conductor 330 to the conductor 366 through the conductor 328.

The transistor 300 can be a Fin type when, for example, the top surface of the semiconductor region 313 and the side surface thereof in the channel width direction are covered with the conductor 316 with the insulator 315 as a gate insulating film therebetween. The effective channel width is increased in the Fin-type transistor 300, whereby the on-state characteristics of the transistor 300 can be improved. In addition, contribution of the electric field of the gate electrode can be increased, so that the off-state characteristics of the transistor 300 can be improved.

Note that the transistor 300 may be either a p-channel transistor or an n-channel transistor. Alternatively, a plurality of transistors 300 may be provided and both the p-channel transistor and the n-channel transistor may be used.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be a HEMT (High Electron Mobility Transistor) with GaAs and GaAlAs, or the like.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

An element isolation layer 312 is provided to separate a plurality of transistors on the substrate 310 from each other. The element isolation layer can be formed by, for example, a LOCOS (LOCal Oxidation of Silicon) method, an STI (Shallow Trench Isolation) method, a mesa isolation method, or the like.

Note that the transistor 300 illustrated in FIG. 17 is an example and the structure is not limited thereto; an appropriate transistor is used in accordance with a circuit configuration, a driving method, or the like. For example, the transistor 300 may have a planar structure instead of a Fin-type structure.

An insulator 320, an insulator 322, an insulator 324, and an insulator 326 are sequentially stacked from the substrate 310 side to cover the transistor 300 illustrated in FIG. 17.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like covered with the insulator 320 and the insulator 322. For example, the top surface of the insulator 322 may be planarized by planarization treatment using a chemical mechanical polishing (CMP) method or the like to improve planarity.

For the insulator 324, it is preferable to use a barrier insulating film preventing diffusion of water, hydrogen, impurities and the like from the substrate 310, the transistor 300, or the like to a region above the insulator 324 (e.g., the region where the transistor 500, the light-emitting device 150a to the light-emitting device 150c, and the like are provided). Accordingly, for the insulator 324, it is preferable to use an insulating material that has a function of inhibiting diffusion of impurities such as a hydrogen atom, a hydrogen molecule, and a water molecule (through which the above-described impurities are unlikely to pass). Furthermore, depending on the situation, for the insulator 324, it is preferable to use an insulating material having a function of inhibiting diffusion of impurities such as a nitrogen atom, a nitrogen molecule, a nitrogen oxide molecule ($N_2O$, NO, $NO_2$, or the like), and a copper atom (through which the above-described impurities are unlikely to pass). Alternatively, it is preferable that the insulator 324 have a function of inhibiting diffusion of oxygen (e.g., at least one of an oxygen atom, an oxygen molecule, and the like).

For the film having a barrier property against hydrogen, silicon nitride formed by a chemical vapor deposition (CVD) method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for the interlayer film, the parasitic capacitance generated between wirings can be reduced.

In addition, the conductor 328, the conductor 330, and the like that are connected to the light-emitting devices and the like provided above the insulator 326 are embedded in the insulator 320, the insulator 322, the insulator 324, and the insulator 326. Note that the conductor 328, the conductor 330, and the like function as plugs or wirings. A plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 17, an insulator 350, an insulator 352, and an insulator 354 are provided to be stacked in this order above the insulator 326 and the conductor 330. Furthermore, the conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a comparatively low relative permittivity to reduce parasitic capacitance generated between wirings, like the insulator 326. The insulator 352 and the insulator 354 have functions of an interlayer insulating film and a planarization film. The conductor 356 preferably contains a conductor having a barrier property against impurities such as hydrogen and water. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride or the like is preferably used, for example. The use of a stack including tantalum nitride and tungsten that has high conductivity can inhibit diffusion of hydrogen from the transistor 300 while the conductivity of a wiring is kept. In that case, a tantalum nitride layer having a barrier property against hydrogen is preferably in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. Like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and a conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 512 is provided above the insulator 364 and the conductor 366. A substance having a barrier property against oxygen or hydrogen is preferably used for the insulator 512. The insulator 512 is formed using, for example, silicon oxide, silicon oxynitride, silicon nitride oxide, silicon nitride, aluminum oxide, aluminum oxynitride, aluminum nitride oxide, or aluminum nitride.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

A material similar to that for the insulator 320 can be used for the insulator 512, for example. When a material with a comparatively low permittivity is used for these insulators, parasitic capacitance generated between wirings can be reduced. A silicon oxide film, a silicon oxynitride film, or the like can be used as the insulator 512, for example.

The transistor 500 that is an OS transistor is provided over the insulator 512, for example.

Figure 18A:
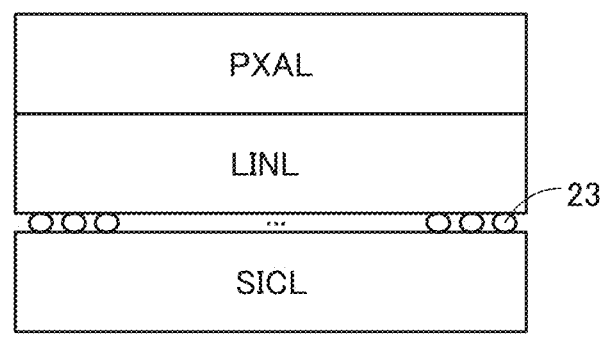
FIG. 18A and FIG. 18B are schematic cross-sectional views illustrating structure examples of a display apparatus.
Figure 18B:
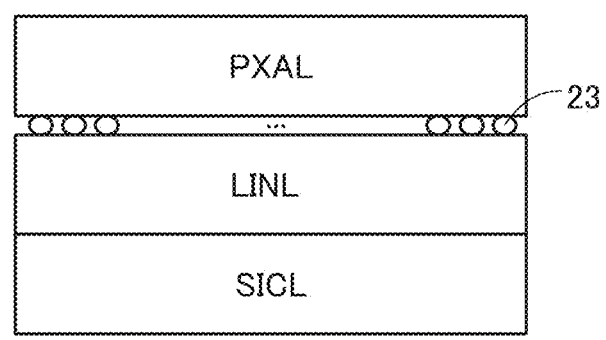

Note that the circuit layer SICL, the wiring layer LINL, and the pixel layer PXAL may be stacked by a bonding step or the like. For example, as illustrated in FIG. 18A, the circuit layer SICL and the wiring layer LINL can be connected with micro-bumps 23 and the like to be bonded to each other. The micro-bumps 23 can directly connect electrodes (not illustrated) provided on the circuit layer SICL and the wiring layer LINL with a TSV (Through Silicon Via). In that case, a transistor included in the pixel layer PXAL can also be a Si transistor. The micro-bumps 23 may be provided between the wiring layer LINL and the pixel layer PXAL as illustrated in FIG. 18B.

Figure 19A:
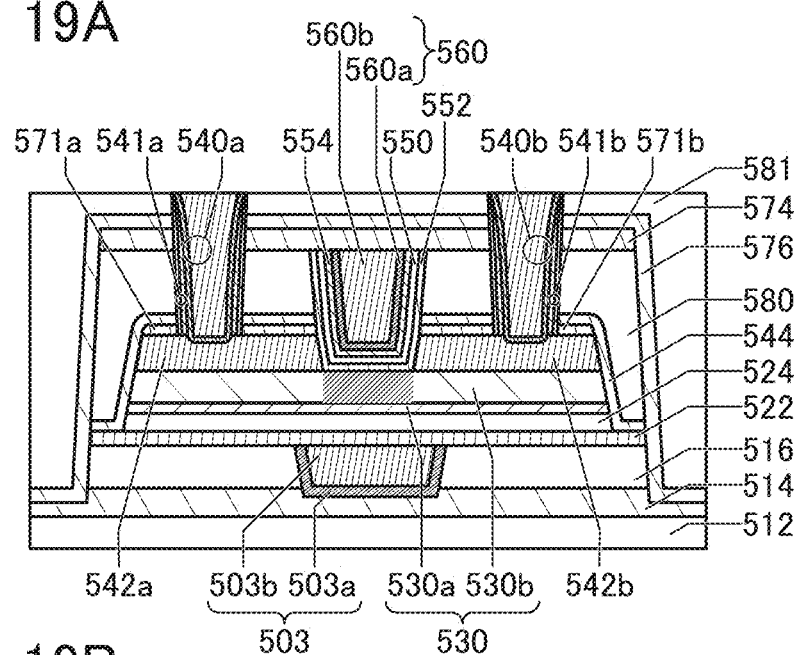
FIG. 19A and FIG. 19B are schematic cross-sectional views illustrating structure examples of a transistor.
Figure 19B:
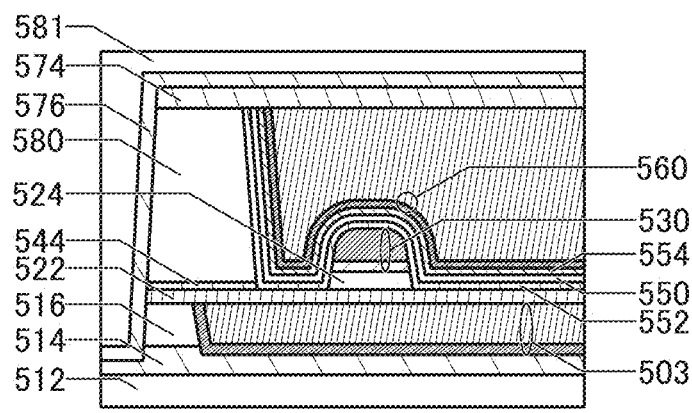

Details of the transistor 500 are described here. FIG. 19A and FIG. 19B illustrate a structure example of the transistor 500 that is an OS transistor. Note that FIG. 19A is a cross-sectional view of the OS transistor in the channel length direction, and FIG. 19B is a cross-sectional view of the OS transistor in the channel width direction.

As illustrated in FIG. 19A and FIG. 19B, an insulator 514 and an insulator 516 are formed over the insulator 512.

As the insulator 514, it is preferable to use a film having a barrier property that prevents diffusion of hydrogen or impurities from the substrate 310, a region where the circuit element or the like below the insulator 512 is provided, or the like into a region where the transistor 500 is provided. Thus, silicon nitride deposited by a CVD method can be used for the insulator 514, for example.

For the insulator 516, a material similar to that for the insulator 512 can be used, for example.

As illustrated in FIG. 19A and FIG. 19B, the transistor 500 includes the insulator 516 over the insulator 514, a conductor 503 (a conductor 503a and a conductor 503b) provided to be embedded in the insulator 514 and the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is over the insulator 554 and overlaps with part of the oxide 530b, and an insulator 544 provided over the insulator 522, the insulator 524, the oxide 530a, the oxide 530b, the conductor 542a, the conductor 542b, the insulator 571a, and the insulator 571b. Here, as illustrated in FIG. 19A and FIG. 19B, the insulator 552 is in contact with the top surface of the insulator 522, the side surface of the insulator 524, the side surface of the oxide 530a, the side surface and the top surface of the oxide 530b, the side surface of the conductor 542, the side surface of the insulator 571, the side surface of the insulator 544, the side surface of an insulator 580, and the bottom surface of the insulator 550. The top surface of the conductor 560 is placed to be substantially level with the upper portion of the insulator 554, the upper portion of the insulator 550, the upper portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are provided in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with the side surface of the conductor 560 and a region in contact with the bottom surface of the conductor 560.

The oxide 530 preferably includes the oxide 530a provided over the insulator 524 and the oxide 530b provided over the oxide 530a. Including the oxide 530a under the oxide 530b makes it possible to inhibit diffusion of impurities into the oxide 530b from components formed below the oxide 530a.

Although a structure in which two layers, the oxide 530a and the oxide 530b, are stacked as the oxide 530 in the transistor 500 is described, the present invention is not limited thereto. For example, the transistor 500 can include the oxide 530 with a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 that overlaps with the conductor 560 functions as a channel formation region.

Figure 20A:
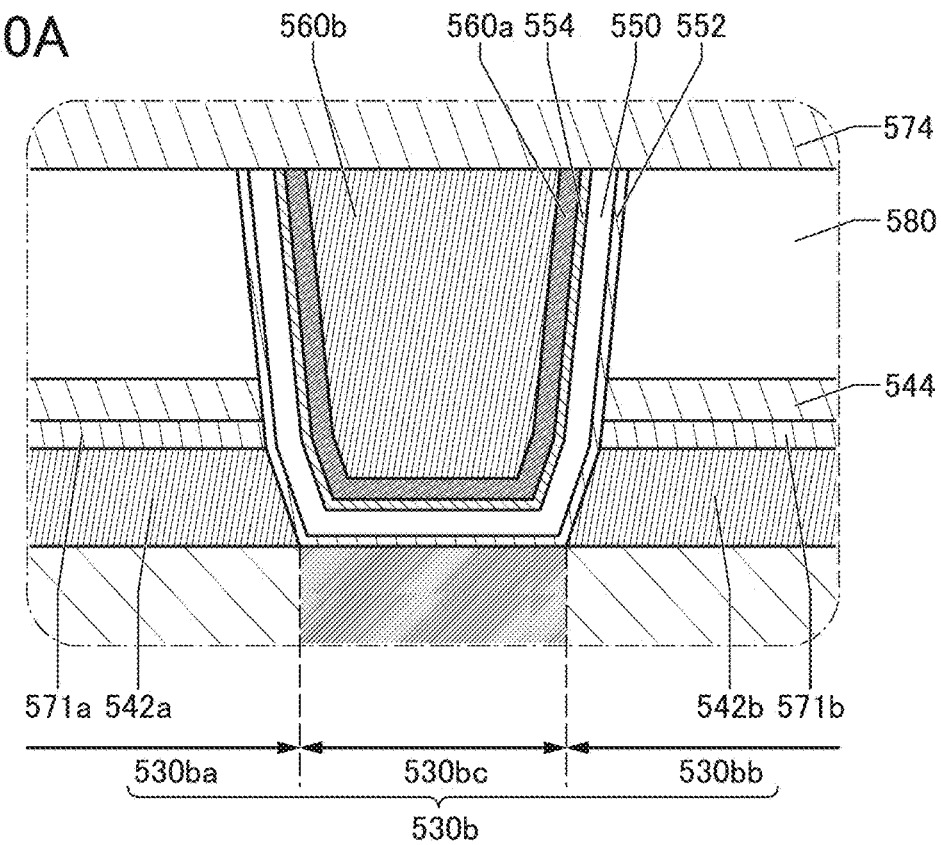
FIG. 20A and FIG. 20B are schematic cross-sectional views illustrating structure examples of a transistor.

FIG. 20A is an enlarged view of the vicinity of the channel formation region in FIG. 19A. Supply of oxygen to the oxide 530b forms the channel formation region in a region between the conductor 542a and the conductor 542b. As illustrated in FIG. 20A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as $V_O$ in this specification and the like) or a lower impurity concentration than the region 530ba and the region 530bb to be a high-resistance region having a low carrier concentration. Thus, the region 530bc can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter, sometimes referred to as $V_O H$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_OH$ are preferably reduced as much as possible in the region of the oxide semiconductor where a channel is formed.

The region 530ba and the region 530bb functioning as the source region and the drain region are each a low-resistance region with an increased carrier concentration because they include a large amount of oxygen vacancies ($V_O$) or have a high concentration of an impurity such as hydrogen, nitrogen, or a metal element. In other words, the region 530ba and the region 530bb are each an n-type region having a higher carrier concentration and a lower resistance than the region 530bc.

The carrier concentration in the region 530bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530bc functioning as the channel formation region is not particularly limited and can be, for example, $1 \times 10^{-9}$ cm$^{-3}$.

Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or substantially equal to the hydrogen concentration in the region 530bc in some cases. The amount of oxygen vacancies in the junction region is smaller than or substantially equal to the amounts of oxygen vacancies in the region 530ba and the region 530bb and larger than or substantially equal to the amount of oxygen vacancies in the region 530bc in some cases.

Although FIG. 20A illustrates an example in which the region 530ba, the region 530bb, and the region 530bc are formed in the oxide 530b, the present invention is not limited thereto. For example, the above regions may be formed not only in the oxide 530b but also in the oxide 530a.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530b is preferably greater than the atomic ratio of In to the element M in the metal oxide used as the oxide 530a.

The oxide 530a is provided under the oxide 530b in the above manner, whereby impurities and oxygen can be inhibited from diffusing into the oxide 530b from components formed below the oxide 530a.

When the oxide 530a and the oxide 530b contain a common element (as the main component) besides oxygen, the density of defect states at an interface between the oxide 530a and the oxide 530b can be made low. Since the density of defect states at the interface between the oxide 530a and the oxide 530b can be made low, the influence of interface scattering on carrier conduction is small, and a high on-state current can be obtained.

The oxide 530b preferably has crystallinity. It is particularly preferable to use a CAAC-OS (c-axis aligned crystalline oxide semiconductor) as the oxide 530b.

The CAAC-OS is a metal oxide having a dense structure with high crystallinity and small amounts of impurities and defects (e.g., oxygen vacancies ($V_O$). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as $V_OH$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and V$_O$H. However, supply of an excess amount of oxygen to the source region or the drain region might cause a decrease in the on-state current or field-effect mobility of the transistor 500. Furthermore, a variation of the amount of oxygen supplied to the source region or the drain region in the substrate plane leads to a variation in characteristics of the semiconductor device including the transistor.

Therefore, the region 530bc functioning as the channel formation region in the oxide semiconductor is preferably an i-type or substantially i-type region with a reduced carrier concentration, whereas the region 530ba and the region 530bb functioning as the source region and the drain region are preferably n-type regions with high carrier concentrations. That is, it is preferable that oxygen vacancies and V$_O$H in the region 530bc of the oxide semiconductor be reduced and the region 530ba and the region 530bb not be supplied with an excess amount of oxygen.

Thus, in this embodiment, microwave treatment is performed in an oxygen-containing atmosphere in a state where the conductor 542a and the conductor 542b are provided over the oxide 530b so that oxygen vacancies and V$_O$H in the region 530bc can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530bc can be irradiated with the high-frequency wave such as a microwave or RF. By the effect of the plasma, a microwave, or the like, V$_O$H in the region 530bc can be cut; thus, hydrogen H can be removed from the region 530bc and an oxygen vacancy V$_O$ can be filled with oxygen. That is, the reaction "V$_O$H→H+V$_O$" occurs in the region 530bc, so that the hydrogen concentration in the region 530bc can be reduced. As a result, oxygen vacancies and V$_O$H in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b and the conductor 542. Hence, a reduction in V$_O$H and supply of an excess amount of oxygen do not occur in the region 530ba and the region 530bb in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is provided to be in contact with the side surface of the conductor 542 and the surface of the region 530bc, thereby inhibiting oxygen more than necessary from being supplied to the region 530bc and inhibiting the side surface of the conductor 542 from being oxidized. Furthermore, the side surface of the conductor 542 can be inhibited from being oxidized when an insulating film to be the insulator 550 is formed.

The oxygen supplied into the region 530bc has any of a variety of forms such as an oxygen atom, an oxygen molecule, and an oxygen radical (also referred to as an O radical, an atom or a molecule having an unpaired electron, or an ion). Note that the oxygen supplied into the region 530bc preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and V$_O$H can be selectively removed from the region 530bc in the oxide semiconductor, whereby the region 530bc can be an i-type or substantially i-type region. Furthermore, supply of an excess amount of oxygen to the region 530ba and the region 530bb functioning as the source region and the drain region can be inhibited and the state of the n-type region before the microwave treatment is performed can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 19B, a curved surface may be provided between the side surface of the oxide 530b and the top surface of the oxide 530b in a cross-sectional view of the transistor 500 in the channel width direction. In other words, an end portion of the side surface and an end portion of the top surface may be curved (hereinafter, also referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 19B, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be fabricated.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a CVD method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1 \times 10^{13}$ Ωcm, the insulator 512, the insulator 544, and the insulator 576 can sometimes reduce charge up of the conductor 503, the conductor 542, the conductor 560, or the like in treatment using plasma or the like in the fabrication process of a semiconductor device. The resistivities of the insulator 512, the insulator 544, and the insulator 576 are preferably higher than or equal to $1 \times 10^{10}$ Ωcm and lower than or equal to $1 \times 10^{15}$ Ωcm.

The insulator 516, the insulator 574, the insulator 580, and the insulator 581 each preferably have a lower permittivity than the insulator 514. When a material with a low permittivity is used for the interlayer film, the parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

Moreover, the conductor 503b is preferably formed using a conductive material containing tungsten, copper, or aluminum as its main component. For example, tungsten is used for the conductor 503b.

The conductor 503 sometimes functions as a second gate electrode. In that case, by changing a potential applied to the conductor 503 not in conjunction with but independently of a potential applied to the conductor 560, the threshold voltage (Vth) of the transistor 500 can be controlled. In particular, Vth of the transistor 500 can be higher in the case where a negative potential is applied to the conductor 503, and the off-state current can be reduced. Thus, drain current at the time when a potential applied to the conductor 560 is 0 V can be lower in the case where a negative potential is applied to the conductor 503 than in the case where the negative potential is not applied to the conductor 503.

In the case where the oxide 530 is a highly purified intrinsic oxide and as many impurities as possible are eliminated from the oxide 530, the transistor 500 can be expected to become normally-off (the threshold voltage of the transistor 500 can be expected to higher than 0 V) in some cases with no potential application to the conductor 503 and/or the conductor 560. In that case, it is suitable to connect the conductor 560 and the conductor 503 to each other such that the same potential is supplied.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a or the conductor 542b. As illustrated in FIG. 19B, it is particularly preferable that the conductor 503 extend to a region outside end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 500 becomes normally-off and has the above-described S-channel structure, the channel formation region can be electrically surrounded. Accordingly, the transistor 500 can be regarded as having a GAA (Gate All Around) structure or an LGAA (Lateral Gate All Around) structure. When the transistor 500 has the S-channel structure, the GAA structure, or the LGAA structure, the channel formation region that is formed at the interface between the oxide 530 and the gate insulating film or in the vicinity of the interface can be formed in the entire bulk of the oxide 530. In other words, the transistor 500 having the S-channel structure, the GAA structure, or the LGAA structure can be what is called a Bulk-Flow type, in which a carrier path is used as the entire bulk. A transistor structure with a Bulk-Flow type can improve the density of current flowing in the transistor and thus can be expected to improve the on-state current of the transistor or increase the field-effect mobility of the transistor.

Furthermore, as illustrated in FIG. 19B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As scaling down and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a fabrication process of the transistor 500, heat treatment is preferably performed with a surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies ($V_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "$V_O+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b function as a source electrode and a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and the top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device, which have favorable characteristics and high reliability, can be fabricated.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 19B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_O H$ formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 19A, the insulator 552 is provided in contact with the side surfaces of the conductor 542, the insulator 544, the insulator 571, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for scaling down the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. An ALD method is a method in which deposition is performed by introducing a first source gas (also referred to as a precursor or a metal precursor) and a second source gas (also referred to as a reactant, an oxidizer, or a nonmetallic precursor) for reaction alternately into a chamber, and repeating the introduction of these source gases. As an ALD method, a thermal ALD method, in which a precursor and a reactant react with each other only by a thermal energy, a PEALD (Plasma Enhanced ALD) method, in which a reactant excited by plasma is used, and the like can be used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably provided in contact with the top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of an impurity such as water or hydrogen in the insulator 550 is preferably reduced. The lower limit of the thickness of the insulator 550 is preferably 1 nm or 0.5 nm, and the upper limit is preferably 15 nm or 20 nm. Note that the above-described lower limits and upper limits can be combined with each other. For example, the thickness of the insulator 550 is preferably greater than or equal to 0.5 nm and less than or equal to 20 nm, preferably greater than or equal to 1 nm and less than or equal to 15 nm. In that case, at least part of the insulator 550 includes a region having the above-described thickness.

Although FIG. 19A, FIG. 19B, and the like illustrate a single-layer structure of the insulator 550, the present invention is not limited to this structure, and a stacked-layer structure of two or more layers may be employed. For example, as illustrated in FIG. 20B, the insulator 550 may have a stacked-layer structure including two layers of an insulator 550a and an insulator 550b over the insulator 550a.

Figure 20B:
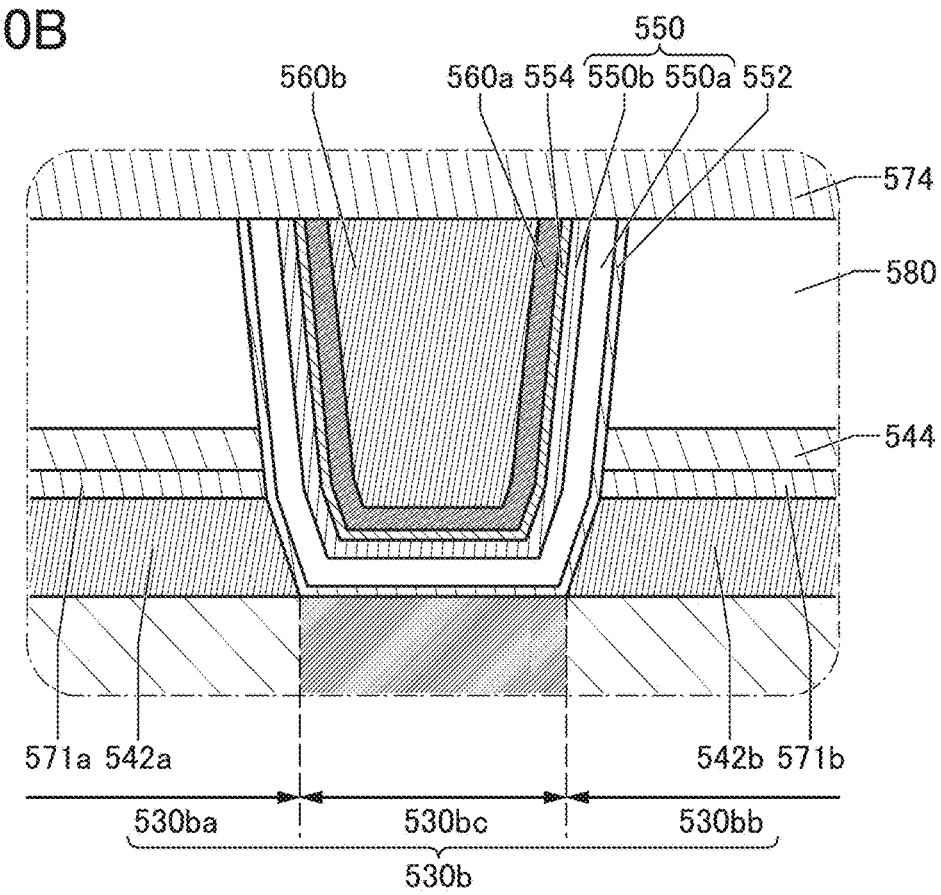

In the case where the insulator 550 has a stacked-layer structure of two layers as illustrated in FIG. 20B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that the above-described lower limits and upper limits can be combined with each other. In that case, at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably small for scaling down the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560a and the conductor 560b provided over the conductor 560a. For example, the conductor 560a is preferably provided to cover the bottom surface and the side surface of the conductor 560b. As illustrated in FIG. 19A and FIG. 19B, the top surface of the conductor 560 is substantially level with the upper portion of the insulator 550. Note that although the conductor 560 has a two-layer structure of the conductor 560a and the conductor 560b in FIG. 19A and FIG. 19B, the conductor 560 can have, besides the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 19B, in the channel width direction of the transistor 500, with reference to the bottom surface of the insulator 522, the level of the bottom surface of the conductor 560 in a region where the conductor 560 and the oxide 530b do not overlap with each other is preferably lower than the level of the bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics of the transistor 500 can be improved. The difference between the level of the bottom surface of the conductor 560 in a region where the oxide 530a and the oxide 530b do not overlap with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be fabricated.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a functioning as a plug, and the other of the first terminal and the second terminal of the transistor 500 is electrically connected to a conductor 540b. Note that the conductor 540a, the conductor 540b, and the like may function as wirings for electrical connection to the light-emitting device 150 or the like provided thereabove. In the display apparatus 100 of FIG. 17, the conductor 540a, the conductor 540b, and the like may function as wirings for electrical connection to the transistor 300 and the like. Note that in this specification and the like, the conductor 540a and the conductor 540b are collectively referred to as the conductor 540.

The conductor 540a is provided in a region overlapping with the conductor 542a, for example. Specifically, an opening portion is formed in the insulator 571a, the insulator 544, the insulator 580, the insulator 574, the insulator 576, and the insulator 581 illustrated in FIG. 19A in the region overlapping with the conductor 542a, and the conductor 540a is provided inside the opening portion. The conductor 540b is provided in a region overlapping with the conductor 542b, for example. Specifically, an opening portion is formed in the insulator 571b, the insulator 544, the insulator 580, the insulator 574, the insulator 576, and the insulator 581 illustrated in FIG. 19A in the region overlapping with the conductor 542b, and the conductor 540b is provided inside the opening portion.

As illustrated in FIG. 19A, an insulator 541a as an insulator having an impurity barrier property may be provided between the conductor 540a and the side surface of the opening portion in the region overlapping with the conductor 542a. Similarly, an insulator 541b as an insulator having an impurity barrier property may be provided between the conductor 540b and the side surface of the opening portion in the region overlapping with the conductor 542b. Note that in this specification and the like, the insulator 541a and the insulator 541b are collectively referred to as an insulator 541.

For the conductor 540a and the conductor 540b, a conductive material containing tungsten, copper, or aluminum as its main component is preferably used. The conductor 540a and the conductor 540b may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540a and the conductor 540b.

For the insulator 541a and the insulator 541b, a barrier insulating film that can be used for the insulator 544 or the like may be used. For the insulator 541a and the insulator 541b, for example, an insulator such as silicon nitride, aluminum oxide, or silicon nitride oxide may be used. Since the insulator 541a and the insulator 541b are provided in contact with the insulator 574, the insulator 576, and the insulator 571, impurities such as water and hydrogen contained in the insulator 580 or the like can be inhibited from entering the oxide 530 through the conductor 540a and the conductor 540b. In particular, silicon nitride is suitable because of its high blocking property against hydrogen. Furthermore, oxygen contained in the insulator 580 can be prevented from being absorbed by the conductor 540a and the conductor 540b.

When the insulator 541a and the insulator 541b each have a stacked-layer structure as illustrated in FIG. 19A, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers.

Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

The structure of the transistor included in the semiconductor device of one embodiment of the present invention is not limited to that of the transistor 500 illustrated in FIG. 19A and FIG. 19B. The structure of the transistor included in the semiconductor device of one embodiment of the present invention may be changed in accordance with circumstances.

An insulator 111 is provided above the transistor 500.

An insulator having a function of inhibiting diffusion of oxygen and impurities such as water and hydrogen is preferably used as the insulator 111; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 111. For example, aluminum oxide or magnesium oxide, which has a function of capturing or fixing hydrogen well, is preferably used for the insulator 111.

The insulator 111 is preferably a film with high planarity. In this case, an organic material such as an acrylic resin or a polyimide can be used for the insulator 111, for example.

The light-emitting device 150a to the light-emitting device 150c are provided above the insulator 111.

Here, the light-emitting device 150a to the light-emitting device 150c are described.

Over the insulator 111 are provided the conductor 121a to the conductor 121c functioning as respective pixel electrodes of the light-emitting device 150a to the light-emitting device 150c. In FIG. 17, a region where none of the conductor 121a to the conductor 121c is provided exists over part of the insulator 111.

The conductor 121a to the conductor 121c can be formed in such a manner that, for example, a conductive film is formed over the insulator 111 and the conductive film is subjected to a patterning step, an etching step, or the like.

The conductor 121a to the conductor 121c, respectively, function as anodes of the light-emitting device 150a, the light-emitting device 150b, and the light-emitting device 150c provided in the display apparatus 100, for example.

Indium tin oxide (sometimes referred to as ITO) or the like can be used for the conductor 121a to the conductor 121c, for example.

Each of the conductor 121a to the conductor 121c may have a stacked-layer structure of two or more layers instead of a single layer. For example, a conductor having high visible-light reflectance can be used for the first-layer conductor and a conductor having a high light-transmitting property can be used for the uppermost-layer conductor. Examples of a conductor having high visible-light reflectance include silver, aluminum, and an alloy film of silver (Ag), palladium (Pd), and copper (Cu) (Ag—Pd—Cu (APC) film). Examples of a conductor having a high light-transmitting property include indium tin oxide described above. The conductor 121a to the conductor 121c can be, for example, a stacked-layer film in which a pair of titanium films sandwich aluminum (a film in which Ti, Al, and Ti are stacked in this order), a stacked-layer film in which a pair of indium tin oxide films sandwich silver (a film in which ITO, Ag, and ITO are stacked in this order), or the like.

The insulator 112 is provided over the insulator 111, the conductor 121a, the conductor 121b, and the conductor 121c. Note that in FIG. 17, a region where the insulator 112 is not provided exists over part of the conductor 121a, part of the conductor 121b, and part of the conductor 121c. The insulator 112 can be provided in such a manner that, for example, an insulating film to be the insulator 112 is formed over the insulator 111 and the conductor 121a to the conductor 121c, and the insulating film is subjected to patterning by a photolithography method or the like to be provided with opening portions reaching the conductor 121a to the conductor 121c in part of a region overlapping with the conductor 121a to the conductor 121c.

The insulator 112 can be an inorganic film with an insulating property, for example. As the inorganic film with an insulating property, silicon oxide, silicon oxynitride, silicon nitride oxide, silicon nitride, aluminum oxide, aluminum oxynitride, aluminum nitride oxide, aluminum nitride, or the like can be used, for example.

The insulator 112 may be an organic film including an insulating layer. Examples of the organic film that can be used for the insulator 112 include polyimide.

In addition, the insulator 112 may have a multilayer structure. Specifically, for example, the insulator 112 may have a multilayer structure in which the first layer is the above-described organic film and the second layer is the above-described inorganic film.

The EL layer 141a is provided over the insulator 112 and the conductor 121a. The EL layer 141b is provided over the insulator 112 and the conductor 121b. The EL layer 141c is provided over the insulator 112 and the conductor 121c. Note that in FIG. 17, a region where the EL layer 141a to the EL layer 141c are not provided exists over part of the insulator 112.

The EL layer 141a to the EL layer 141c preferably include light-emitting layers emitting light of different colors from one another. For example, the EL layer 141a can include a blue (B)-light-emitting layer, the EL layer 141b can include a green (G)-light-emitting layer, and the EL layer 141c can include a red (R)-light-emitting layer. The display apparatus 100 may have such a structure (SBS structure) in which light-emitting layers for respective colors are provided over a plurality of pixel electrodes (the conductor 121a to the conductor 121c).

Note that the combination of colors of light emitted by the light-emitting layers included in the EL layer 141a to the EL layer 141c is not limited to the above, and a color such as cyan, magenta, or yellow may also be used, for example. The number of colors of light emitted by the light-emitting devices 150 included in the display apparatus 100, which is three in the above example, may be two or four or more.

The EL layer 141a, the EL layer 141b, and the EL layer 141c may each include one or more of an electron-injection layer, an electron-transport layer, a hole-injection layer, and a hole-transport layer in addition to a layer containing a light-emitting organic compound (light-emitting layer).

The EL layer 141a, the EL layer 141b, and the EL layer 141c can be formed, for example, by an evaporation method (a vacuum evaporation method or the like), a coating method (a dip coating method, a die coating method, a bar coating method, a spin coating method, a spray coating method, or the like), a printing method (an ink-jet method, a screen printing (stencil) method, an offset printing (planography) method, a flexography (relief printing) method, a gravure printing method, a micro-contact printing method, or the like), or the like.

In the case where a deposition method such as the coating method or the printing method is employed, a high-molecular compound (e.g., an oligomer, a dendrimer, or a polymer), a middle-molecular compound (a compound between a low-molecular compound and a high-molecular compound with a molecular weight of 400 to 4000), an inorganic compound (e.g., a quantum dot material), or the like can be used. Note that as the quantum dot material, a colloidal quantum dot material, an alloyed quantum dot material, a core-shell quantum dot material, a core quantum dot material, or the like can be used.

Figure 21A:
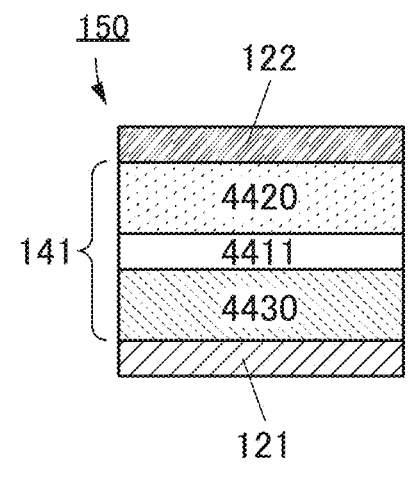
FIG. 21A to FIG. 21C are schematic diagrams illustrating structure examples of a light-emitting device.

Like the light-emitting device 150 illustrated in FIG. 21A, the light-emitting device 150a to the light-emitting device 150c in FIG. 17 can include a plurality of layers such as a layer 4420, a light-emitting layer 4411, and a layer 4430, for example.

The layer 4420 can include, for example, a layer containing a substance with a high electron-injection property (electron-injection layer) and a layer containing a substance with a high electron-transport property (electron-transport layer). The light-emitting layer 4411 contains a light-emitting compound, for example. The layer 4430 can include, for example, a layer containing a substance with a high hole-injection property (hole-injection layer) and a layer containing a substance with a high hole-transport property (hole-transport layer).

The structure including the layer 4420, the light-emitting layer 4411, and the layer 4430, which is provided between a pair of electrodes (the conductor 121 and a later-described conductor 122), can function as a single light-emitting unit, and the structure in FIG. 21A is referred to as a single structure in this specification and the like.

Figure 21B:
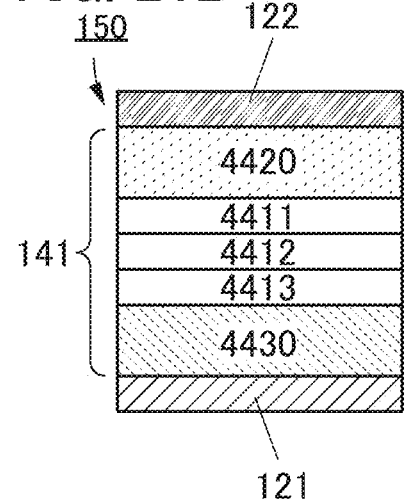

Note that the structure in which a plurality of light-emitting layers (the light-emitting layer 4411, a light-emitting layer 4412, and a light-emitting layer 4413) are provided between the layer 4420 and the layer 4430 as illustrated in FIG. 21B is also a variation of the single structure.

Figure 21C:
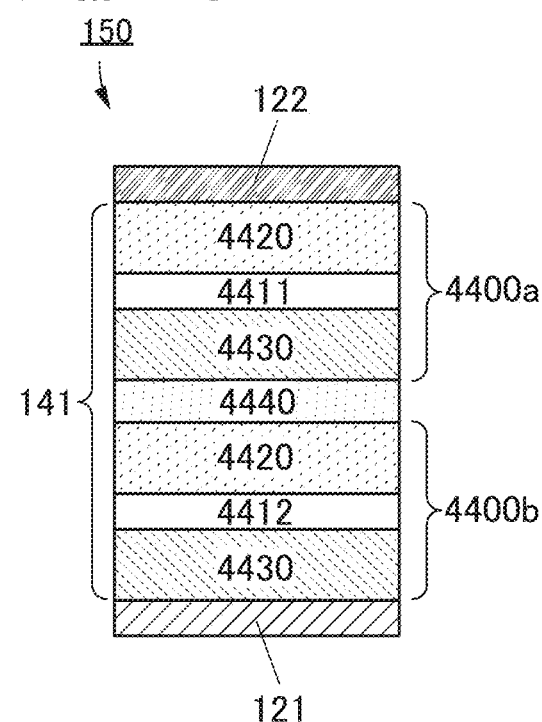

A stack including a plurality of layers such as the layer 4420, the light-emitting layer 4411, and the layer 4430 is sometimes referred to as a light-emitting unit. A plurality of light-emitting units can be connected in series with an intermediate layer (a charge-generation layer) therebetween. Specifically, a light-emitting unit 4400a and a light-emitting unit 4400b, which are the plurality of light-emitting units, can be connected in series with an intermediate layer (charge-generation layer) 4440 therebetween as illustrated in FIG. 21C. Such a structure is referred to as a tandem structure in this specification. A tandem structure may be rephrased as, for example, a stack structure in this specification and the like. The tandem structure enables a light-emitting device capable of high luminance light emission. By having a tandem structure, a light-emitting device presumably has increased emission efficiency and an extended lifetime. In the case where the light-emitting device 150 of the display apparatus 100 in FIG. 17 has a tandem structure, the EL layer 141 can include, for example, the layer 4420, the light-emitting layer 4411, and the layer 4430 that are included in the light-emitting unit 4400a, an intermediate layer 4440, and the layer 4420, the light-emitting layer 4412, and the layer 4430 that are included in the light-emitting unit 4400b.

In the case where the above-described single structure, tandem structure, and SBS structure are compared with each other, the SBS structure, the tandem structure, and the single structure have lower power consumption in this order. To reduce power consumption, the SBS structure is preferably used. Meanwhile, the single structure and the tandem structure are preferable in that the manufacturing cost is low or the manufacturing yield is high because the manufacturing processes of the single structure and the tandem structure are simpler than that of the SBS structure.

The emission color of the light-emitting device 150 can be red, green, blue, cyan, magenta, yellow, white, or the like depending on the material that constitutes the EL layer 141. Furthermore, the color purity can be further increased when the light-emitting device 150 has a microcavity structure.

The light-emitting element that emits white light preferably contains two or more kinds of light-emitting substances in the light-emitting layer. To obtain white light emission, two or more kinds of light-emitting substances are selected such that their emission colors are complementary colors.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

As illustrated in FIG. 17, there is a gap between the EL layers of two light-emitting devices of different colors. In this manner, the EL layer 141a, the EL layer 141b, and the EL layer 141c are preferably provided so as not to be in contact with one another. This suitably prevents unintentional light emission (also referred to as crosstalk) from being caused by a current flowing through two adjacent EL layers. As a result, the contrast can be increased to achieve a display apparatus with high display quality.

As the formation method of the EL layer 141a to the EL layer 141c, a method with photolithography can be given. For example, the EL layer 141a to the EL layer 141c can be formed in such a manner that an EL film to be the EL layer 141a to the EL layer 141c is formed over the insulator 111 and the conductor 121 and then subjected to patterning by a photolithography method. Alternatively, the EL layer 141a to the EL layer 141c may be formed in such a manner that the conductor 122 is formed over the EL film and both the conductor 122 and the EL film are subjected to patterning by a photolithography method. In this case, the EL layer 141a to the EL layer 141c have the same structure. Accordingly, in order that the display apparatus 100 employing the above formation method can carry out color display, the light-emitting device 150a to the light-emitting device 150c respectively including the EL layer 141a to the EL layer 141c emit white light and the white light is extracted to the outside through coloring layers (color filters).

Alternatively, the EL layer 141a to the EL layer 141c are formed in the following manner: an EL film to be the EL layer 141a is formed over the insulator 111 and the conductor 121 and processed by a photolithography method to form the EL layer 141a. Then, the EL layer 141b and the EL layer 141c are formed in the predetermined regions by the same steps. The EL layer 141a to the EL layer 141c formed by this method can have different structures, enabling the display apparatus 100 to have the SBS structure.

When the above method is employed, the gap between pixels can be short. As a result, the number of pixels included in the display portion can be large, increasing the definition of the display apparatus. The gap between the pixels is preferably less than or equal to 5 μm, further preferably less than or equal to 1 μm.

Other than a photolithography method, a nanoimprint method, a lift-off method, or the like may be employed in the formation of the EL layer 141a to the EL layer 141c. Alternatively, island-shaped thin films may be directly formed by a deposition method using a shielding mask such as a metal mask.

The conductor 122 is provided over the insulator 112, the EL layer 141a, the EL layer 141b, and the EL layer 141c. An insulator 113 is provided over the conductor 122.

The conductor 122 functions as, for example, a common electrode for each of the light-emitting device 150a to the light-emitting device 150c. The conductor 122 preferably contains a conductive material having a light-transmitting property so that light emitted by the light-emitting device 150 can be extracted to above the display apparatus 100.

The conductor 122 is preferably a light-transmitting and light-reflective material having high conductivity (sometimes referred to as a transflective electrode). For example, an alloy of silver and magnesium, or indium tin oxide can be used as the conductor 122.

The insulator 113 functions as, for example, a passivation film that protects the light-emitting device 150a, the light-emitting device 150b, and the light-emitting device 150c. Thus, the insulator 113 is preferably formed using a material that prevents entry of water and the like. Any of the materials that can be used as the insulator 111 can be used as the insulator 113, for example. Specifically, aluminum oxide, silicon nitride, silicon nitride oxide, or the like can be used.

A resin layer 161 is provided over the insulator 113. A substrate 102 is provided over the resin layer 161.

As the substrate 102, a substrate having a light-transmitting property is preferably used, for example. Using a light-transmitting substrate as the substrate 102 enables extraction of light emitted from the light-emitting device 150a, the light-emitting device 150b, and the light-emitting device 150c to above the substrate 102.

The display apparatus 100 in FIG. 17 formed in the above-described manner can have a definition preferably higher than or equal to 1000 ppi, further preferably higher than or equal to 3000 ppi, still further preferably higher than or equal to 5000 ppi.

<Sealing Structure Example of Display Apparatus>

Next, a sealing structure for the light-emitting device 150a to the light-emitting device 150c applicable to the display apparatus 100 in FIG. 17 is described.

Figure 22A:
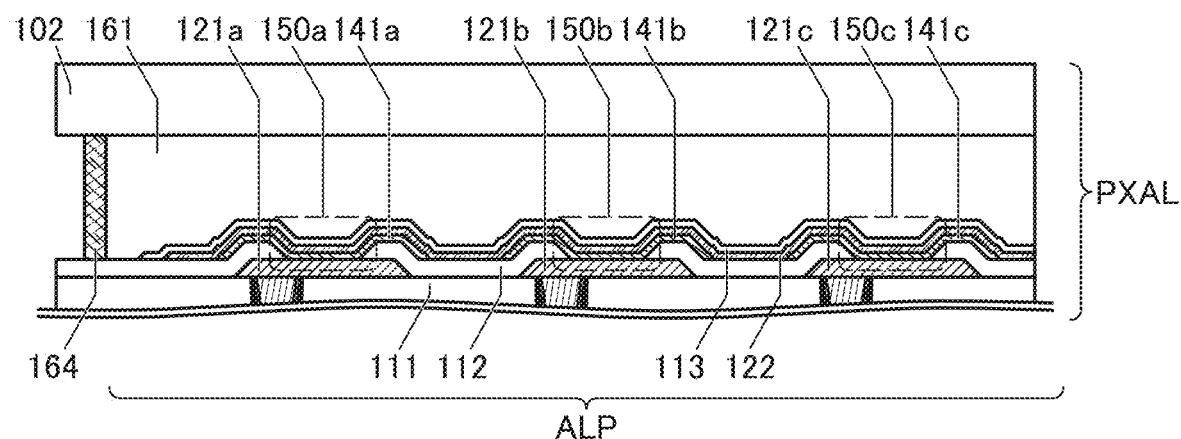
FIG. 22A and FIG. 22B are schematic cross-sectional views illustrating structure examples of a display apparatus.

FIG. 22A is a cross-sectional view of an example of a sealing structure applicable to the display apparatus 100 in FIG. 17. Specifically, FIG. 22A illustrates an end portion of the pixel array ALP of the display apparatus 100 in FIG. 17 and components provided around the end portion. FIG. 22A selectively illustrates only part of the pixel layer PXAL of the display apparatus 100. Specifically, FIG. 22A illustrates the insulator 111, a plug connected to the transistor 500, and insulators, conductors, the light-emitting device 150a to the light-emitting device 150c, and the like that are positioned above the insulator 111.

In the display apparatus 100 in FIG. 22A, an adhesive layer 164 is provided at or around the end portion of the pixel array ALP. Specifically, the display apparatus 100 is fabricated such that the insulator 112 and the substrate 102 are bonded to each other with the adhesive layer 164.

The adhesive layer 164 is preferably formed using, for example, a material inhibiting transmission of an impurity such as moisture. Using the material for the adhesive layer 164 can increase the reliability of the display apparatus 100.

The structure in which the adhesive layer 164 is used to bond the insulator 112 and the substrate 102 with the resin layer 161 positioned between the insulator 112 and the substrate 102 is sometimes referred to as a solid sealing structure. In the case where the resin layer 161 in the solid sealing structure has a function of bonding the insulator 112 and the substrate 102 like the adhesive layer 164, the adhesive layer 164 is not necessarily provided.

A structure in which the adhesive layer 164 is used to bond the insulator 112 and the substrate 102 with not the resin layer 161 but an inert gas filling the space between the insulator 112 and the substrate 102 is sometimes referred to as a hollow sealing structure (not shown). Examples of an inert gas include nitrogen and argon.

Figure 22B:
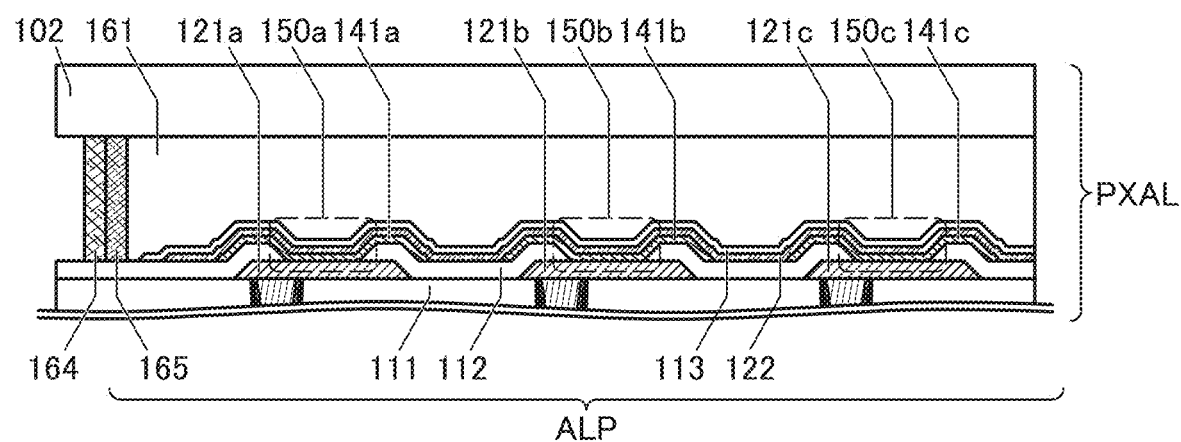

In the sealing structure of the display apparatus 100 illustrated in FIG. 22A, two or more overlapping adhesive layers may be used. For example, as illustrated in FIG. 22B, an adhesive layer 165 may be provided inward from the adhesive layer 164 (may be provided between the adhesive layer 164 and the resin layer 161). Two or more overlapping adhesive layers can inhibit transmission of an impurity such as moisture more, further increasing the reliability of the display apparatus 100.

A desiccant may be mixed into the adhesive layer 165. In this case, the desiccant adsorbs moisture contained in the resin layer 161, insulators, conductors, EL layers, and the like that are provided inward from the adhesive layer 164 and the adhesive layer 165, increasing the reliability of the display apparatus 100.

Although the solid sealing structure of the display apparatus 100 is illustrated in FIG. 22B, a hollow sealing structure may be employed.

Furthermore, in each of the sealing structures of the display apparatus 100 in FIG. 22A and FIG. 22B, the resin layer 161 filling the space may be replaced with an inert liquid. Examples of the inert liquid include a fluorine-based inert liquid.

<Modification Example of Display Apparatus>

One embodiment of the present invention is not limited to the above-described structure, and the above-described structure can be changed as appropriate in accordance with the situation. A modification example of the display apparatus 100 in FIG. 17 is described with reference to FIG. 23A to FIG. 24D. Note that FIG. 23A to FIG. 24D selectively illustrate only part of the pixel layer PXAL of the display apparatus 100. Specifically, each of FIG. 23A to FIG. 24D illustrates the insulator 111, a plug connected to the transistor 500, and insulators, conductors, the light-emitting device 150a to the light-emitting device 150c, and the like that are positioned above the insulator 111.

The display apparatus 100 may have a structure in which the number of colors of light emitted by the light-emitting devices 150 is two, for example. Moreover, the display apparatus 100 may have a structure in which the number of colors of light emitted by the light-emitting devices 150 is four or more, for example (not illustrated).

Figure 23A:
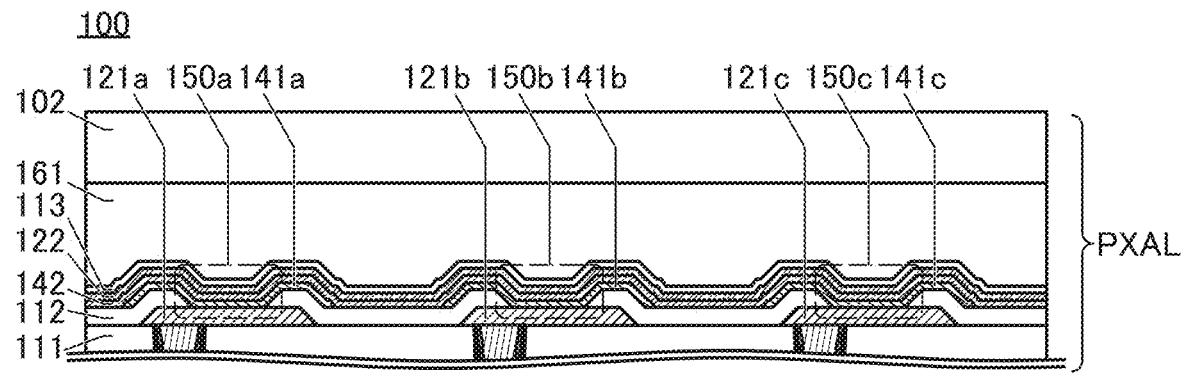
FIG. 23A to FIG. 23C are schematic cross-sectional views illustrating structure examples of a display apparatus.

The display apparatus 100 may have a structure in which, for example, an EL layer 142 is provided over the EL layer 141a to the EL layer 141c and the insulator 112 as illustrated in FIG. 23A. Specifically, for example, in FIG. 23A, the EL layer 142 can include the layer 4420 illustrated in FIG. 21A when the EL layer 141a to the EL layer 141c each include the layer 4430 and the light-emitting layer 4411 illustrated in FIG. 21A. In this case, the layer 4420 included in the EL layer 142 functions as a common layer shared by the light-emitting device 150a to the light-emitting device 150c. In a similar manner, for another example, in FIG. 23B, the EL layer 142 can include the layer 4420 when the EL layer 141a to the EL layer 141c each include the layer 4430 and the light-emitting layer 4411, in which case the layer 4420 included in the EL layer 142 functions as a common layer shared by the light-emitting device 150a to the light-emitting device 150c. For another example, in FIG. 23C, the EL layer 142 can include the layer 4420 of the light-emitting unit 4400a when the EL layer 141a to the EL layer 141c each include the layer 4430, the light-emitting layer 4412, and the layer 4420 that are included in the light-emitting unit 4400b, the intermediate layer 4440, and the layer 4430 and the light-emitting layer 4411 that are included in the light-emitting unit 4400a, as illustrated in FIG. 21A, in which case the layer 4420 of the light-emitting unit 4400a included in the EL layer 142 functions as a common layer shared by the light-emitting device 150a to the light-emitting devices 150c.

Figure 23B:
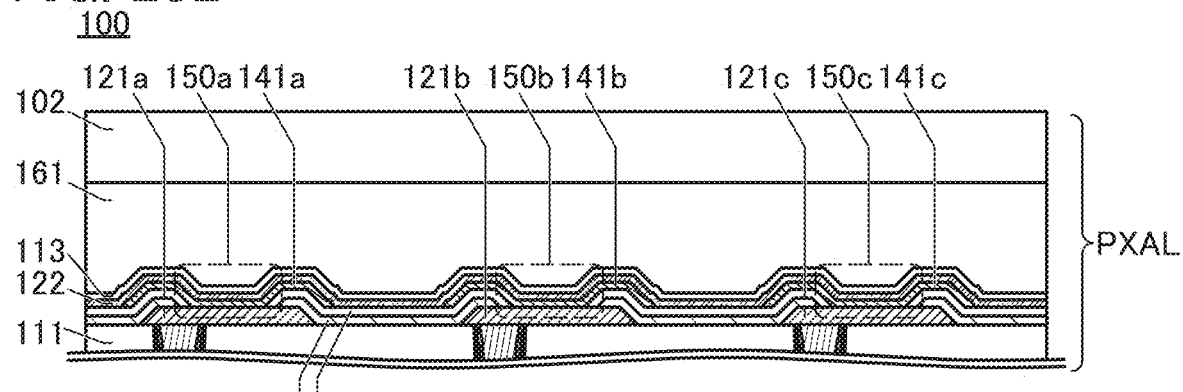

In the structure of the display apparatus 100, for example, the insulator 112 may have a multilayer structure that includes an insulator made of an organic material as the first layer and an insulator made of an inorganic material as the second layer, as described above. As an example, FIG. 23B illustrates a cross-sectional view of part of the display apparatus 100 in which the insulator 112 has a multilayer structure including an insulator 112a that is an insulator made of an organic material and an insulator 112b that is an insulator made of an inorganic material.

The organic material can be, for example, a polyimide or the like, and the inorganic material can be any of the materials usable for the insulator 112 of the display apparatus 100 in FIG. 17 and the like.

Figure 23C:
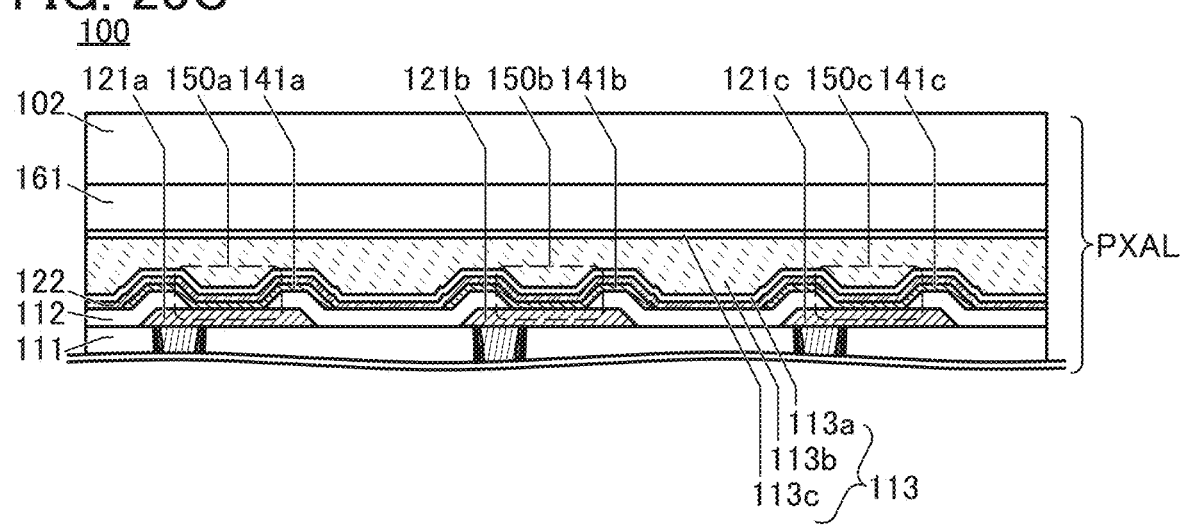

In the structure of the display apparatus 100, for example, the insulator 113 may have a stacked-layer structure including two or more layers, instead of a single layer. The insulator 113 may have a three-layer structure that includes an insulator made of an inorganic material as the first layer, an insulator made of an organic material as the second layer, and an insulator made of an inorganic material as the third layer. FIG. 23C illustrates a cross-sectional view of part of the display apparatus 100 in which the insulator 113 has a multilayer structure including an insulator 113a that is an insulator made of an inorganic material, an insulator 113b that is an insulator made of an organic material, and an insulator 113c that is an insulator made of an inorganic material.

In the structure of the display apparatus 100, for example, the EL layer 141a to the EL layer 141c may be each provided with a microcavity structure. In the microcavity structure, for example, the conductor 122 as an upper electrode (common electrode) is formed using a light-transmitting and light-reflective conductive material, the conductor 121 as a lower electrode (pixel electrode) is formed using a light-reflective conductive material, and the distance between a bottom surface of the light-emitting layer and a top surface of the lower electrode, i.e., the thickness of the layer 4430 in FIG. 21A, is set to the thickness corresponding to the wavelength of the color of light emitted by the light-emitting layer included in the EL layer 141.

For example, light that is reflected back by the lower electrode (reflected light) considerably interferes with light that directly enters the upper electrode from the light-emitting layer (incident light). For this reason, the optical length between the lower electrode and the light-emitting layer is preferably adjusted to $(2n-1)\lambda/4$ (n is a natural number of 1 or larger and $\lambda$ is a wavelength of light to be amplified). By adjusting the optical length, the phases of the reflected light and the incident light having the wavelength k can be aligned with each other and the light emitted from the light-emitting layer can be further amplified. In the case where the reflected light and the incident light have a wavelength other than the wavelength k, their phases are not aligned with each other, resulting in attenuation without resonation.

In the above-described structure, the EL layer may include a plurality of light-emitting layers or a single light-emitting layer. Furthermore, for example, the combination with the aforementioned tandem light-emitting device structure is possible; specifically, the above-described structure can be applied to a structure in which one light-emitting device includes a plurality of EL layers sandwiching a charge-generation layer and each EL layer includes one or more light-emitting layers.

With the microcavity structure, emission intensity with a specific wavelength in the front direction can be increased, whereby power consumption can be reduced. Particularly in the case of a device for XR such as VR and AR, light emitted from the light-emitting device in the front direction often enters the eyes of the user wearing the device; thus, a display apparatus of a device for XR preferably includes a microcavity structure. Note that in the case of a display apparatus which displays images with subpixels of four colors, red, yellow, green, and blue, the display apparatus can have favorable characteristics because a microcavity structure suitable for wavelengths of the corresponding colors can be employed in each subpixel, in addition to the effect of an improvement in luminance owing to yellow light emission.

Figure 24A:
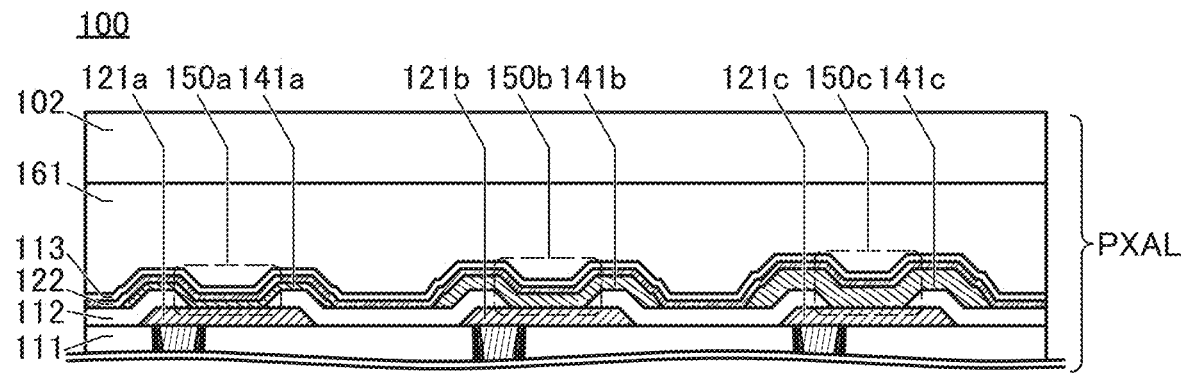
FIG. 24A to FIG. 24D are schematic cross-sectional views illustrating structure examples of a display apparatus.

As an example, FIG. 24A illustrates a cross-sectional view of part of the display apparatus 100 including a microcavity structure. In the case where the light-emitting device 150a includes a blue (B)-light-emitting layer, the light-emitting device 150b includes a green (G)-light-emitting layer, and the light-emitting device 150c includes a red (R)-light-emitting layer, it is preferable that the EL layer 141a have the smallest thickness, the EL layer 141b have the second largest thickness, and the EL layer 141c have the largest thickness as illustrated in FIG. 24A. Specifically, the thicknesses of the layers 4430 included in the EL layer 141a, the EL layer 141b, and the EL layer 141c are determined depending on the color of the light emitted by the corresponding light-emitting layer. In this case, the layer 4430 included in the EL layer 141a has the smallest thickness and the layer 4430 included in the EL layer 141c has the largest thickness.

Figure 24B:
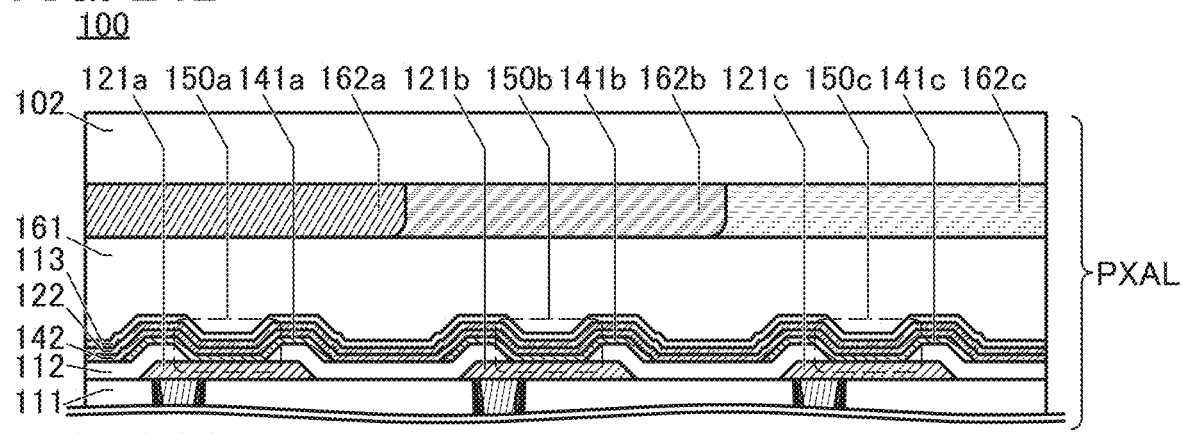

In the structure of the display apparatus 100, for example, a coloring layer (color filter) or the like may be provided. As an example, FIG. 24B illustrates a structure in which a coloring layer 162a, a coloring layer 162b, and a coloring layer 162c are included between the resin layer 161 and the substrate 102. Note that the coloring layer 162a to the coloring layer 162c can be formed on the substrate 102, for example. In the case where the light-emitting device 150a includes a blue (B)-light-emitting layer, the light-emitting device 150b includes a green (G)-light-emitting layer, and the light-emitting device 150c includes a red (R)-light-emitting layer, the coloring layer 162a is a blue coloring layer, the coloring layer 162b is a green coloring layer, and the coloring layer 162c is a red coloring layer.

The display apparatus 100 illustrated in FIG. 24B can be fabricated in such a manner that the substrate 102 provided with the coloring layer 162a to the coloring layer 162c and the substrate 310 over which components up to the light-emitting device 150a to the light-emitting device 150c are formed are bonded to each other with the resin layer 161 therebetween. This bonding is preferably performed such that the light-emitting device 150a and the coloring layer 162a overlap with each other, the light-emitting device 150b and the coloring layer 162b overlap with each other, and the light-emitting device 150c and the coloring layer 162c overlap with each other. In the display apparatus 100 provided with the coloring layer 162a to the coloring layer 162c, for example, the light emitted by the light-emitting device 150b is extracted to above the substrate 102 not through the coloring layer 162a or the coloring layer 162c but through the coloring layer 162b. That is, light emitted from the light-emitting device 150 in an oblique direction (a direction at an elevation angle with a top surface of the substrate 102 used as a horizontal plane) can be blocked in the display apparatus 100; thus, the viewing angle dependence of the display apparatus 100 can be reduced, inhibiting the display quality of an image displayed by the display apparatus 100 from decreasing when the image is viewed from an oblique direction.

The coloring layer 162a to the coloring layer 162c formed on the substrate 102 may be covered with, for example, a resin which is also referred to as an overcoat layer. Specifically, the resin layer 161, the overcoat layer, the coloring layer 162a to the coloring layer 162c, and the substrate 102 may be stacked in this order in the display apparatus 100 (not illustrated). Note that examples of the resin usable for the overcoat layer include a thermosetting material that has a light-transmitting property and is based on an acrylic or epoxy resin.

In the structure of the display apparatus 100, for example, a black matrix may be included in addition to the coloring layers (not illustrated). The black matrix between the coloring layer 162a and the coloring layer 162b, between the coloring layer 162b and the coloring layer 162c, and between the coloring layer 162c and the coloring layer 162a can block more light emitted from the light-emitting device 150 in an oblique direction (a direction at an elevation angle with the top surface of the substrate 102 used as a horizontal plane) in the display apparatus 100; thus, the display quality of an image displayed by the display apparatus 100 can be more prevented from decreasing when the image is viewed from an oblique direction.

In the case where the display apparatus includes coloring layers as illustrated in FIG. 24B or the like, the light-emitting device 150a to the light-emitting device 150c of the display apparatus may each be a white-light-emitting device (not shown). The structure of the light-emitting device can be a single structure or a tandem structure, for example.

Figure 24C:
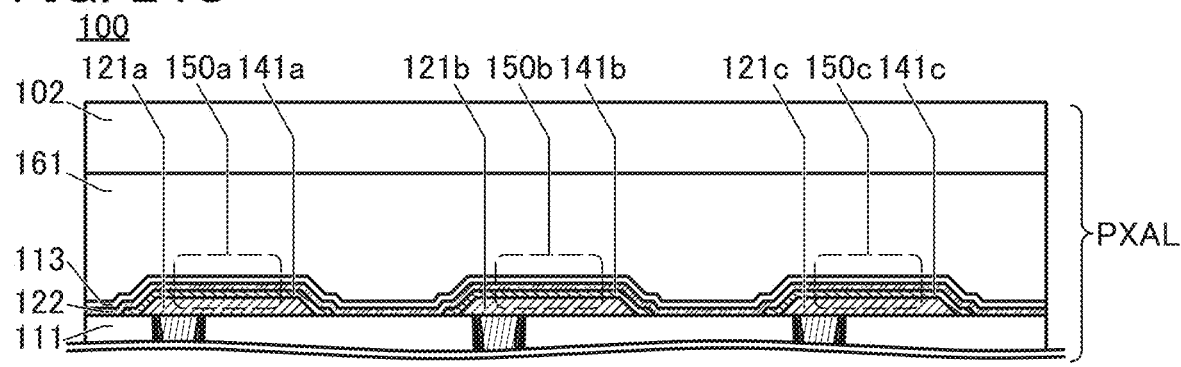
Figure 24D:
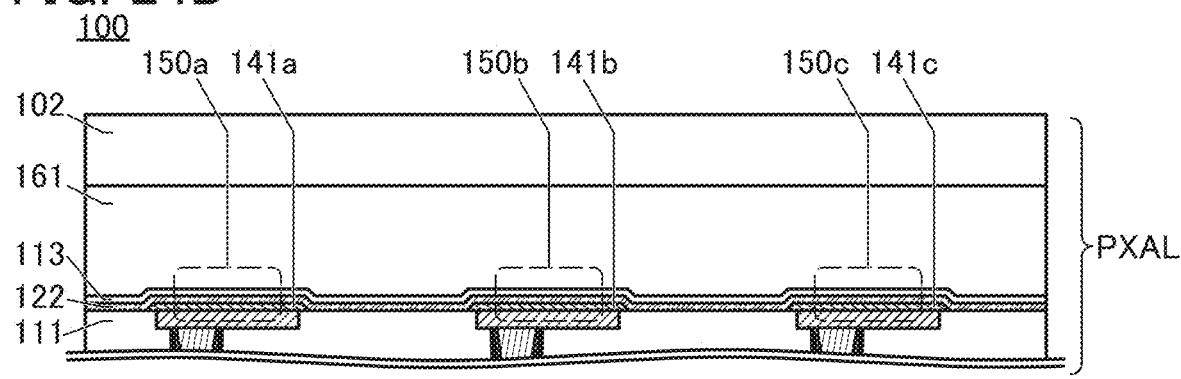

The display apparatus 100 may have a structure in which the insulator 112 is not provided over the conductor 121a to the conductor 121c, for example. FIG. 24C illustrates a structure example in which the insulator 112 is not provided in the display apparatus 100 in FIG. 17 or the like. Furthermore, the display apparatus 100 may have a structure in which the conductor 121a to the conductor 121c are embedded in the insulator 111, for example. FIG. 24D illustrates a structure example of the display apparatus in which the conductor 121a to the conductor 121c are embedded in the insulator 111. Note that this structure can be fabricated in such a manner that, for example, opening portions in which the conductor 121a to the conductor 121c are to be embedded are formed in the insulator 111, a conductive film to be the conductor 121a to the conductor 121c is formed, and then, chemical mechanical polishing (CMP) is performed until the insulator 111 is exposed.

In the above-described structure of the display apparatus 100, the conductor 121a to the conductor 121c serve as the anodes and the conductor 122 serves as the cathode; however, the display apparatus 100 may have a structure in which the conductor 121a to the conductor 121c serve as cathodes and the conductor 122 serves as an anode. In other words, in the above-described manufacturing process, the stacking order of the hole-injection layer, hole-transport layer, light-emitting layer, electron-transport layer, and electron-injection layer that are included in the EL layer 141a to the EL layer 141c and the EL layer 142 can be reversed.

Note that the insulators, the conductors, the semiconductors, and the like disclosed in this specification and the like can be formed by a PVD (Physical Vapor Deposition) method or a CVD method. Examples of a PVD method include a sputtering method, a resistance heating evaporation method, an electron beam evaporation method, and a PLD method. The formation by a plasma CVD method or a thermal CVD method, or the like can be given as a CVD method. As examples of the thermal CVD method, a MOCVD (Metal Organic Chemical Vapor Deposition) method, an ALD method, and the like can be particularly given.

A thermal CVD method, which is a deposition method not using plasma, has an advantage that no defect due to plasma damage is generated.

Deposition by a thermal CVD method may be performed in such a manner that a source gas and an oxidizer are supplied into a chamber at a time, the pressure in the chamber is set to an atmospheric pressure or a reduced pressure, and they are made to react with each other in the vicinity of the substrate or over the substrate to be deposited over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (argon, nitrogen, or the like) or the like is introduced at the same time as or after introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to deposit a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, so that a thin film with excellent step coverage can be formed. The thickness of the thin film can be adjusted by the number of repetition times of the sequence of the gas introduction; therefore, an ALD method makes it possible to accurately adjust film thickness and is thus suitable for manufacturing a minute FET.

A variety of films such as the metal film, the semiconductor film, and the inorganic insulating film disclosed in the above-described embodiments can be formed by a thermal CVD method such as an MOCVD method or an ALD method; for example, in the case of forming an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can also be used instead of trimethylgallium, and diethylzinc ($Zn(C_2H_5)_2$) can also be used instead of dimethylzinc.

For example, in the case where a hafnium oxide film is formed with a deposition apparatus utilizing ALD, two kinds of gases, ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH, $Hf[N(CH_3)_2]_4$)), are used. Examples of another material include tetrakis(ethylmethylamide)hafnium.

For example, in the case where an aluminum oxide film is formed by a deposition apparatus utilizing ALD, two kinds of gases, $H_2O$ as an oxidizer and a source gas that is obtained by vaporizing liquid containing a solvent and an aluminum precursor compound (trimethylaluminum (TMA, $Al(CH_3)_3$) or the like) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus utilizing ALD, hexachlorodisilane is adsorbed on a surface on which a film is to be formed, and radicals of an oxidizing gas ($O_2$ or dinitrogen monoxide) are supplied to react with the adsorbate.

For example, in the case where a tungsten film is deposited by a deposition apparatus utilizing ALD, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that an $SiH_4$ gas may be used instead of a $B_2H_6$ gas.

In the case where an In—Ga—Zn—O film is formed as an oxide semiconductor film with a deposition apparatus utilizing ALD, a precursor (sometimes called a metal precursor or the like) and an oxidizer (sometimes called a reactant, a non-metal precursor, or the like) are sequentially and repetitively introduced. Specifically, for example, an $In(CH_3)_3$ gas as a precursor and an $O_3$ gas) as an oxidizer are introduced to form an In—O layer; a $Ga(CH_3)_3$ gas as a precursor and an $O_3$ gas) as an oxidizer are introduced to form a GaO layer; and then, a $Zn(CH_3)_2$ gas as a precursor and an $O_3$ gas) as an oxidizer are introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas which is obtained by bubbling water with an inert gas such as Ar may be used instead of an $O_3$ gas), it is preferable to use an $O_3$ gas) which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used.

The aspect ratio of a display portion of the display apparatus of one embodiment of the present invention is not particularly limited. For example, the display apparatus is compatible with a variety of screen ratios such as 1:1 (a square), 3:4, 16:9, and 16:10.

The shape of the display apparatus of one embodiment of the present invention is not particularly limited. The display apparatus can have any of various shapes such as a rectangular shape, a polygonal shape (e.g., octagon), a circular shape, and an elliptical shape.

Note that this embodiment can be combined with any of the other embodiments described in this specification as appropriate.

Embodiment 4

Described in this embodiment is a metal oxide (hereinafter, also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor is described with reference to FIG. 25A. FIG. 25A is a diagram showing the classification of crystal structures of an oxide semiconductor, typically IGZO (a metal oxide containing In, Ga, and Zn).

As shown in FIG. 25A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 25A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 25B shows an XRD spectrum, which is obtained by GIXD (Grazing-Incidence XRD) measurement, of a CAAC-IGZO film classified into "Crystalline" (the horizontal axis represents 2θ [deg.] and the vertical axis represents intensity in arbitrary unit (a.u.)). Note that a GIXD method is also referred to as a thin film method or a Seemann-Bohlin method. The XRD spectrum that is shown in FIG. 25B and obtained by GIXD measurement may be hereinafter simply referred to as an XRD spectrum. The CAAC-IGZO film in FIG. 25B has a composition in the neighborhood of In:Ga:Zn=4:2:3 [atomic ratio]. The CAAC-IGZO film in FIG. 25B has a thickness of 500 nm.

As shown in FIG. 25B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 25B, the peak at 2θ of around 31° is asymmetric with respect to the axis of the angle at which the peak intensity (Intensity) is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 25C shows a diffraction pattern of the CAAC-IGZO film. FIG. 25C shows a diffraction pattern obtained by the NBED in which an electron beam is incident in the direction parallel to the substrate. The composition of the CAAC-IGZO film in FIG. 25C is In:Ga:Zn=4:2:3 [atomic ratio] or the neighborhood thereof. In the nanobeam electron diffraction method, electron diffraction is performed with a probe diameter of 1 nm.

As shown in FIG. 25C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 25A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities, defects (e.g., oxygen vacancies), and the like. Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility (p), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments described in this specification as appropriate.

Embodiment 5

In this embodiment, an example of a head-mounted display including a display apparatus is described as an example of an electronic device of one embodiment of the present invention.

Figure 26A:
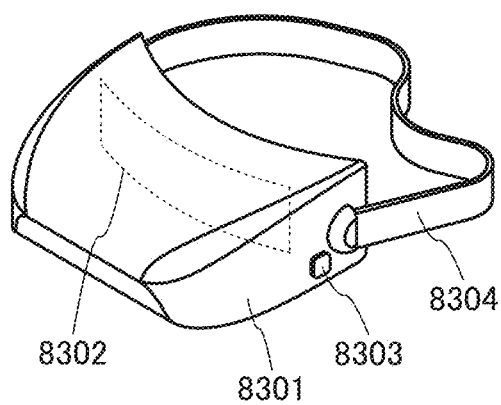
FIG. 26A to FIG. 26F are diagrams illustrating structure examples of electronic devices.
Figure 26B:
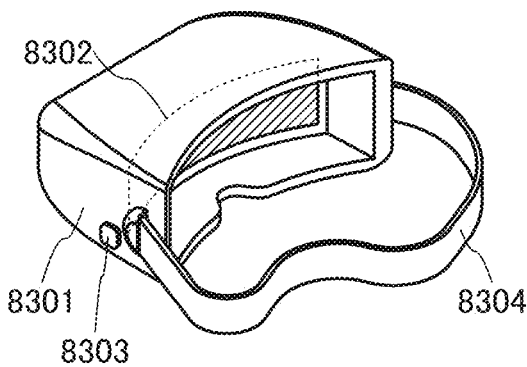

FIG. 26A and FIG. 26B illustrate appearance of a head-mounted display 8300.

The head-mounted display 8300 includes a housing 8301, a display portion 8302, an operation button 8303, and a band-shaped fixing unit 8304.

The operation button 8303 has a function of a power button or the like. The head-mounted display 8300 may include a button other than the operation button 8303.

Figure 26C:
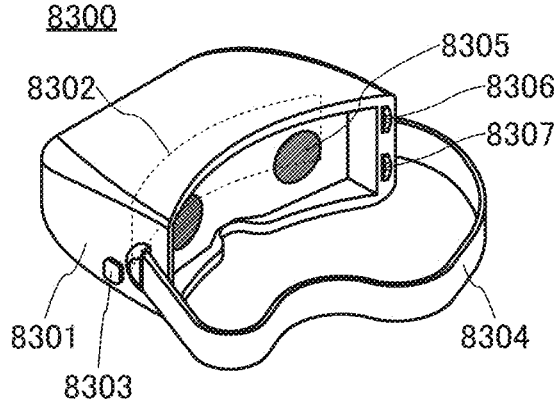

As illustrated in FIG. 26C, lenses 8305 may be provided between the display portion 8302 and the user's eyes. The user can see magnified images on the display portion 8302 through the lenses 8305, leading to a higher realistic sensation. In that case, as illustrated in FIG. 26C, a dial 8306 for changing the position of the lenses and adjusting visibility may be included.

The display portion 8302 can use the display apparatus of one embodiment of the present invention. The display apparatus of one embodiment of the present invention has an extremely high resolution; thus, even when an image is magnified using the lenses 8305 as in FIG. 26C, the user does not perceive pixels, and a more realistic image can be displayed.

FIG. 26A to FIG. 26C each illustrate an example in which one display portion 8302 is provided. This structure can reduce the number of components.

The display portion 8302 can display an image for the right eye and an image for the left eye side by side on a right region and a left region, respectively. Thus, a three-dimensional image using binocular disparity can be displayed.

One image which can be seen by both eyes may be displayed on the entire display portion 8302. A panorama image can thus be displayed from end to end of the field of view, which can provide a higher sense of reality.

Here, the head-mounted display 8300 preferably has a mechanism for changing the curvature of the display portion 8302 to an optimal value in accordance with the size of the user's head, the position of the user's eyes, or the like. For example, the user himself/herself may adjust the curvature of the display portion 8302 by operating a dial 8307 for adjusting the curvature of the display portion 8302. Alternatively, a sensor for detecting the size of the user's head, the position of the user's eyes, or the like (e.g., a camera, a contact sensor, and a noncontact sensor) may be provided on the housing 8301, and a mechanism for adjusting the curvature of the display portion 8302 on the basis of data detected by the sensor may be provided.

In the case where the lenses 8305 are used, a mechanism for adjusting the position and angle of the lenses 8305 in synchronization with the curvature of the display portion 8302 is preferably provided. Alternatively, the dial 8306 may have a function of adjusting the angle of the lenses.

Figure 26D:
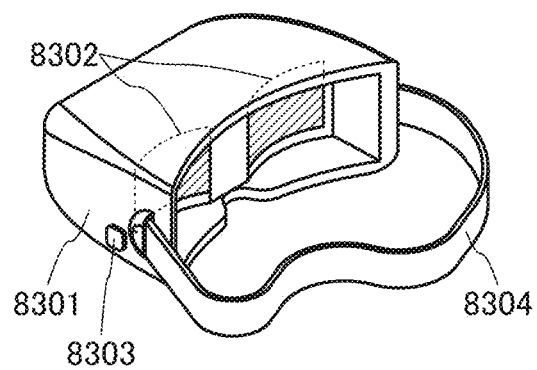
Figure 26E:
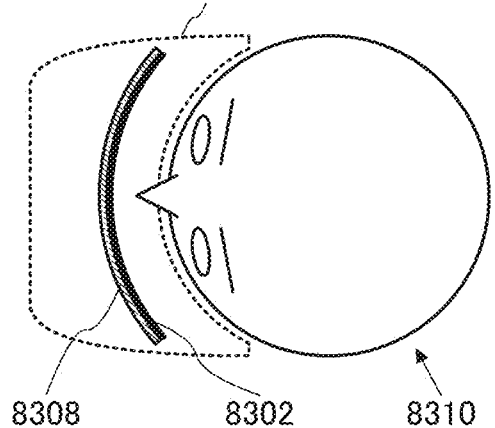
Figure 26F:
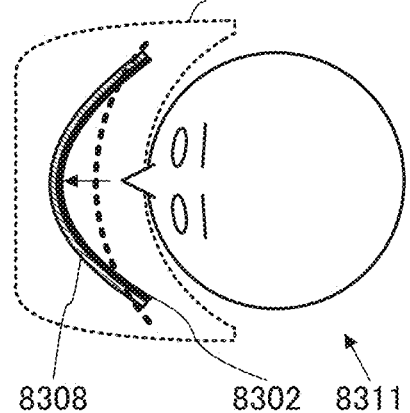

FIG. 26E and FIG. 26F illustrate an example of including a driver portion 8308 that controls the curvature of the display portion 8302. The driver portion 8308 is fixed to at least a part of the display portion 8302. The driver portion 8308 has a function of changing the shape of the display portion 8302 when the part that is fixed to the display portion 8302 changes in shape or moves.

FIG. 26E is a schematic diagram illustrating the case where a user 8310 having a relatively large head wears the housing 8301. In that case, the driver portion 8308 adjusts the shape of the display portion 8302 so that the curvature is relatively small (the radius of curvature is large).

By contrast, FIG. 26F illustrates the case where a user 8311 having a smaller head than the user 8310 wears the housing 8301. The user 8311 has a shorter distance between the eyes than the user 8310. In that case, the driver portion 8308 adjusts the shape of the display portion 8302 so that the curvature of the display portion 8302 is large (the radius of curvature is small). In FIG. 26F, the position and shape of the display portion 8302 in FIG. 26E are denoted by a dashed line.

When the head-mounted display 8300 has such a mechanism for adjusting the curvature of the display portion 8302, an optimal display can be offered to a variety of users of all ages and genders.

When the curvature of the display portion 8302 is changed in accordance with contents displayed on the display portion 8302, the user can have a more realistic sensation. For example, shaking can be expressed by vibrating the curvature of the display portion 8302. In this way, it is possible to produce various effects according to the scene in contents, and provide the user with new experiences. A further realistic display can be provided when the display portion 8302 operates in conjunction with a vibration module provided in the housing 8301.

Note that the head-mounted display 8300 may include two display portions 8302 as illustrated in FIG. 26D.

Since the two display portion 8302 are included, the user's eyes can see their respective display portions. Thus, a high-resolution image can be displayed even when a three-dimensional display using parallax or the like is performed. In addition, the display portion 8302 is curved around an arc with the user's eye as an approximate center. Thus, distances between the user's eye and display surfaces of the display portion become equal; thus, the user can see a more natural image. Even when the luminance or chromaticity of light from the display portion is changed depending on the angle at which the user see it, since the user's eye is positioned in a normal direction of the display surface of the display portion, the influence of the change can be substantially ignorable and thus a more realistic image can be displayed.

Note that this embodiment can be combined with any of the other embodiments described in this specification as appropriate.

Embodiment 6

In this embodiment, a display module that can be fabricated using the display apparatus of one embodiment of the present invention is described.

Figure 27A:
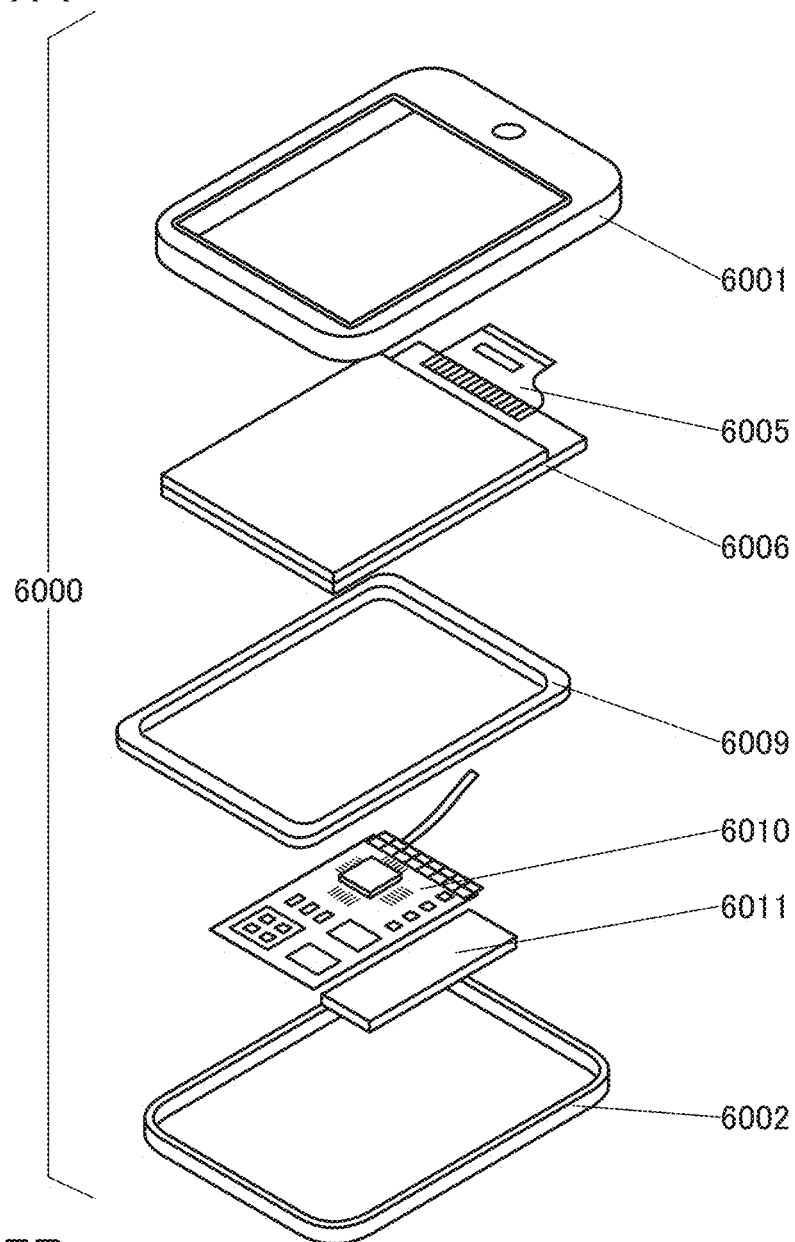
FIG. 27A and FIG. 27B are diagrams illustrating a structure example of a display module.

In a display module 6000 illustrated in FIG. 27A, a display apparatus 6006 to which an FPC 6005 is connected, a frame 6009, a printed circuit board 6010, and a battery 6011 are provided between an upper cover 6001 and a lower cover 6002.

A display apparatus fabricated using one embodiment of the present invention can be used as the display apparatus 6006, for example. With the display apparatus 6006, a display module with extremely low power consumption can be achieved.

The shape and size of the upper cover 6001 and the lower cover 6002 can be changed as appropriate in accordance with the size of the display apparatus 6006.

The display apparatus 6006 may have a function of a touch panel.

The frame 6009 may have a function of protecting the display apparatus 6006, a function of blocking electromagnetic waves generated by the operation of the printed circuit board 6010, a function of a heat dissipation plate, or the like.

The printed circuit board 6010 includes a power source circuit, a signal processing circuit for outputting a video signal and a clock signal, a battery control circuit, and the like.

Figure 27B:
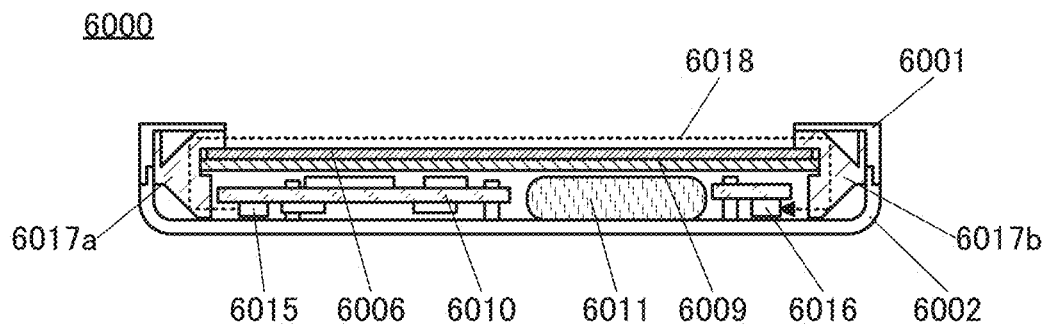

FIG. 27B is a schematic cross-sectional view of the display module 6000 including an optical touch sensor.

The display module 6000 includes a light-emitting portion 6015 and a light-receiving portion 6016 that are provided on the printed circuit board 6010. Furthermore, a pair of light guide portions (a light guide portion 6017*a* and a light guide portion 6017*b*) are provided in regions surrounded by the upper cover 6001 and the lower cover 6002.

The display apparatus 6006 overlaps with the printed circuit board 6010 and the battery 6011 with the frame 6009 therebetween. The display apparatus 6006 and the frame 6009 are fixed to the light guide portion 6017*a* and the light guide portion 6017*b*.

Light 6018 emitted from the light-emitting portion 6015 travels over the display apparatus 6006 through the light guide portion 6017*a* and reaches the light-receiving portion 6016 through the light guide portion 6017*b*. For example, blocking of the light 6018 by a sensing target such as a finger or a stylus enables detection of touch operation.

A plurality of light-emitting portions 6015 are provided along two adjacent sides of the display apparatus 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

The light guide portion 6017*a* and the light guide portion 6017*b* which transmit the light 6018 allow the light-emitting portion 6015 and the light-receiving portion 6016 to be placed under the display apparatus 6006, inhibiting a malfunction of the touch sensor due to external light reaching the light-receiving portion 6016. Particularly when a resin that absorbs visible light and transmits infrared rays is used, a malfunction of the touch sensor can be inhibited more effectively.

Note that this embodiment can be combined with any of the other embodiments described in this specification as appropriate.

Embodiment 7

In this embodiment, examples of an electronic device for which the display apparatus of one embodiment of the present invention can be used are described.

Figure 28A:
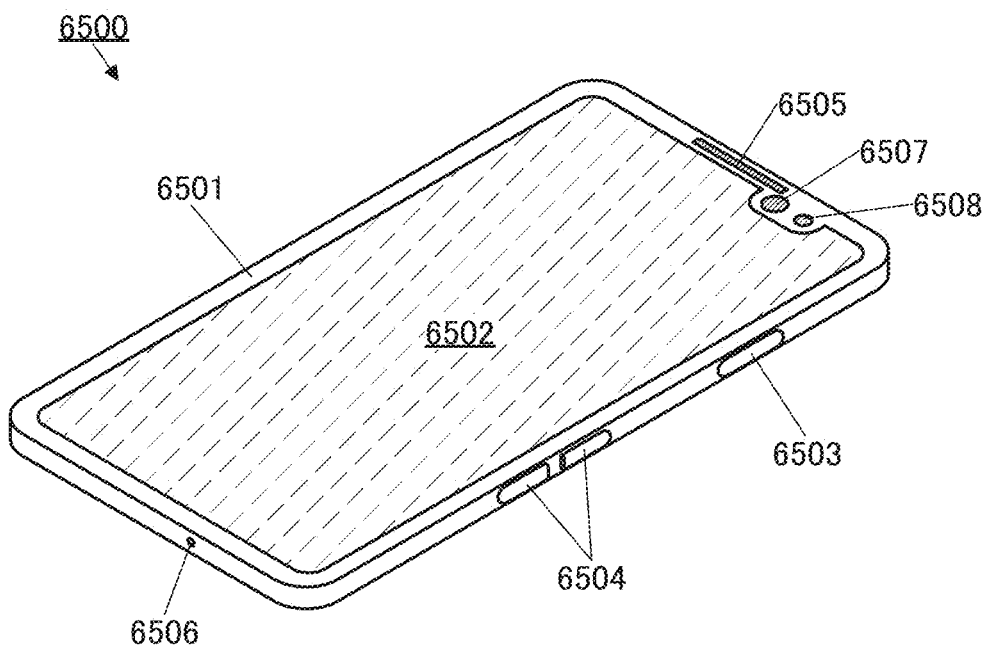
FIG. 28A and FIG. 28B are diagrams illustrating a structure example of an electronic device.

An electronic device 6500 illustrated in FIG. 28A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 28B:
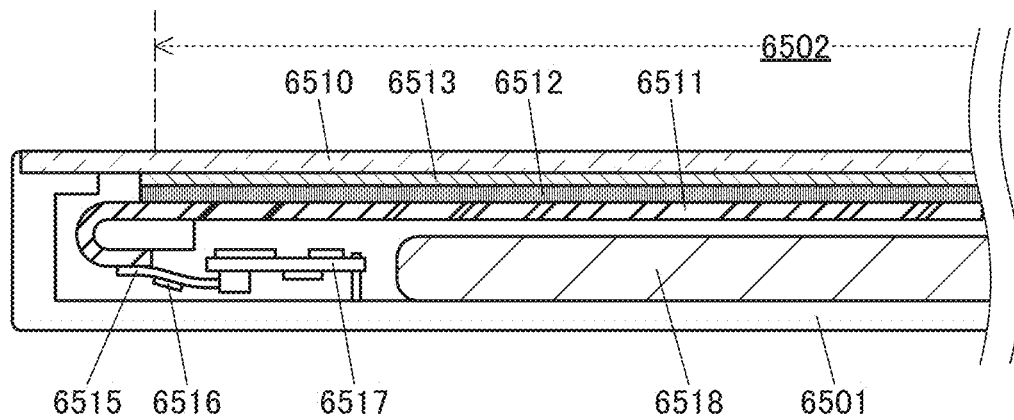

FIG. 28B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with an adhesive layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel can be used as the display panel 6511, for example. Thus, an extremely lightweight electronic device can be obtained. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

Note that this embodiment can be combined with any of the other embodiments described in this specification as appropriate.

Embodiment 8

In this embodiment, electronic devices each including a display apparatus fabricated using one embodiment of the present invention are described.

Electronic devices described below as examples each include the display apparatus of one embodiment of the present invention in a display portion. Thus, the electronic devices achieve high resolution. In addition, the electronic devices can each achieve both high resolution and a large screen.

One embodiment of the present invention includes the display apparatus and at least one of an antenna, a battery, a housing, a camera, a speaker, a microphone, a touch sensor, and an operation button.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, information, or the like on a display portion. When the electronic device includes the antenna and a secondary battery, the antenna may be used for contactless power transmission.

A display portion in an electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device using one embodiment of the present invention can be incorporated along a flat surface or a curved surface of an inside wall or an outside wall of a building such as a house or a building, an interior or an exterior of a car, or the like.

Figure 29A:
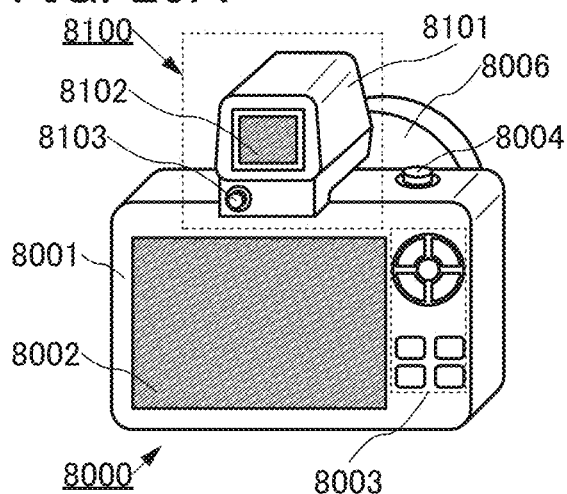
FIG. 29A to FIG. 29C are diagrams illustrating structure examples of electronic devices.

FIG. 29A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display apparatus of one embodiment of the present invention can be used for the display portion 8002 of the camera 8000 and the display portion 8102 of the finder 8100. Note that a finder may be incorporated in the camera 8000.

Figure 29B:
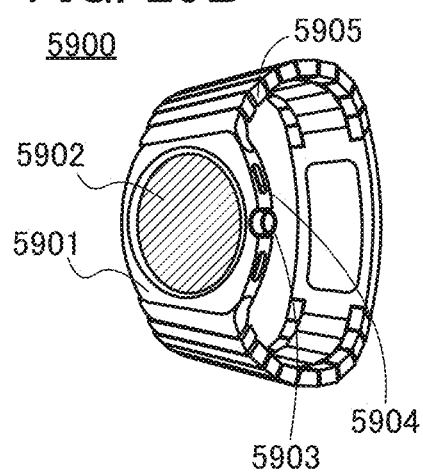

FIG. 29B is an external view of an information terminal 5900 that is an example of a wearable terminal. The information terminal 5900 includes a housing 5901, a display portion 5902, an operation button 5903, an operator 5904, a band 5905, and the like.

The information terminal 5900 can display an image with high display quality on the display portion 5902 by including the display apparatus described in the above embodiment.

Figure 29C:
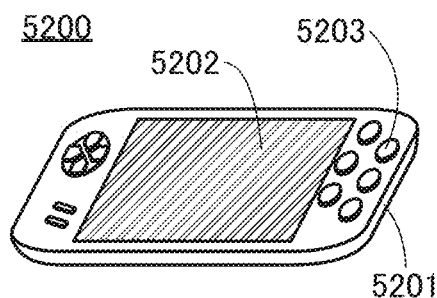

FIG. 29C is a diagram illustrating the appearance of a portable game machine 5200 which is an example of a game machine. The portable game machine 5200 includes a housing 5201, a display portion 5202, a button 5203, and the like.

Videos displayed on the portable game machine 5200 can be output with a display apparatus such as a television device, a personal computer display, a game display, and a head-mounted display.

The portable game machine 5200 can display an image with high display quality on the display portion 5202 by including the display apparatus described in the above embodiment. In addition, the portable game machine 5200 with low power consumption can be provided. Moreover, heat generation from a circuit can be reduced owing to low power consumption; thus, the influence of heat generation on the circuit itself, a peripheral circuit, and a module can be reduced.

Figure 30A:
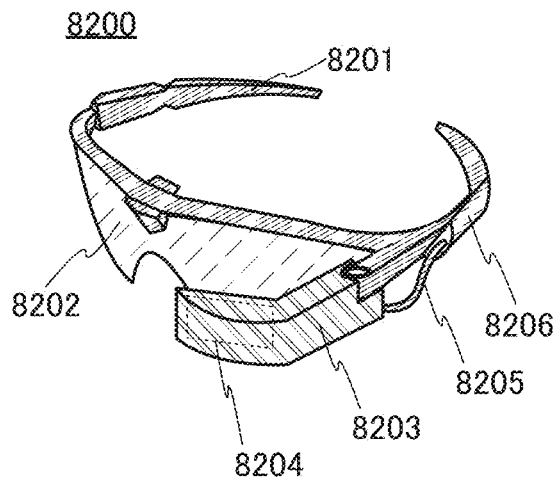
FIG. 30A to FIG. 30D are diagrams illustrating structure examples of electronic devices.

FIG. 30A is a diagram illustrating appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball or eyelid in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display apparatus of one embodiment of the present invention can be used for the display portion 8204.

Figure 30B:
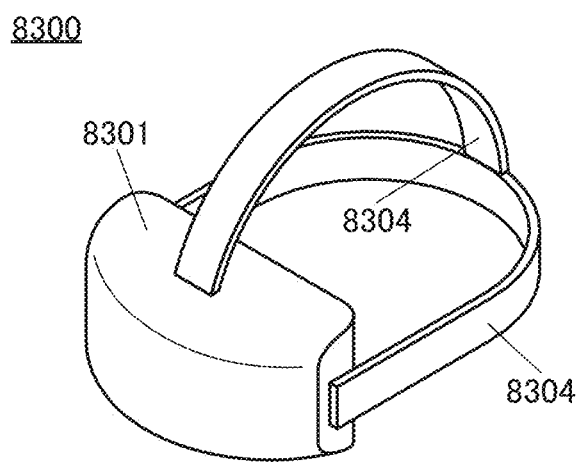
Figure 30C:
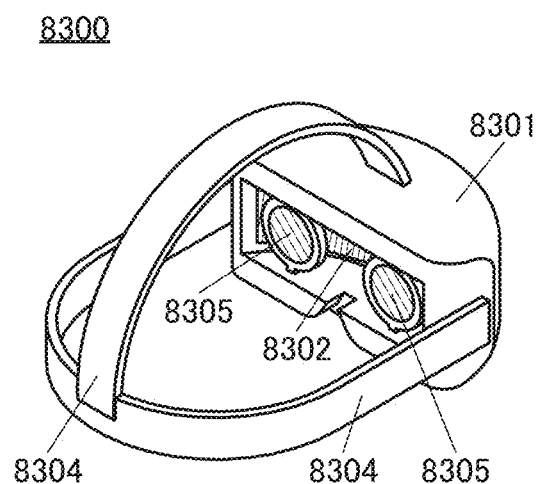
Figure 30D:
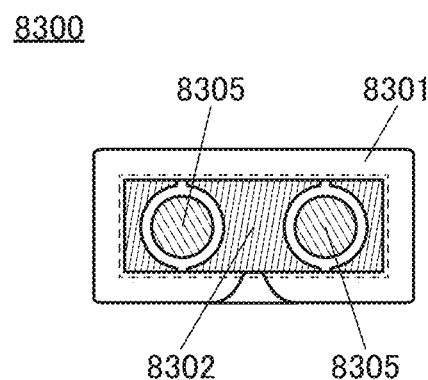

FIG. 30B, FIG. 30C, and FIG. 30D are diagrams illustrating appearance of the head-mounted display 8300. The head-mounted display 8300 includes the housing 8301, the display portion 8302, the band-shaped fixing units 8304, and the pair of lenses 8305.

A user can see display on the display portion 8302 through the lenses 8305. Note that the display portion 8302 is preferably curved and placed because the user can feel a high realistic sensation. In addition, when another image displayed on a different region of the display portion 8302 is viewed through the lenses 8305, three-dimensional display using parallax or the like can also be performed. Note that the number of display portions 8302 provided is not limited to one; two display portions 8302 may be provided so that one display portion is provided for one eye of the user.

Note that the display apparatus of one embodiment of the present invention can be used in the display portion 8302. The display apparatus including the semiconductor device of one embodiment of the present invention has an extremely high resolution; thus, even when a video is magnified by the lenses 8305 as in FIG. 30D, the user does not perceive pixels, and a more realistic video can be displayed.

Note that this embodiment can be combined with any of the other embodiments described in this specification as appropriate.

REFERENCE NUMERALS

ALP: pixel array, AMP: amplifier circuit, ARA: pixel region, CNP: control circuit unit, CON: controller, DATA: image signal, DRV: driver circuit region, LD: local driver circuit, MEM: memory unit, PG: voltage generation circuit

The invention claimed is:

1. A display apparatus comprising:
a first layer; and
a second layer over the first layer,
wherein the first layer comprises a driver circuit region,
wherein the second layer comprises a pixel array,
wherein the pixel array comprises a plurality of pixel regions,
wherein the plurality of pixel regions comprises a first pixel region and a second pixel region,
wherein the driver circuit region comprises a control circuit and a plurality of local driver circuits,
wherein the plurality of local driver circuits comprises a first local driver circuit and a second local driver circuit, the first local driver circuit comprising a first source driver circuit and a first gate driver circuit and the second local driver circuit comprising a second source driver circuit and a second gate driver circuit, wherein each of the plurality of local driver circuits corresponds to any one of the plurality of pixel regions, wherein the first local driver circuit corresponds to the first pixel region, wherein the second local driver circuit corresponds to the second pixel region, wherein each of the plurality of local driver circuits is configured to output a driving signal for driving a plurality of pixels included in corresponding one of the plurality of pixel regions, wherein the control circuit is configured to determine a first region to be displayed and a second region not to be displayed by comparing an aspect ratio of an input image with an aspect ratio of the pixel array, wherein, for a first image, the control circuit is configured to assign both of the first pixel region and the second pixel region to at least a part of the first region, wherein, for the first image, the control circuit is configured to output a first control signal for driving the first pixel region to the first local driver circuit, and to output a second control signal for driving the second pixel region to the second local driver circuit, wherein, for a second image, the control circuit is configured to assign the first pixel region to at least a part of the first region, and to assign the second pixel region to at least a part of the second region, and wherein, for the second image, the control circuit is configured to output a third control signal for driving the first pixel region to the first local driver circuit, and to output a fourth control signal for stopping supply of a power source voltage of the second local driver circuit to the second local driver circuit.

2. The display apparatus according to claim 1,
wherein in a top view, the driver circuit region is inside the pixel array, and
wherein a part of the plurality of pixel regions does not overlap with the driver circuit region.

3. The display apparatus according to claim 1,
wherein each of the plurality of pixel regions comprises a plurality of wirings, and wherein in the plurality of pixel regions:
the plurality of pixels are arranged in a matrix;
the plurality of wirings are in the respective rows of the plurality of pixels arranged in a matrix;
one of the plurality of wirings is electrically connected to pixels in the same row as the one of the plurality of wirings;
each of the plurality of wirings comprises a contact portion; and
each of the contact portions is inside each pixel or between adjacent pixels.

4. The display apparatus according to claim 1,
wherein each pixel included in the plurality of pixel regions comprises a first transistor and a light-emitting device using organic electroluminescence,
wherein each of the control circuit and the plurality of local driver circuits comprises a second transistor,
wherein the first transistor comprises a metal oxide in a channel formation region, and wherein the second transistor comprises silicon in a channel formation region.

5. An electronic device comprising:
the display apparatus according to claim 1; and
a housing.

6. The display apparatus according to claim 1,
wherein the first pixel region comprises the largest number of pixels in the plurality of pixel regions,
wherein an aspect ratio of the first pixel region is configured to correspond to an aspect ratio of the input image, and
wherein the aspect ratio of the first pixel region is different from an aspect ratio of the second pixel region.

7. The display apparatus according to claim 1,
wherein the first pixel region comprises the largest number of pixels in the plurality of pixel regions,
wherein an aspect ratio of the first region is configured to correspond to an aspect ratio of the input image, and
wherein the aspect ratio of the first pixel region is different from an aspect ratio of the second pixel region.

8. The display apparatus according to claim 1, wherein the second control signal is configured to bring the second local driver circuit into a stand-by state for the second image.

* * * * *